(12) United States Patent
Shen et al.

(10) Patent No.: US 7,900,127 B2
(45) Date of Patent: *Mar. 1, 2011

(54) LDPC (LOW DENSITY PARITY CHECK) CODES WITH CORRESPONDING PARITY CHECK MATRICES SELECTIVELY CONSTRUCTED WITH CSI (CYCLIC SHIFTED IDENTITY) AND NULL SUB-MATRICES

(75) Inventors: Ba-Zhong Shen, Irvine, CA (US); Hau Thien Tran, Irvine, CA (US); Tak K. Lee, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.
This patent is subject to a terminal disclaimer.

(21) Appl. No.: 12/533,306

(22) Filed: Jul. 31, 2009

(65) Prior Publication Data
US 2009/0327847 A1   Dec. 31, 2009

Related U.S. Application Data

(63) Continuation-in-part of application No. 11/292,135, filed on Dec. 1, 2005, now Pat. No. 7,617,439, and a continuation-in-part of application No. 11/472,226, filed on Jun. 21, 2006, now Pat. No. 7,617,441.

(60) Provisional application No. 61/086,035, filed on Aug. 4, 2008, provisional application No. 61/091,190, filed on Aug. 22, 2008, provisional application No. 61/098,918, filed on Sep. 22, 2008, provisional application No. 61/103,230, filed on Oct. 6, 2008, provisional application No. 61/105,330, filed on Oct. 14, 2008, provisional application No. 61/105,471, filed on Oct. 15, 2008, provisional application No. 61/139,359, filed on Dec. 19, 2008, provisional application No. 61/142,858, filed on Jan. 6, 2009, provisional application No. 61/164,875, filed on Mar. 30, 2009, provisional application No. 61/167,488, filed on Apr. 7, 2009, provisional application No. 60/642,689, filed on Jan. 10, 2005, provisional application No. 60/674,084, filed on Apr. 22, 2005, provisional application No. 60/675,346, filed on Apr. 27, 2005, provisional application No. 60/700,127, filed on Jul. 18, 2005, provisional application No. 60/708,937, filed on Aug. 17, 2005, provisional application No. 60/716,868, filed on Sep. 14, 2005, provisional application No. 60/721,599, filed on Sep. 29, 2005, provisional application No. 60/728,250, filed on Oct. 19, 2005.

(51) Int. Cl.
*G06F 11/00* (2006.01)

(52) U.S. Cl. .................. 714/804; 714/758; 714/809

(58) Field of Classification Search .............. 714/804, 714/758, 805, 809, 801, 764, 774
See application file for complete search history.

(56) References Cited

U.S. PATENT DOCUMENTS 7,334,181 B2 * 2/2008 Eroz et al. ............... 714/801
7,346,832 B2 * 3/2008 Richardson et al. ........ 714/779

OTHER PUBLICATIONS

R. G. Gallager, "Low density parity check codes," IRE Trans. Info. Theory, vol. IT-8, Jan. 1962, pp. 21-28.

(Continued)

*Primary Examiner* — Fritz Alphonse
(74) *Attorney, Agent, or Firm* — Garlick Harrison & Markison; Shayne X. Short

(57) ABSTRACT

LDPC (Low Density Parity Check) codes with corresponding parity check matrices selectively constructed with CSI (Cyclic Shifted Identity) and null sub-matrices. An LDPC matrix corresponding to an LDPC code is employed within a communication device to encode and/or decode coded signals for use in any of a number of communication systems. The LDPC matrix is composed of a number of sub-matrices and may be partitioned into a left hand side matrix and a right hand side matrix. The right hand side matrix may include two sub-matrix diagonals therein that are composed entirely of CSI (Cyclic Shifted Identity) sub-matrices; one of these two sub-matrix diagonals is located on the center sub-matrix diagonal and the other is located just to the left thereof. All other sub-matrices of the right hand side matrix may be null sub-matrices (i.e., all elements therein are values of zero "0").

20 Claims, 61 Drawing Sheets

OTHER PUBLICATIONS

Robert G. Gallager, "Low-Density Parity-Check Codes," Cambridge, MA: MIT Press, 1963.

Michael G. Luby, Michael Mitzenmacher, M. Amin Shokrollahi, Daniel A. Spielman, and Volker Stemann, "Practical Loss-Resilient Codes," Proc. 29th Sympo. on Theory of Computing, 1997, pp. 150-159.

Thomas J. Richardson and Rudiger L. Urbanke, "The capacity of low-density parity-check code under message-passing decoding," IEEE Trans. Inform. Theory, vol. 47, No. 2, Feb. 2001, pp. 599-618.

Marc P. C. Fossorier, "Quasi-Cyclic Low-Density Parity-Check Codes From Circulant Permutation Matrices," IEEE Trans. Inform. Theory, vol. 50, No. 8, Aug. 2004, pp. 1788-1793.

* cited by examiner

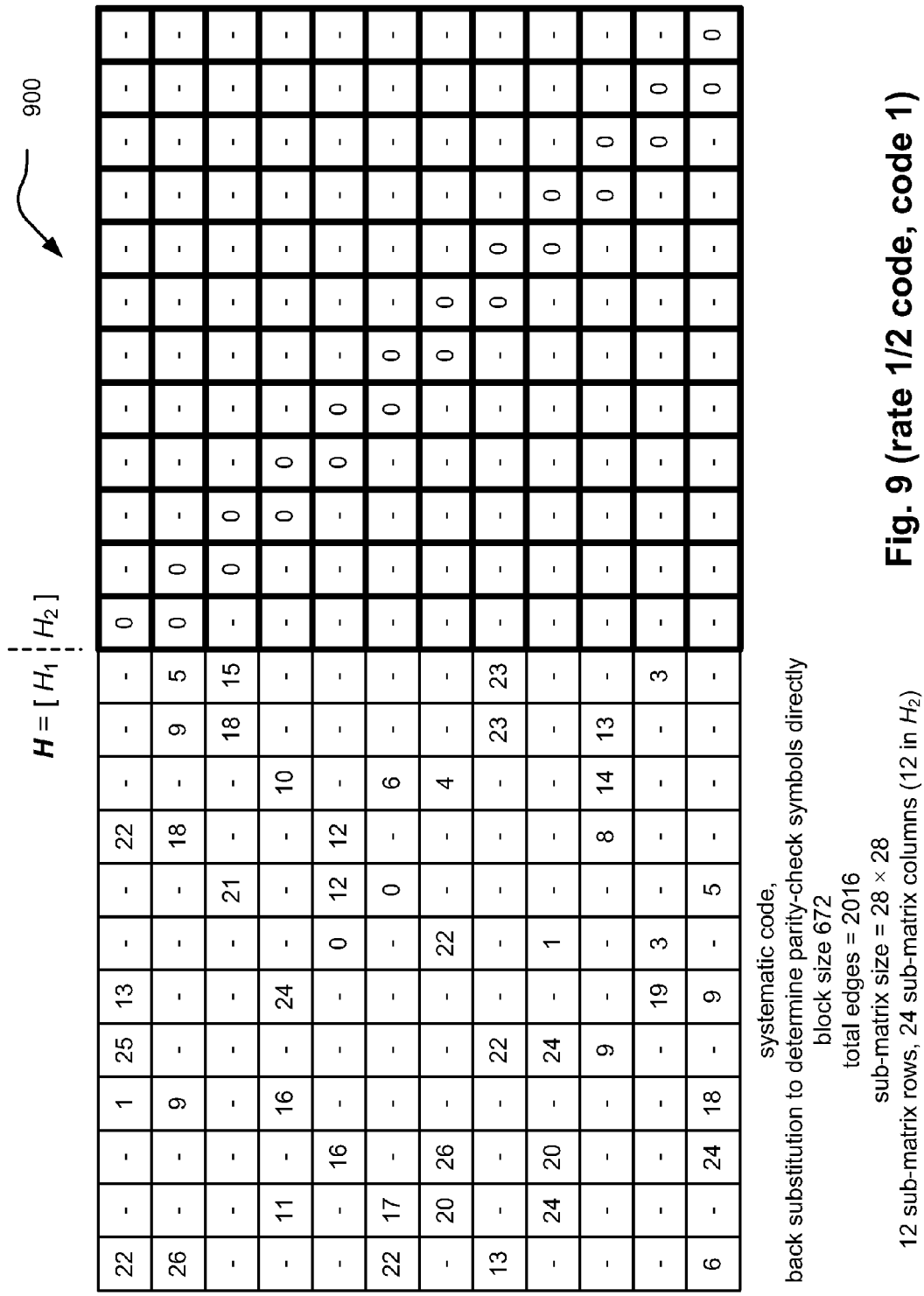
Fig. 9 (rate 1/2 code, code 1)

Fig. 10 (rate 1/2 code, code 2)

$H = [H_1 \mid H_2]$

1000 ↓

| 9 | 19 | 12 | 2 | - | 27 | - | 22 | - | - | - | - | 20 | - | - | - | - | - | - | - | - | - | 0 | 0 |
| 17 | 3 | 6 | - | - | 4 | - | - | - | 14 | - | - | - | - | - | - | - | - | - | - | - | 0 | 0 | - |
| 12 | 10 | 4 | - | - | 23 | - | - | - | - | - | - | - | - | - | - | - | - | - | - | 0 | 0 | - | - |
| 24 | 4 | 1 | - | - | - | - | - | 14 | - | 26 | - | - | - | - | - | - | - | - | 0 | 0 | - | - | - |
| 25 | 8 | - | 3 | - | - | - | - | - | 2 | - | - | - | - | - | - | - | - | 0 | 0 | - | - | - | - |
| 3 | 6 | - | 14 | - | - | 27 | - | - | - | - | 10 | - | - | - | - | - | 0 | 0 | - | - | - | - | - |
| 4 | 22 | 23 | - | - | - | - | - | 14 | - | - | 4 | 1 | - | - | - | 0 | 0 | - | - | - | - | - | - |
| 21 | 18 | 14 | - | - | - | - | - | - | - | - | 1 | 11 | - | - | 0 | 0 | - | - | - | - | - | - | - |
| 1 | 17 | 27 | 25 | - | - | 26 | - | - | - | 9 | - | - | - | 0 | 0 | - | - | - | - | - | - | - | - |
| 8 | 1 | 7 | - | - | 13 | - | - | 8 | - | 13 | 4 | - | 0 | 0 | - | - | - | - | - | - | - | - | - |
| 19 | 20 | 15 | - | - | - | - | 5 | - | - | - | 2 | - | 0 | - | - | - | - | - | - | - | - | - | - |
| 11 | 5 | 20 | - | - | - | - | - | 3 | - | - | - | 19 | 0 | - | - | - | - | - | - | - | - | - | - | systematic code,
back substitution to determine parity-check symbols (after transform $H$)
block size 672
total edges = 2048
sub-matrix size = 28 × 28
12 sub-matrix rows, 24 sub-matrix columns (11 in $H_2$)

Fig. 12 (rate 3/4 code)

Fig. 14 (rate 5/6 code)

Fig. 19 (rate 2/3 code)

Fig. 24 (rate 1/2 code)

systematic code,
back substitution to determine parity-check symbols directly
block size 4032, 2016 information bits: (4032,2016) code
sub-matrix size = 96 × 96
21 sub-matrix rows, 42 sub-matrix columns (21 in $H_2$)

$H = [H_1 \mid H_2]$

Fig. 25 (rate 5/6 code)

$H = [H_1 \mid H_2]$ systematic code,
back substitution to determine parity-check symbols directly
block size 4032, 3360 information bits: (4032,3360) code
sub-matrix size = 96 × 96
6 sub-matrix rows, 42 sub-matrix columns (6 in $H_2$)

$$H_{1a} =$$

| | | | | | | | | | | | | | | | |
|---|---|---|---|---|---|---|---|---|---|---|---|---|---|---|---|
| – | 3 | 14 | 20 | 23 | 15 | 62 | 18 | 35 | 12 |
| 4 | 60 | 8 | 73 | 29 | 22 | 13 | 40 | 49 | 71 |
| 54 | 43 | 61 | 69 | – | 23 | 55 | – | – | – |
| 51 | 21 | – | 51 | 68 | – | 5 | 67 | 65 | 47 |
| 37 | 41 | 22 | – | – | 7 | 67 | 76 | 50 | 57 |
| 23 | 33 | 13 | 40 | 39 | 61 | 63 | 11 | 21 | 12 |
| 22 | 68 | 59 | 17 | 79 | 5 | – | 47 | – | – |
| 18 | 38 | 17 | – | 51 | 32 | 25 | 69 | 57 | 6 |
| 41 | 0 | 27 | 9 | 0 | 47 | 6 | 43 | 58 | 43 |
| 51 | 52 | – | 75 | 17 | 28 | – | 51 | 46 | 12 |
| 70 | – | 40 | 2 | 62 | 67 | 4 | 62 | 13 | 55 |
| – | – | 65 | 34 | 60 | – | 61 | – | 59 | 2 |

$$H = [\ H_{1a}\ |\ H_{1b}\ |\ H_2\ ]$$

systematic code,
back substitution to determine parity-check symbols directly
block size 4800, 3840 information bits (4800,3840) code
sub-matrix size = 80 × 80
12 sub-matrix rows, 60 sub-matrix columns (12 in $H_2$)

Fig. 26 (rate 4/5 code)(shows $H_{1a}$)

Figure 27A:
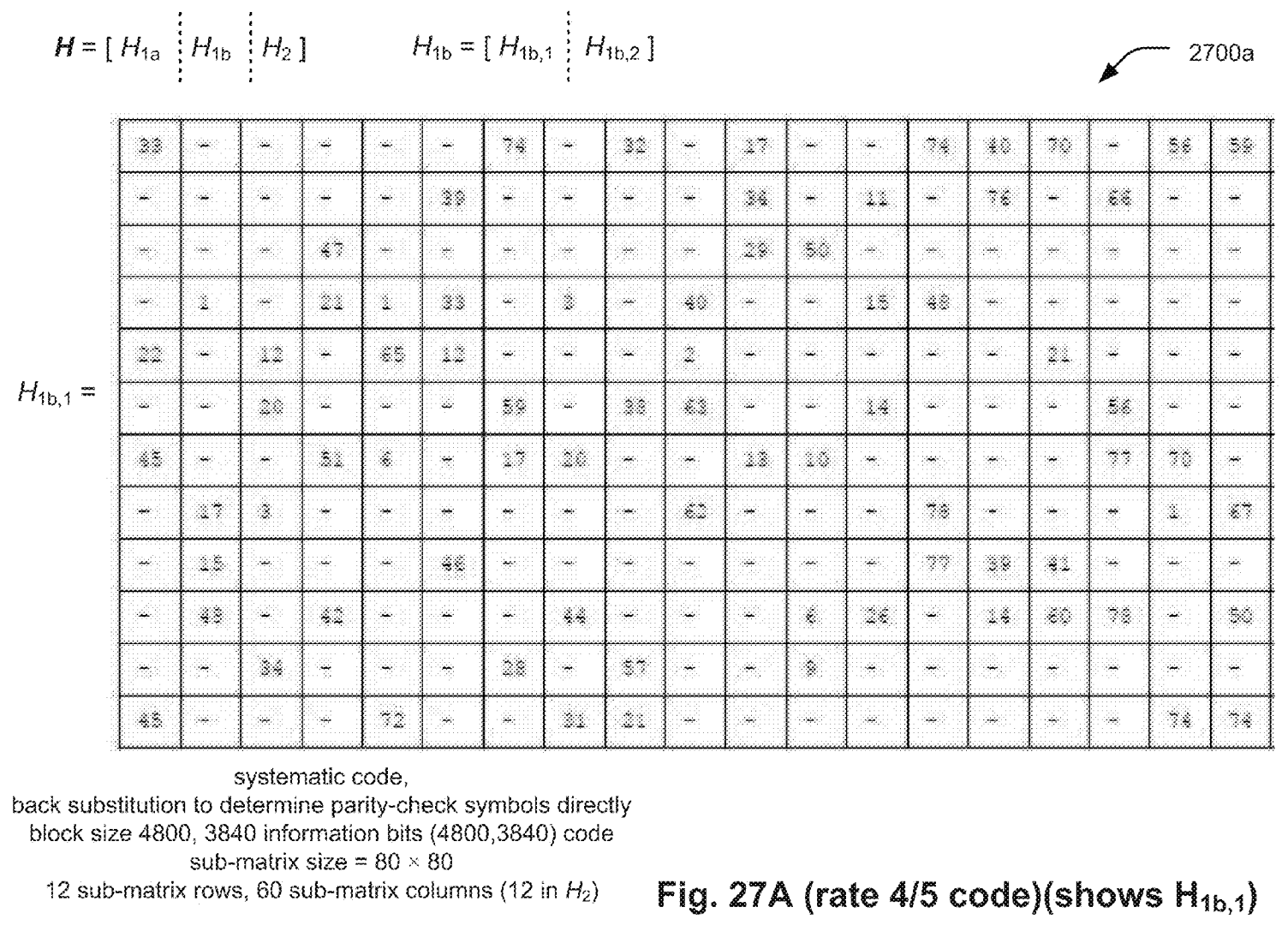

$H = [\ H_{1a}\ \vdots\ H_{1b}\ \vdots\ H_2\ ]$ $H_{1b} = [\ H_{1b,1}\ \vdots\ H_{1b,2}\ ]$ $H_{1b,1} =$ systematic code,
back substitution to determine parity-check symbols directly
block size 4800, 3840 information bits (4800,3840) code
sub-matrix size = 80 × 80
12 sub-matrix rows, 60 sub-matrix columns (12 in $H_2$)

Fig. 27A (rate 4/5 code)(shows $H_{1b,1}$)

$H = [H_{1a} \vdots H_{1b} \vdots H_2]$   $H_{1b} = [H_{1b,1} \vdots H_{1b,2}]$ systematic code,
back substitution to determine parity-check symbols directly
block size 4800, 3840 information bits (4800,3840) code
sub-matrix size = 80 × 80
12 sub-matrix rows, 60 sub-matrix columns (12 in $H_2$)

Fig. 27B (rate 4/5 code)(shows $H_{1b,1}$)

$H = [\,H_{1a} \mid H_{1b} \mid H_2\,]$ $H_2 =$ systematic code,
back substitution to determine parity-check symbols directly
block size 4800, 3840 information bits (4800,3840) code
sub-matrix size = 80 × 80
12 sub-matrix rows, 60 sub-matrix columns (12 in $H_2$)

Fig. 28 (rate 4/5 code)(shows $H_2$)

Fig. 29 (rate 1/2 code)
systematic code,
back substitution to determine parity-check symbols directly
block size 672, 336 information bits: (672,336) code
sub-matrix size = 28 × 28
12 sub-matrix rows, 24 sub-matrix columns (12 in $H_2$)

$$H = [H_1 \mid H_2]$$

| | | | | | | | | | | | | | | | | | | | | | | | |
|---|---|---|---|---|---|---|---|---|---|---|---|---|---|---|---|---|---|---|---|---|---|---|---|
| - | - | - | - | - | - | - | - | - | - | - | - | - | - | - | - | - | - | - | - | - | - | 0 | 0 |
| - | - | - | - | - | - | - | - | - | - | - | - | - | - | - | - | - | - | - | - | - | 0 | 0 | - |
| - | - | - | - | - | - | - | - | - | - | - | - | - | - | - | - | - | - | - | - | 0 | 0 | - | - |
| - | - | - | - | - | - | - | - | - | - | - | - | - | - | - | - | - | - | - | 0 | 0 | - | - | - |
| - | - | - | - | - | - | - | - | - | - | - | - | - | - | - | - | - | - | 0 | 0 | - | - | - | - |
| - | - | - | - | - | - | - | - | - | - | - | - | - | - | - | - | - | 0 | 0 | - | - | - | - | - |
| - | - | 26 | - | 22 | - | 5 | - | 8 | - | - | - | - | - | - | - | 0 | 0 | - | - | - | - | - | - |
| 10 | 27 | - | - | - | 16 | - | 13 | - | 9 | - | - | - | - | - | 0 | 0 | - | - | - | - | - | - | - |
| 10 | - | - | - | 5 | - | - | - | 13 | - | - | 18 | - | - | 0 | 0 | - | - | - | - | - | - | - | - |
| - | 11 | - | - | - | - | 2 | - | - | 23 | - | 27 | - | 0 | 0 | - | - | - | - | - | - | - | - | - |
| - | - | - | 3 | - | 11 | - | 4 | - | - | - | 2 | 0 | 0 | - | - | - | - | - | - | - | - | - | - |
| - | - | 12 | - | - | 20 | - | - | 23 | - | 10 | - | 0 | - | - | - | - | - | - | - | - | - | - | - |
| - | - | 24 | - | - | - | 6 | - | - | 2 | - | 25 | - | - | - | - | - | - | - | - | - | - | - | - |
| 5 | - | 14 | - | 27 | - | 3 | - | 15 | - | 27 | - | - | - | - | - | - | - | - | - | - | - | - | - |
| - | 5 | - | 1 | - | 23 | - | 26 | - | 24 | - | 5 | - | - | - | - | - | - | - | - | - | - | - | - |
| - | 4 | - | 7 | - | 25 | - | 19 | - | 4 | - | 25 | - | - | - | - | - | - | - | - | - | - | - | - |
| 21 | - | 25 | - | 1 | - | 8 | - | 10 | - | 21 | - | - | - | - | - | - | - | - | - | - | - | - | - | systematic code,
back substitution to determine parity-check symbols directly
block size 672, 336 information bits: (672,336) code
sub-matrix size = 28 × 28
12 sub-matrix rows, 24 sub-matrix columns (12 in $H_2$)

Fig. 30 (rate 1/2 code)

Fig. 31 (rate 3/4 code)

| 1 | 20 | 9 | 22 | 18 | 21 | 19 | 5 | 10 | 18 | 0 | 21 | 8 | 17 | 21 | 7 | 18 | 18 | 22 | 15 | - | - | - | 0 |
| 24 | 6 | 15 | 23 | 15 | 1 | 21 | 4 | 4 | 21 | 21 | 5 | 19 | 6 | 12 | 17 | 22 | 23 | 14 | 22 | 0 | - | 0 | 0 |
| 5 | 18 | 3 | 14 | 9 | 18 | 4 | 8 | 18 | 6 | 14 | 20 | 18 | 12 | 22 | 13 | 1 | 20 | 22 | 27 | 0 | - | - | 0 |
| 6 | 22 | 15 | 4 | 26 | 5 | 17 | 22 | 23 | 27 | 22 | 8 | 27 | 18 | 17 | 4 | 8 | 18 | 21 | 19 | - | 0 | - | - |
$H = [H_1 | H_2]$
systematic code,
back substitution to determine parity-check symbols directly
block size 672, 560 information bits: (672,560) code
sub-matrix size = 28 × 28
4 sub-matrix rows, 24 sub-matrix columns (4 in $H_2$)
Fig. 32 (rate 5/6 code)

Fig. 33 (rate 5/6 code)

Fig. 35 (rate 5/6 code)

Fig. 36 (rate 0.79 (approx. 4/5) code)

systematic code,
back substitution to determine parity-check symbols directly
block size 4032, 3168 information bits: (4032,3168) code
sub-matrix size = 96 × 96
9 sub-matrix rows, 42 sub-matrix columns (9 in $H_2$)

$H = [H_1 | H_2]$ $H = [\ H_{1a}\ |\ H_{1b}\ |\ H_2\ ]$ $H_{1a} \Rightarrow$

| 12 | 41 | 20 | 6  | 60 | 1  | 36 | 1  | 24 | 34 | 60 | 54 | 22 | 79 | 22 | 2  | 35 | 74 | -  | -  | -  | -  | 65 | -  | -  | -  | -  | -  | -  | -  |
| 28 | 53 | 35 | 8  | 59 | 4  | 13 | 30 | 29 | 5  | 34 | 51 | 20 | 27 | 1  | 12 | 59 | 1  | -  | -  | 35 | -  | 3  | 7  | -  | -  | -  | -  | -  | -  |
| 66 | 24 | 18 | 78 | 45 | 25 | 49 | 71 | 64 | 39 | 63 | 73 | 15 | 30 | 11 | 69 | 53 | 2  | 43 | -  | -  | -  | -  | -  | 68 | 71 | -  | -  | -  | -  |
| 57 | 11 | 36 | 36 | 62 | 76 | 25 | 60 | 31 | 55 | 31 | 36 | 0  | 10 | 18 | 33 | 12 | 17 | -  | 36 | 22 | -  | -  | -  | 38 | 49 | -  | -  | -  | 8  |
| 20 | 48 | 25 | 54 | 32 | 58 | 12 | 52 | 5  | 23 | 15 | 66 | 25 | 43 | 50 | 42 | 53 | 18 | 39 | -  | 42 | -  | -  | -  | -  | -  | -  | -  | -  | -  |
| 40 | 57 | 44 | 61 | 12 | 52 | 9  | 50 | 73 | 69 | 1  | 37 | 47 | 76 | 66 | 2  | 77 | 17 | -  | -  | -  | -  | 66 | -  | -  | -  | -  | -  | -  | -  |
| 67 | 39 | 62 | 36 | 24 | 30 | 15 | 26 | 6  | 73 | 25 | 14 | 9  | 42 | 25 | 73 | 34 | 47 | -  | 47 | 2  | -  | -  | 43 | -  | -  | -  | -  | -  | -  |
| 52 | 34 | 22 | 44 | 51 | 0  | 62 | 67 | 57 | 64 | 32 | 72 | 71 | 56 | 12 | 47 | 56 | 13 | 22 | -  | -  | 35 | -  | -  | -  | -  | -  | -  | 43 | 26 |
| 64 | 45 | 74 | 37 | 61 | 79 | 79 | 68 | 73 | 18 | 41 | 62 | 29 | 35 | 38 | 22 | 34 | 50 | -  | 35 | -  | -  | -  | -  | -  | -  | -  | -  | -  | 6  |
| 57 | 57 | 7  | 72 | 2  | 0  | 60 | 39 | 49 | 16 | 9  | 69 | 57 | 59 | 32 | 7  | 36 | 14 | 49 | 13 | -  | -  | 69 | -  | -  | -  | -  | -  | 38 | 28 |

3700 systematic code,
back substitution to determine parity-check symbols directly
block size 4800, 4000 information bits: (4800,4000) code
sub-matrix size = 80 × 80
10 sub-matrix rows, 60 sub-matrix columns (10 in $H_2$)

Fig. 37 (rate 5/6 code)(shows $H_{1a}$)

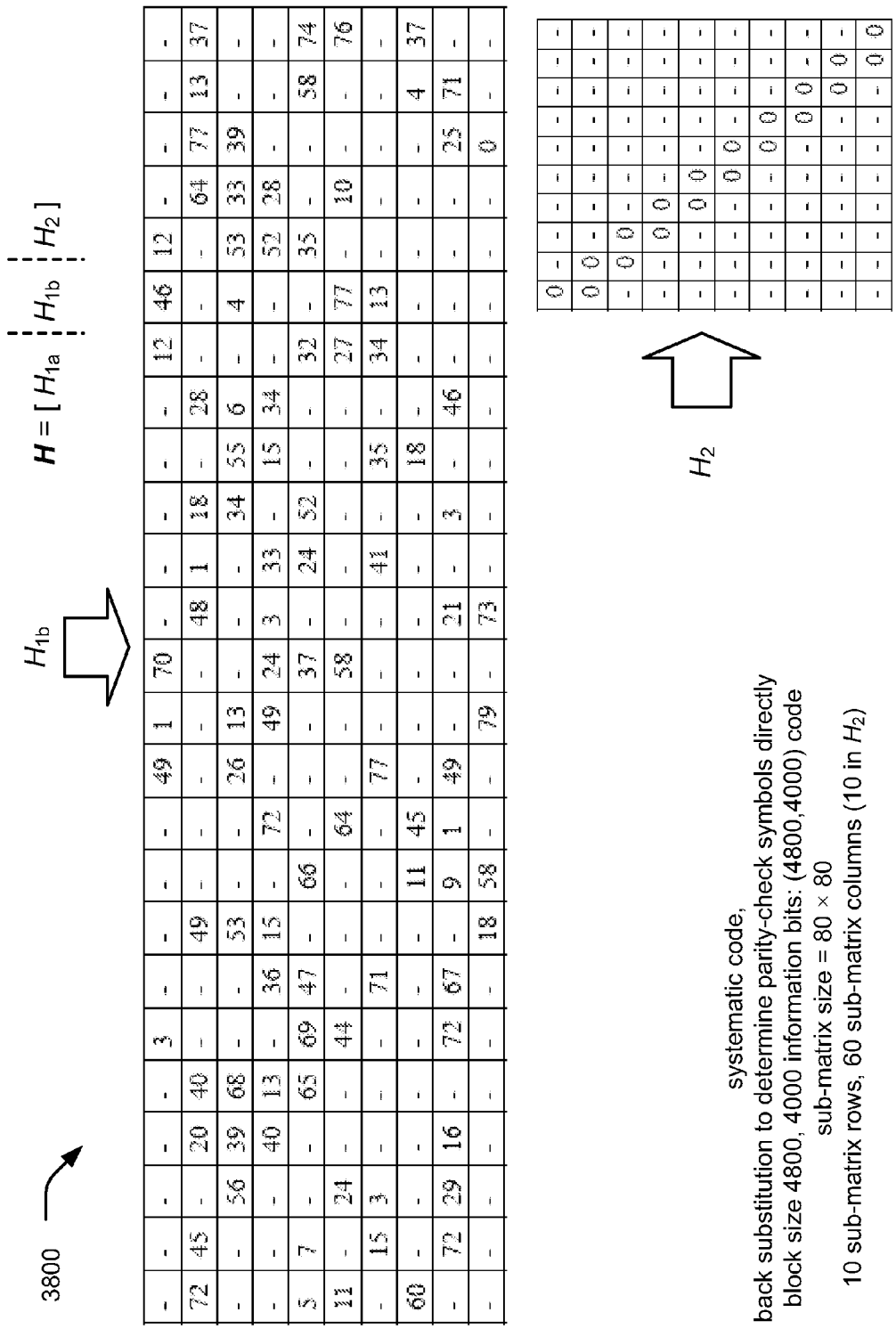
Fig. 38 (rate 5/6 code)(shows H₁ᵦ and H₂)

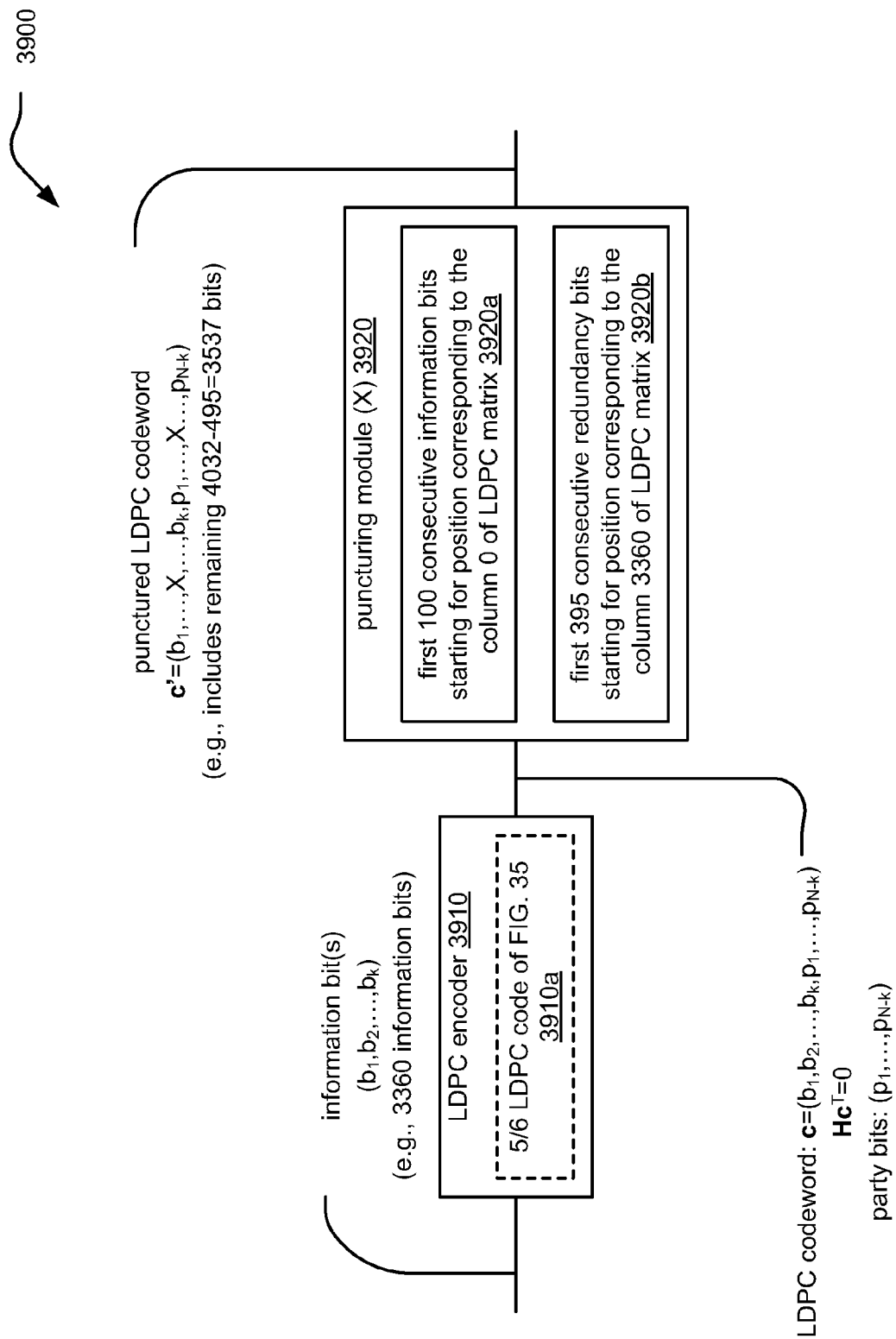
Fig. 39 (final code rate is 3360/3537=0.95)

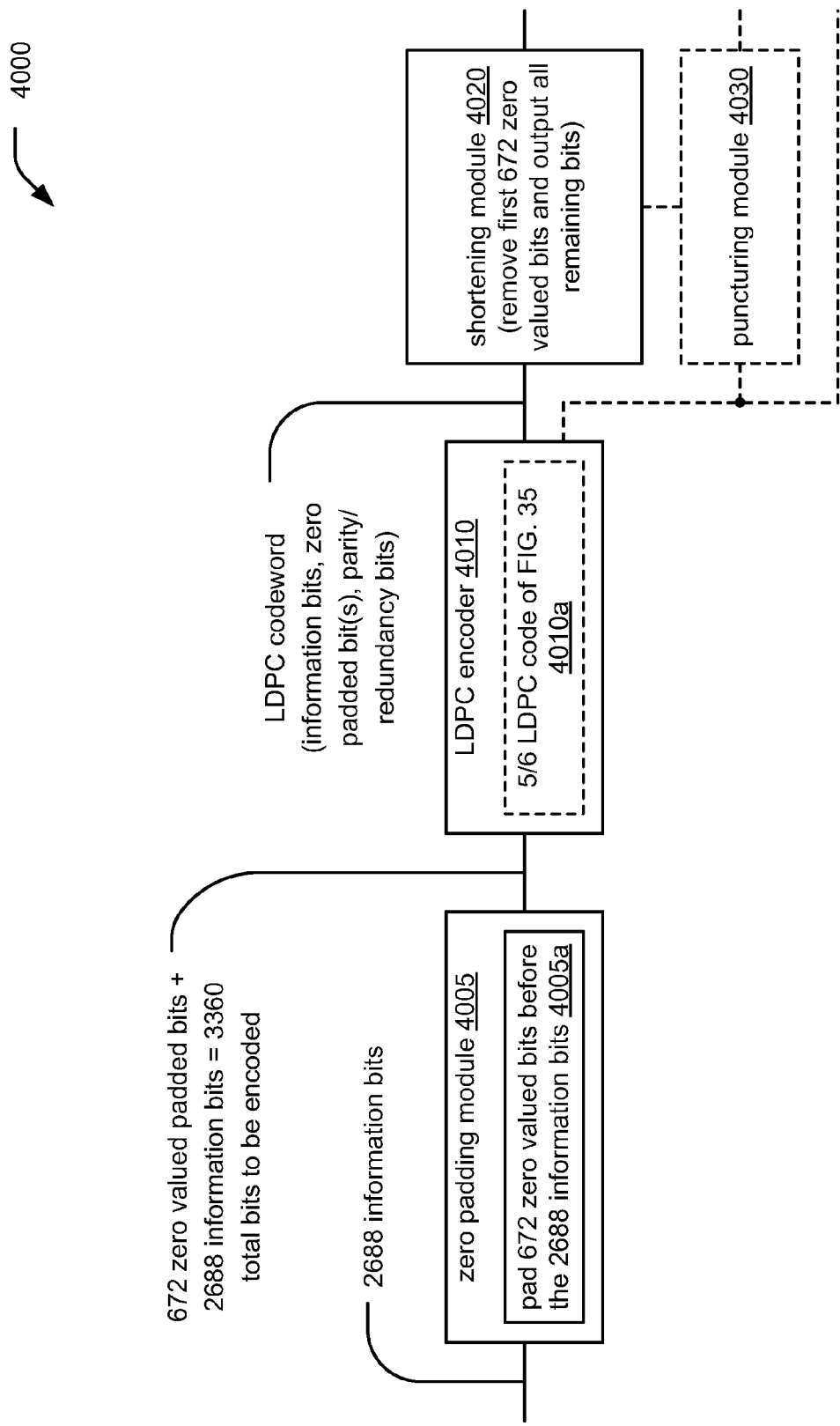
Fig. 40 (final code rate is (3360-672)/(4032-672)=4/5=0.8)

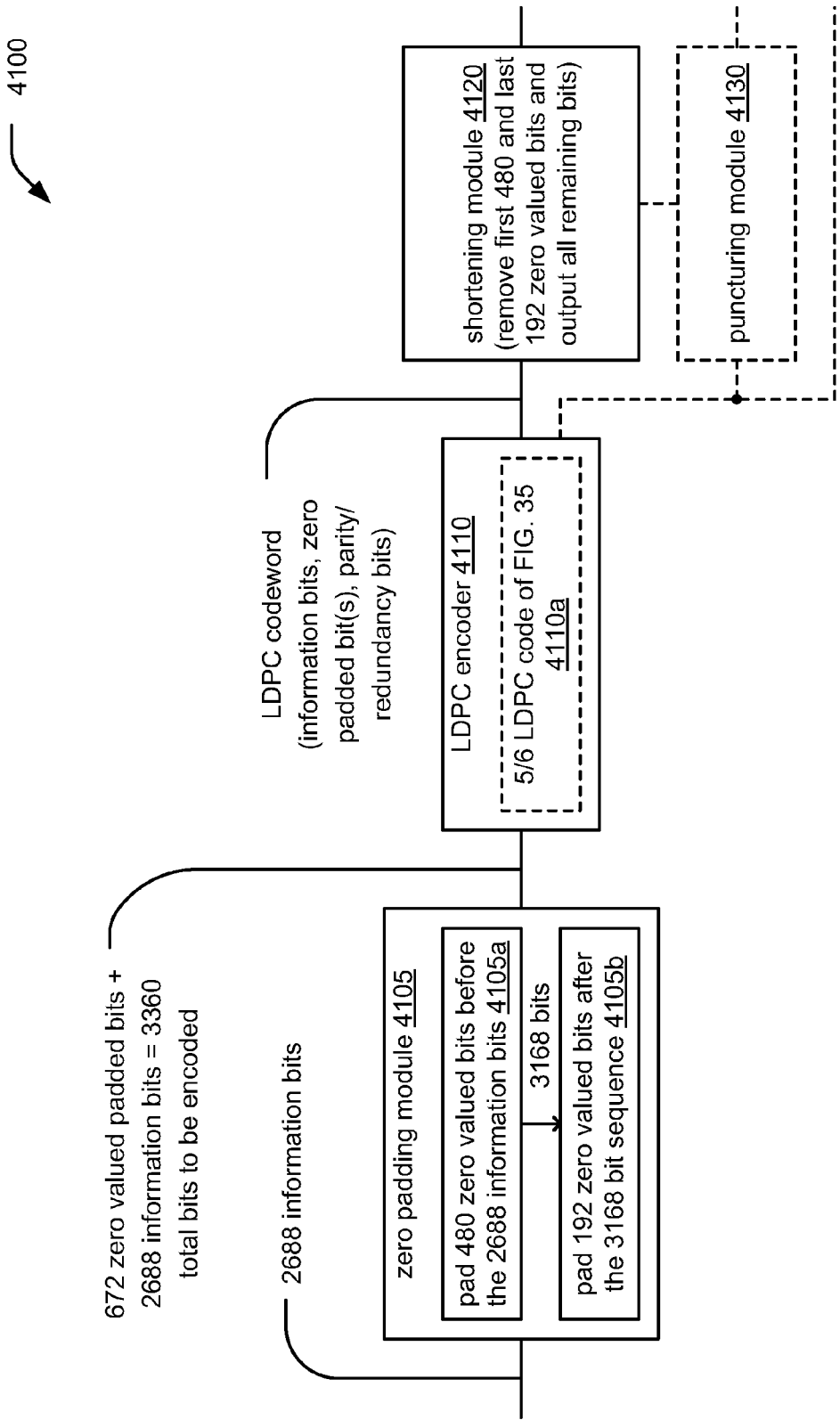
Fig. 41 (final code rate is (3360−672)/(4032−672)=4/5=0.8)

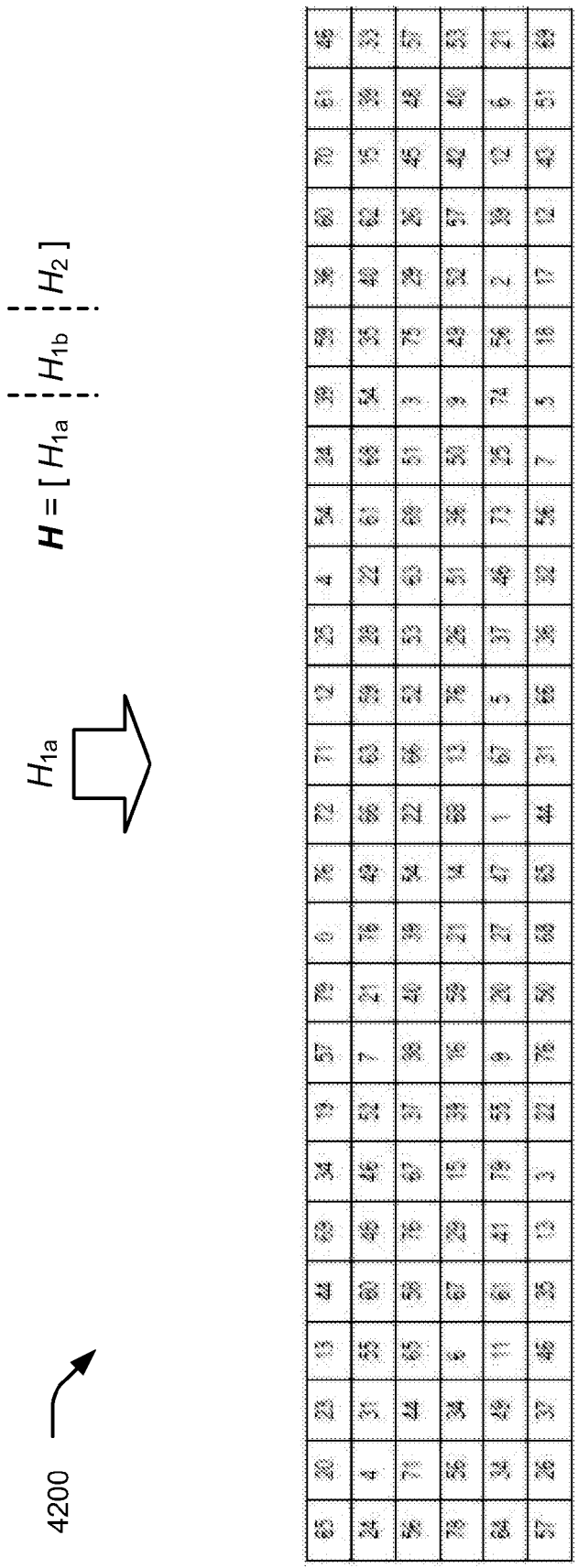
Fig. 42 (rate 0.8966 code)(shows $H_{1a}$)

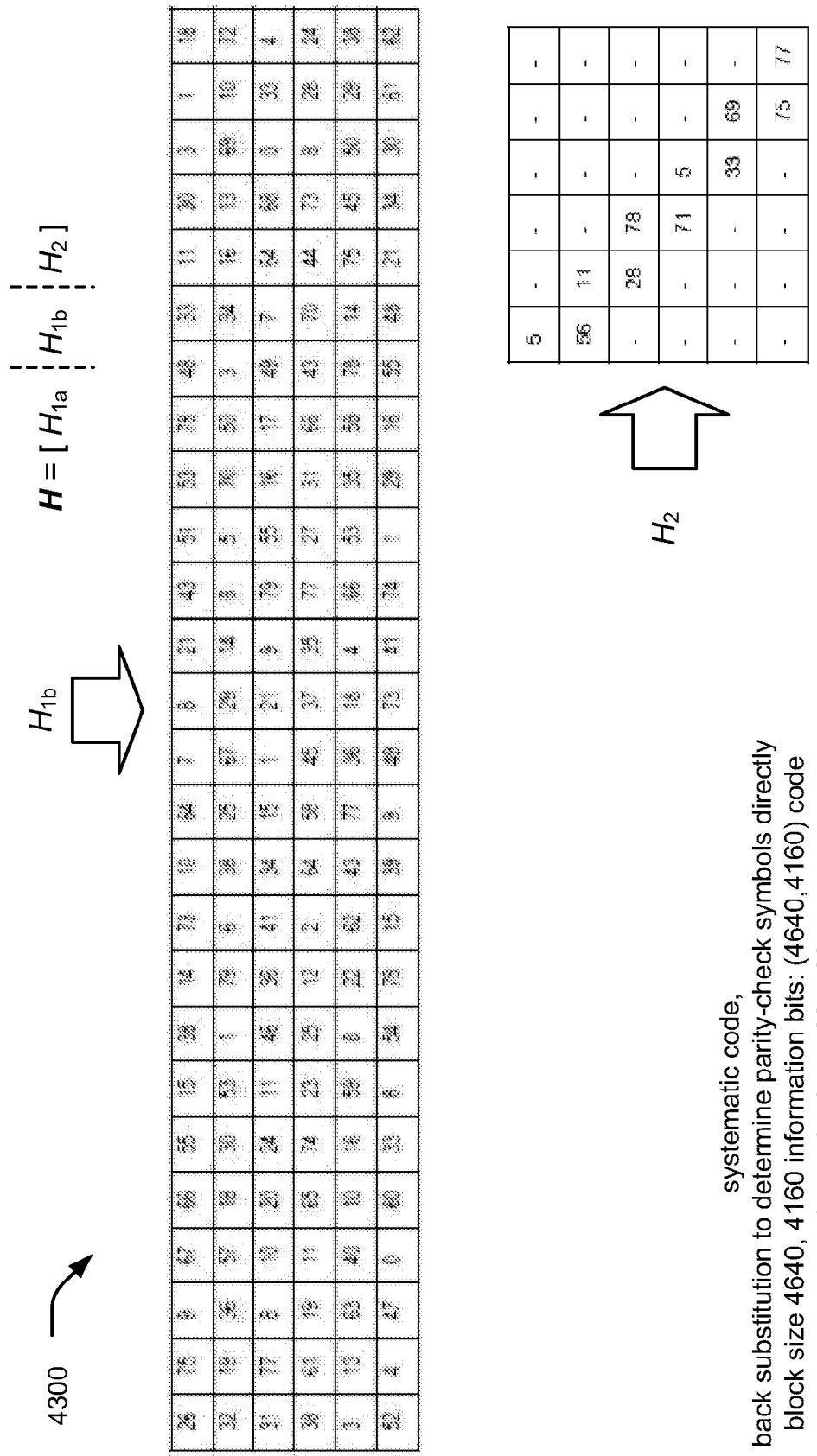
Fig. 43 (rate 0.8966 code)(shows $H_{1b}$ and $H_2$)

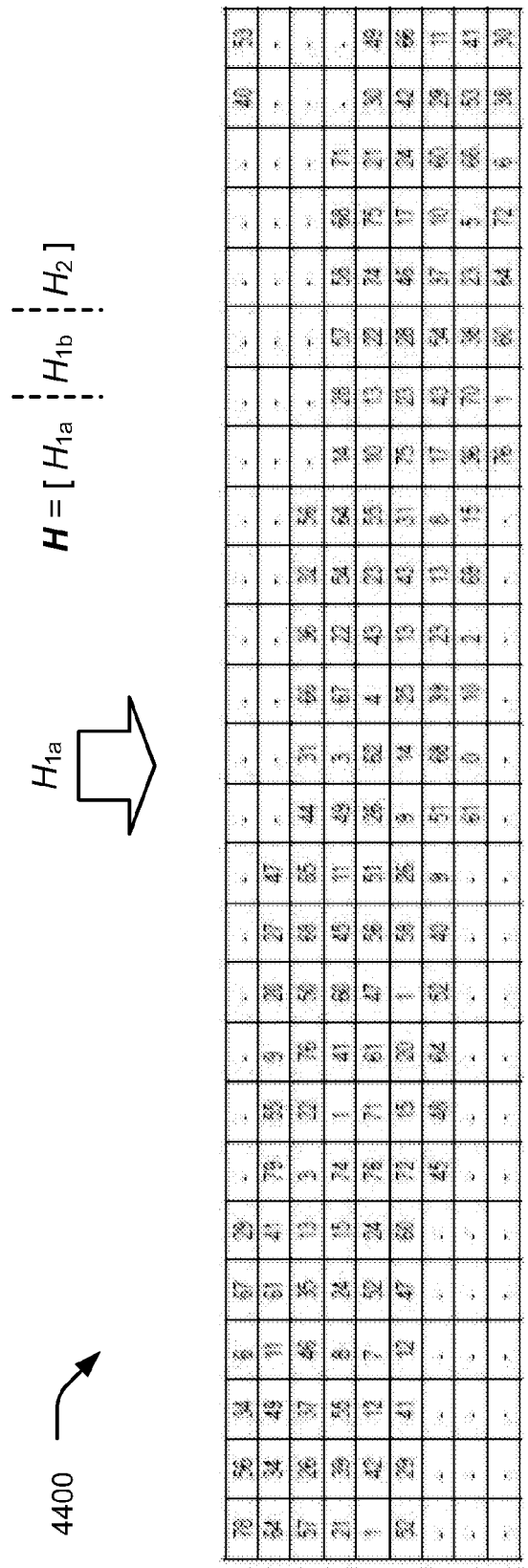
Fig. 44 (rate 0.8525 code)(shows $H_{1a}$)

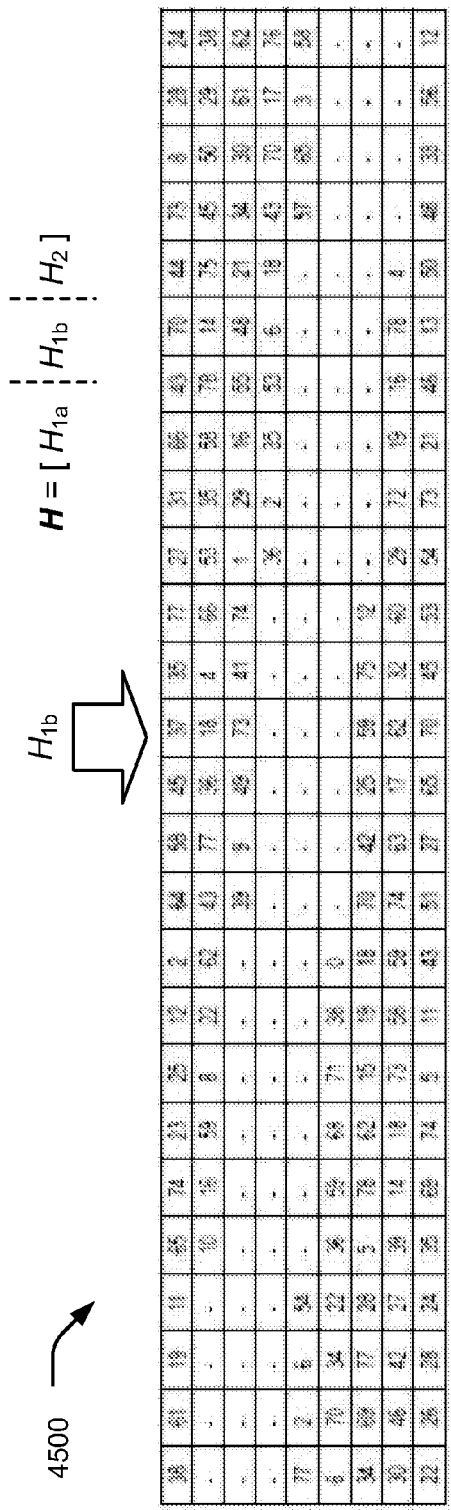
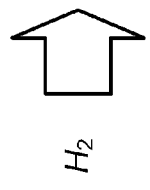
systematic code,
back substitution to determine parity-check symbols directly
block size 4880, 4160 information bits: (4880,4160) code
sub-matrix size = 80 × 80
9 sub-matrix rows, 61 sub-matrix columns (9 in $H_2$)
Fig. 45 (rate 0.8525 code)(shows $H_{1b}$ and $H_2$)

$H = [\,H_1 \mid H_2\,]$ $H \Uparrow$

| | | | | | | | | | | | | | | | |
|---|---|---|---|---|---|---|---|---|---|---|---|---|---|---|---|
| 15 | - | - | 13 | - | - | - | - | - | - | - | - | - | - | - | - |
| - | 25 | - | - | - | - | - | - | - | - | - | - | - | - | - | - |
| - | 13 | 12 | - | - | - | - | - | - | - | - | - | - | - | - | - |
| - | - | 11 | 13 | - | - | - | - | - | - | - | - | - | - | - | - |
| - | - | - | - | 6 | 2 | - | - | - | - | - | - | - | - | - | - |
| - | 14 | - | - | - | 9 | 13 | 24 | - | - | - | - | - | - | - | - |
| - | - | - | - | - | - | - | 8 | 14 | - | - | - | - | - | - | - |
| 9 | - | - | - | - | - | - | - | 24 | 14 | 20 | 0 | 1 | - | - | - |
| - | 18 | 0 | - | - | - | - | - | - | - | - | 24 | 23 | 4 | 2 | - |
| - | 3 | - | - | - | - | 4 | - | - | - | - | - | - | - | 3 | - |
| - | - | - | - | - | - | - | - | - | - | - | - | 4 | - | 12 | - |
| - | 27 | - | - | 12 | - | - | 8 | - | - | 22 | 23 | - | 5 | - | 20 | 25 |
| 24 | - | - | - | - | - | - | - | 22 | - | - | - | 8 | - | 15 | 2 |
| - | - | - | - | - | - | - | - | - | - | - | - | - | - | 16 | 4 |

| layer 1 | layer 2 | layer 1 | layer 2 | layer 1 | layer 2 | layer 3 | layer 4 | layer 3 | layer 4 | layer 3 | layer 4 | layer 2 | layer 1 |

4600

Fig. 46 (rate 1/8 code)

systematic code,
back substitution to determine parity-check symbols directly
block size 488, 56 information bits: (488,56) code
sub-matrix size = 28 × 28
14 sub-matrix rows, 16 sub-matrix columns (14 in $H_2$)

Fig. 48 (rate 2/3 code)

$H = [H_1 \,|\, H_2]$

| 8  | 19 | 18 | 1  | 13 | 27 | 33 | 13 | 39 | 22 | 0  | –  | –  | –  | –  |
|----|----|----|----|----|----|----|----|----|----|----|----|----|----|----|
| 22 | 13 | 9  | 2  | 32 | 10 | –  | 22 | 16 | 17 | 0  | 0  | –  | –  | –  |
| 7  | 5  | 16 | 26 | 1  | –  | 27 | 8  | 9  | –  | –  | 0  | 0  | –  | –  |
| 28 | 6  | 32 | 24 | 34 | 9  | 39 | –  | 23 | 35 | –  | –  | 0  | 0  | –  |
| 37 | 12 | 14 | 8  | 35 | 4  | 14 | 0  | –  | 26 | –  | –  | –  | 0  | 0  | block size 600, 400 information bits: (600,400) code
sub-matrix size = 40 × 40
5 sub-matrix rows, 15 sub-matrix columns (5 in $H_2$)

4800

| 28 | 9 | 37 | 8 | 25 | 7 | 24 | 17 | 30 | 29 | 20 | 0 | - | - | - |
|----|---|----|----|----|---|----|----|----|----|----|----|----|----|----|
| 16 | 19 | 8 | 38 | 10 | 12 | 20 | 9 | 9 | 16 | 27 | 0 | 0 | - | - |
| 2 | 0 | 9 | 26 | 4 | 34 | 39 | 2 | 25 | 19 | 12 | - | 0 | 0 | - |
| 0 | 19 | 23 | 23 | 19 | 4 | 1 | 15 | 31 | 11 | 3 | - | - | 0 | 0 |

$H = [H_1 \mid H_2]$

↑ H

4900

Fig. 49 (rate 0.73 code)

block size 600, 440 information bits: (600,440) code
sub-matrix size = 40 × 40
4 sub-matrix rows, 15 sub-matrix columns (4 in $H_2$)

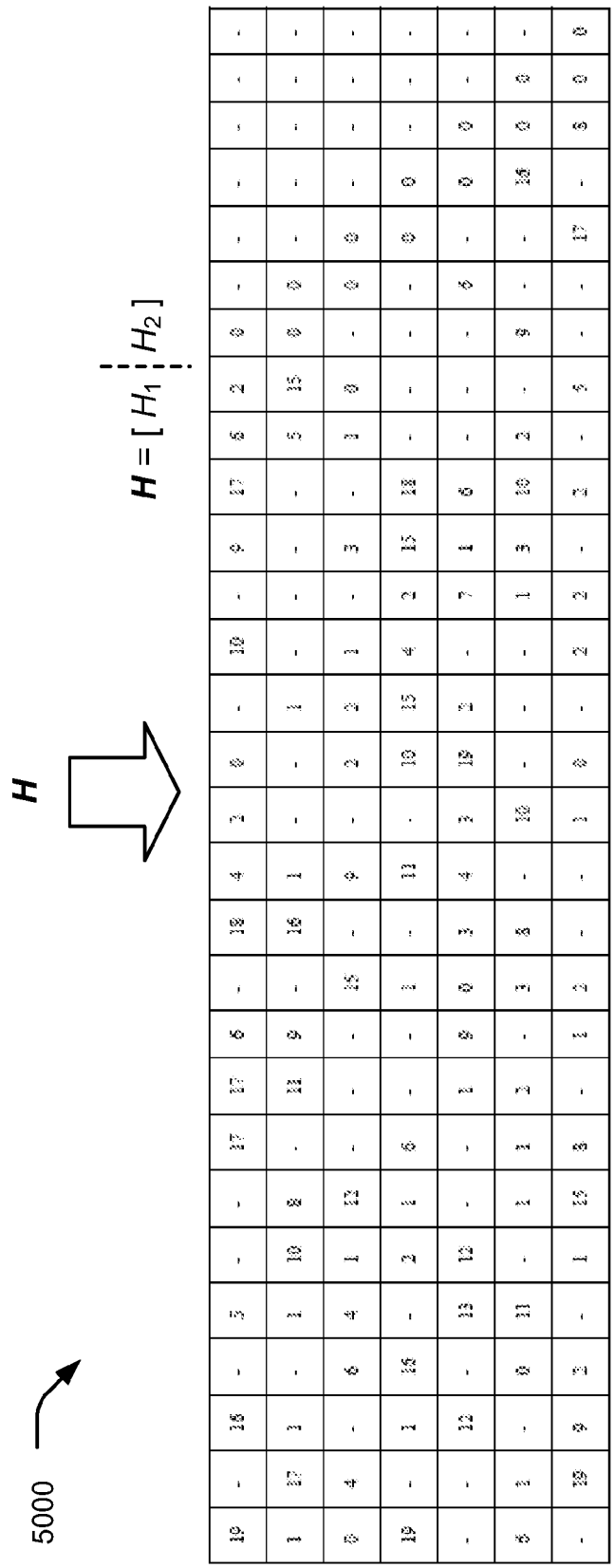
Fig. 50 (rate 0.76 code)
block size 580, 440 information bits: (580,440) code
sub-matrix size = 20 × 20
7 sub-matrix rows, 29 sub-matrix columns (7 in $H_2$)

block size 576, 432 information bits: (576,432) code
sub-matrix size = 12 × 12
12 sub-matrix rows, 48 sub-matrix columns (12 × 48 base matrix)
maximum column weight: 12
systematic, irregular LDPC code

Fig. 52 (rate 0.75 code)

Fig. 53 (rate 0.75 code)

Fig. 54 (rate 0.75 code)

Fig. 55 (rate 0.75 code)

Fig. 56 (rate 0.75 code)

Fig. 58 (rate 0.75 code)

Fig. 59 (rate 0.75 code)

LDPC (LOW DENSITY PARITY CHECK) CODES WITH CORRESPONDING PARITY CHECK MATRICES SELECTIVELY CONSTRUCTED WITH CSI (CYCLIC SHIFTED IDENTITY) AND NULL SUB-MATRICES

CROSS REFERENCE TO RELATED PATENTS/PATENT APPLICATIONS

Provisional Priority claims

The present U.S. Utility patent application claims priority pursuant to 35 U.S.C. §119(e) to the following U.S. Provisional Patent Application which is hereby incorporated herein by reference in its entirety and made part of the present U.S. Utility patent application for all purposes:

1. U.S. Provisional Application Ser. No. 61/086,035, entitled "CSI (Cyclic Shifted Identity) sub-matrix based LDPC (Low Density Parity Check) codes with selective information and redundancy bit puncturing," filed Aug. 4, 2008, pending.

2. U.S. Provisional Application Ser. No. 61/091,190, entitled "CSI (Cyclic Shifted Identity) sub-matrix based LDPC (Low Density Parity Check) codes with selective information and redundancy bit puncturing and/or shortening," filed Aug. 22, 2008, pending.

3. U.S. Provisional Application Ser. No. 61/098,918, entitled "CSI (Cyclic Shifted Identity) sub-matrix based LDPC (Low Density Parity Check) codes with selective information and redundancy bit puncturing and/or shortening," filed Sep. 22, 2008, pending.

4. U.S. Provisional Application Ser. No. 61/103,230, entitled "CSI (Cyclic Shifted Identity) sub-matrix based LDPC (Low Density Parity Check) codes with selective information and redundancy bit puncturing and/or shortening," filed Oct. 6, 2008, pending.

5. U.S. Provisional Application Ser. No. 61/105,330, entitled "CSI (Cyclic Shifted Identity) sub-matrix based LDPC (Low Density Parity Check) codes with selective information and redundancy bit puncturing and/or shortening," filed Oct. 14, 2008, pending.

6. U.S. Provisional Application Ser. No. 61/105,471, entitled "CSI (Cyclic Shifted Identity) sub-matrix based LDPC (Low Density Parity Check) codes with selective information and redundancy bit puncturing and/or shortening," filed Oct. 15, 2008, pending.

7. U.S. Provisional Application Ser. No. 61/139,359, entitled "CSI (Cyclic Shifted Identity) sub-matrix based LDPC (Low Density Parity Check) codes with selective information and redundancy bit puncturing and/or shortening," filed Dec. 19, 2008, pending.

8. U.S. Provisional Application Ser. No. 61/142,858, entitled "CSI (Cyclic Shifted Identity) sub-matrix based LDPC (Low Density Parity Check) codes with selective information and redundancy bit puncturing and/or shortening," filed Jan. 6, 2009, pending.

9. U.S. Provisional Application Ser. No. 61/164,875, entitled "CSI (Cyclic Shifted Identity) sub-matrix based LDPC (Low Density Parity Check) codes with selective information and redundancy bit puncturing and/or shortening," filed Mar. 30, 2009, pending.

10. U.S. Provisional Application Ser. No. 61/167,488, entitled "CSI (Cyclic Shifted Identity) sub-matrix based LDPC (Low Density Parity Check) codes with selective information and redundancy bit puncturing and/or shortening," filed Apr. 7, 2009, pending.

$1^{st}$ Continuation-In-Part (CIP) Priority claim, 35 U.S.C. §120

The present U.S. Utility patent application also claims priority pursuant to 35 U.S.C. §120, as a continuation-in-part (CIP), to the following U.S. Utility patent application which is hereby incorporated herein by reference in its entirety and made part of the present U.S. Utility patent application for all purposes:

1. U.S. Utility application Ser. No. 11/292,135, entitled "Algebraic construction of LDPC (Low Density Parity Check) codes with corresponding parity check matrix having CSI (Cyclic Shifted Identity) sub-matrices," filed Dec. 1, 2005, now issued as U.S. Pat. No. 7,617,429 on Nov. 10, 2009, which claims priority pursuant to 35 U.S.C. §119(e) to the following U.S. Provisional Patent Applications which are hereby incorporated herein by reference in their entirety and made part of the present U.S. Utility patent application for all purposes:

a. U.S. Provisional Application Ser. No. 60/642,689, entitled "Construction of LDPC (Low Density Parity Check) codes using generalized R-S (Reed-Solomon) code," filed Jan. 10, 2005, now expired.

b. U.S. Provisional Application Ser. No. 60/674,084, entitled "Construction of Irregular LDPC (Low Density Parity Check) codes using RS (Reed-Solomon) codes or GRS (Generalized Reed-Solomon) code," filed Apr. 22, 2005, now expired.

c. U.S. Provisional Application Ser. No. 60/675,346, entitled "Construction of Irregular LDPC (Low Density Parity Check) codes using RS (Reed-Solomon) codes or GRS (Generalized Reed-Solomon) code," filed Apr. 27, 2005, now expired.

d. U.S. Provisional Application Ser. No. 60/700,127, entitled "Algebraic construction of LDPC (Low Density Parity Check) codes with corresponding parity check matrix having CSI (Cyclic Shifted Identity) sub-matrices," filed Jul. 18, 2005, now expired.

e. U.S. Provisional Application Ser. No. 60/708,937, entitled "Algebraic construction of LDPC (Low Density Parity Check) codes with corresponding parity check matrix having CSI (Cyclic Shifted Identity) sub-matrices," filed Aug. 17, 2005, now expired.

f. U.S. Provisional Application Ser. No. 60/716,868, entitled "Algebraic construction of LDPC (Low Density Parity Check) codes with corresponding parity check matrix having CSI (Cyclic Shifted Identity) sub-matrices," filed Sep. 14, 2005, now expired.

g. U.S. Provisional Application Ser. No. 60/721,599, entitled "Algebraic construction of LDPC (Low Density Parity Check) codes with corresponding parity check matrix having CSI (Cyclic Shifted Identity) sub-matrices," filed Sep. 29, 2005, now expired.

$2^{nd}$ Continuation-in-Part (CIP) Priority claim, 35 U.S.C. § 120

The present U.S. Utility patent application also claims priority pursuant to 35 U.S.C. §120, as a continuation-in-part (CIP), to the following U.S. Utility Patent Application which is hereby incorporated herein by reference in its entirety and made part of the present U.S. Utility patent application for all purposes:

2. U.S. Utility patent application Ser. No. 11/472,226, entitled "Efficient construction of LDPC (Low Density Parity Check) codes with corresponding parity check matrix having CSI (Cyclic Shifted Identity) sub-matrices," filed Jun. 21, 2006, now issued as U.S. Pat. No. 7,617,441 on Nov. 10, 2009, which claims priority pursuant to 35 U.S.C. §119(e) to the following U.S. Provisional Patent Applications which are hereby incorporated herein by reference in their entirety and made part of the present U.S. Utility patent application for all purposes:

a. U.S. Provisional Application Ser. No. 60/700,127, entitled "Algebraic construction of LDPC (Low Density Parity Check) codes with corresponding parity check matrix having CSI (Cyclic Shifted Identity) sub-matrices," filed Jul. 18, 2005, now expired.

b. U.S. Provisional Application Ser. No. 60/708,937, entitled "Algebraic construction of LDPC (Low Density Parity Check) codes with corresponding parity check matrix having CSI (Cyclic Shifted Identity) sub-matrices," filed Aug. 17, 2005, now expired.

c. U.S. Provisional Application Ser. No. 60/716,868, entitled "Algebraic construction of LDPC (Low Density Parity Check) codes with corresponding parity check matrix having CSI (Cyclic Shifted Identity) sub-matrices," filed Sep. 14, 2005, now expired.

d. U.S. Provisional Application Ser. No. 60/721,599, entitled "Algebraic construction of LDPC (Low Density Parity Check) codes with corresponding parity check matrix having CSI (Cyclic Shifted Identity) sub-matrices," filed Sep. 29, 2005, now expired.

e. U.S. Provisional Application Ser. No. 60/728,250, entitled "Efficient construction of LDPC (Low Density Parity Check) codes with corresponding parity check matrix having CSI (Cyclic Shifted Identity) sub-matrices," filed Oct. 19, 2005, now expired.

INCORPORATION BY REFERENCE

The following U.S. Utility patent applications are hereby incorporated herein by reference in their entirety and made part of the present U.S. Utility patent application for all purposes:

1. U.S. Utility patent application Ser. No. 11/190,333, entitled "Construction of LDPC (Low Density Parity Check) codes using GRS (Generalized Reed-Solomon) code," filed Jul. 27, 2005, now issued as U.S. Pat. No. 7,536,629 B2 on May 19, 2009.

2. U.S. Utility patent application Ser. No. 11/264,997, entitled "Construction of Irregular LDPC (Low Density Parity Check) codes using RS (Reed-Solomon) codes or GRS (Generalized Reed-Solomon) code," filed Nov. 2, 2005, now issued as U.S. Pat. No. 7,549,105 B2 on Jun. 16, 2009.

3. U.S. Utility patent application Ser. No. 11/472,256, entitled "Efficient construction of LDPC (Low Density Parity Check) codes with corresponding parity check matrix having CSI (Cyclic Shifted Identity) sub-matrices," filed Jun. 21, 2006, now issued as U.S. Pat. No. 7,617,442 on Nov. 10, 2009.

BACKGROUND OF THE INVENTION

1. Technical Field of the Invention

The invention relates generally to communication devices as may be employed in communication systems; and, more particularly, it relates to the use LDPC (Low Density Parity Check) matrices constructed appropriately for use within communication devices to encode and/or decode coded signals for use in such communication systems.

2. Description of Related Art

Data communication systems have been under continual development for many years. One such type of communication system that has been of significant interest lately is a communication system that employs iterative error correction codes (ECCs). Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code with a length of one million, it nevertheless demonstrates the very promising application of LDPC codes within communication systems.

The use of LDPC coded signals continues to be explored within many newer application areas. Some examples of possible communication systems that may employ LDPC coded signals include communication systems employing 4 wire twisted pair cables for high speed Ethernet applications (e.g., 10 Gbps (Giga-bits per second) Ethernet operation according to the IEEE 802.3an (10 GBASE-T) emerging standard) as well as communication systems operating within a wireless context (e.g., in the IEEE 802.11 context space including the IEEE 802.11n emerging standard).

For any of these particular communication system application areas, near-capacity achieving error correction codes are very desirable. The latency constraints, which would be involved by using traditional concatenated codes, simply preclude their use in such applications in very high data rate communication system application areas.

Generally speaking, within the context of communication systems that employ LDPC codes, there is a first communication device at one end of a communication channel with encoder capability and second communication device at the other end of the communication channel with decoder capability. In many instances, one or both of these two communication devices includes encoder and decoder capability (e.g., within a bi-directional communication system). LDPC codes can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWINGS

FIG. 9 illustrates an embodiment of an LDPC matrix (according to Option 3) corresponding to an LDPC code having a rate of ½.

FIG. 10 illustrates an alternative embodiment of an LDPC matrix (according to Option 3) corresponding to an LDPC code having a rate of ½.

FIG. 24 illustrates an embodiment of an LDPC matrix (according to Option 3) corresponding to an LDPC code having a rate of ½.

FIG. 25 illustrates an embodiment of an LDPC matrix (according to Option 3) corresponding to an LDPC code having a rate of ⅚.

FIG. 26, FIG. 27A/FIG. 27B, and FIG. 28 illustrate an embodiment of an LDPC matrix (according to Option 3) corresponding to an LDPC code having a rate of ⅘ (of an LDPC matrix having form, $H=[H_{1a}\ H_{1b}\ H_2]$, FIG. 26 shows $H_{1a}$, FIG. 27A/FIG. 27B together show $H_{1b}$, (FIG. 27A shows left hand side thereof $H_{1b,1}$, and FIG. 27B shows right hand side thereof $H_{1b,2}$), and FIG. 28 shows $H_2$).

FIG. 29 illustrates an alternative embodiment of an LDPC matrix (according to Option 3) corresponding to an LDPC code having a rate of ½.

FIG. 30 illustrates an alternative embodiment of an LDPC matrix (according to Option 3) corresponding to an LDPC code having a rate of ½.

FIG. 31 illustrates an alternative embodiment of an LDPC matrix (according to Option 3) corresponding to an LDPC code having a rate of ¾.

FIG. 32 illustrates an alternative embodiment of an LDPC matrix (according to Option 3) corresponding to an LDPC code having a rate of ⅚.

FIG. 33 illustrates an alternative embodiment of an LDPC matrix (according to Option 3) corresponding to an LDPC code having a rate of ⅚.

FIG. 35 illustrates an alternative embodiment of an LDPC matrix (according to Option 3) corresponding to an LDPC code having a rate of ⅚.

FIG. 36 illustrates an alternative embodiment of an LDPC matrix (according to Option 3) corresponding to an LDPC code having a rate of 0.79.

FIG. 37 and FIG. 38 illustrate an embodiment of an LDPC matrix (according to Option 3) corresponding to an LDPC code having a rate of ⅚ (of an LDPC matrix having form, $H=[H_{1a}\ H_{1b}\ H_2]$, FIG. 37 shows $H_1$, and FIG. 38 shows $H_{1b}$ and $H_2$).

FIG. 39 illustrates an embodiment of LDPC encoding and puncturing.

FIG. 40 illustrates another embodiment of LDPC encoding and shortening (and/or puncturing).

FIG. 41 illustrates another embodiment of LDPC encoding and shortening (and/or puncturing).

FIG. 42 and FIG. 43 illustrate an alternative embodiment of an LDPC matrix (according to a variation of Option 3) corresponding to an LDPC code having a rate of 0.8966 (of an LDPC matrix having form, $H=[H_{1a}\ H_{1b}\ H_2]$, FIG. 42 shows $H_{1a}$, and FIG. 43 shows $H_{1b}$ and $H_2$).

FIG. 44 and FIG. 45 illustrate an alternative embodiment of an LDPC matrix (according to a variation of Option 3) corresponding to an LDPC code having a rate of 0.8525 (of an LDPC matrix having form, $H=[H_{1a}\ H_{1b}\ H_2]$, FIG. 44 shows $H_{1a}$, and FIG. 45 shows $H_{1b}$ and $H_2$).

FIG. 46 illustrate an alternative embodiment of an LDPC matrix (according to a variation of Option 3) corresponding to an LDPC code having a rate of ⅛ or 0.125 (of an LDPC matrix having form, $H=[H_1 H_2]$.

FIG. 48 illustrates an alternative embodiment of an LDPC matrix (according to Option 3) corresponding to an LDPC code having a rate of ⅔.

FIG. 49 illustrates an alternative embodiment of an LDPC matrix (according to Option 3) corresponding to an LDPC code having a rate of 0.73.

FIG. 50 illustrates an alternative embodiment of an LDPC matrix (according to a variation of Option 3) corresponding to an LDPC code having a rate of 0.76.

DETAILED DESCRIPTION OF THE INVENTION

Communication systems have been around for some time, and their presence into modern life is virtually ubiquitous (e.g., television communication systems, telecommunication systems including wired and wireless communication systems, etc.). As these communication systems continue to be developed, there is an ever present need for designing various means by which information may be encoded for transmitting from a first location to a second location. In accordance with this, error correction codes (ECCs) are a critical component in ensuring that the information received at the second location is actually the information sent from the first location. LDPC (Low Density Parity Check) codes are one such type of ECC that can be employed within any of a variety of communication systems.

It is noted that any of the following embodiments and approaches described herein are applicable regardless of any overall LDPC decoder architecture which may be employed, e.g., whether fully parallel, partially parallel, or serial in a particular architecture/hardware implementation.

Figure 1:
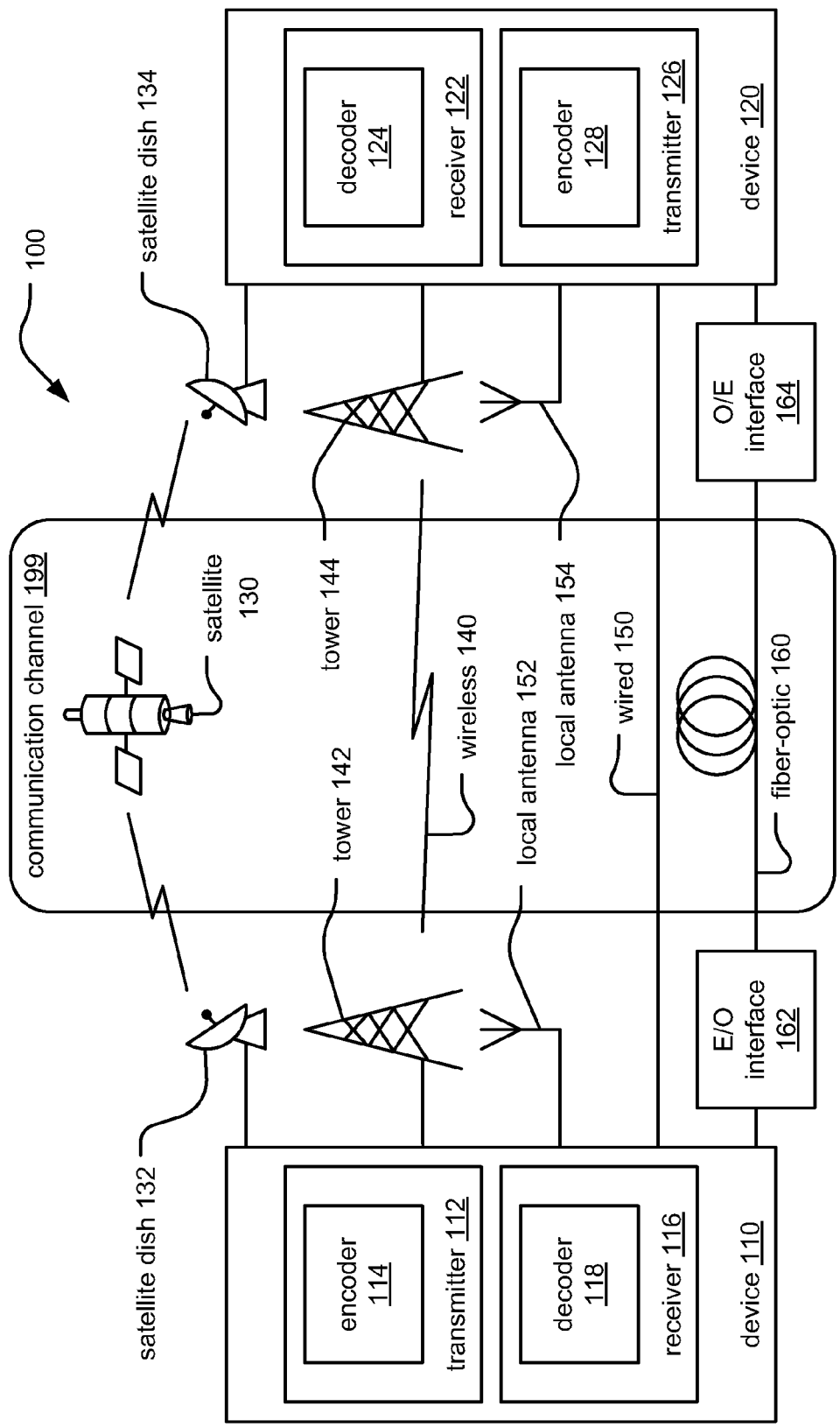
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
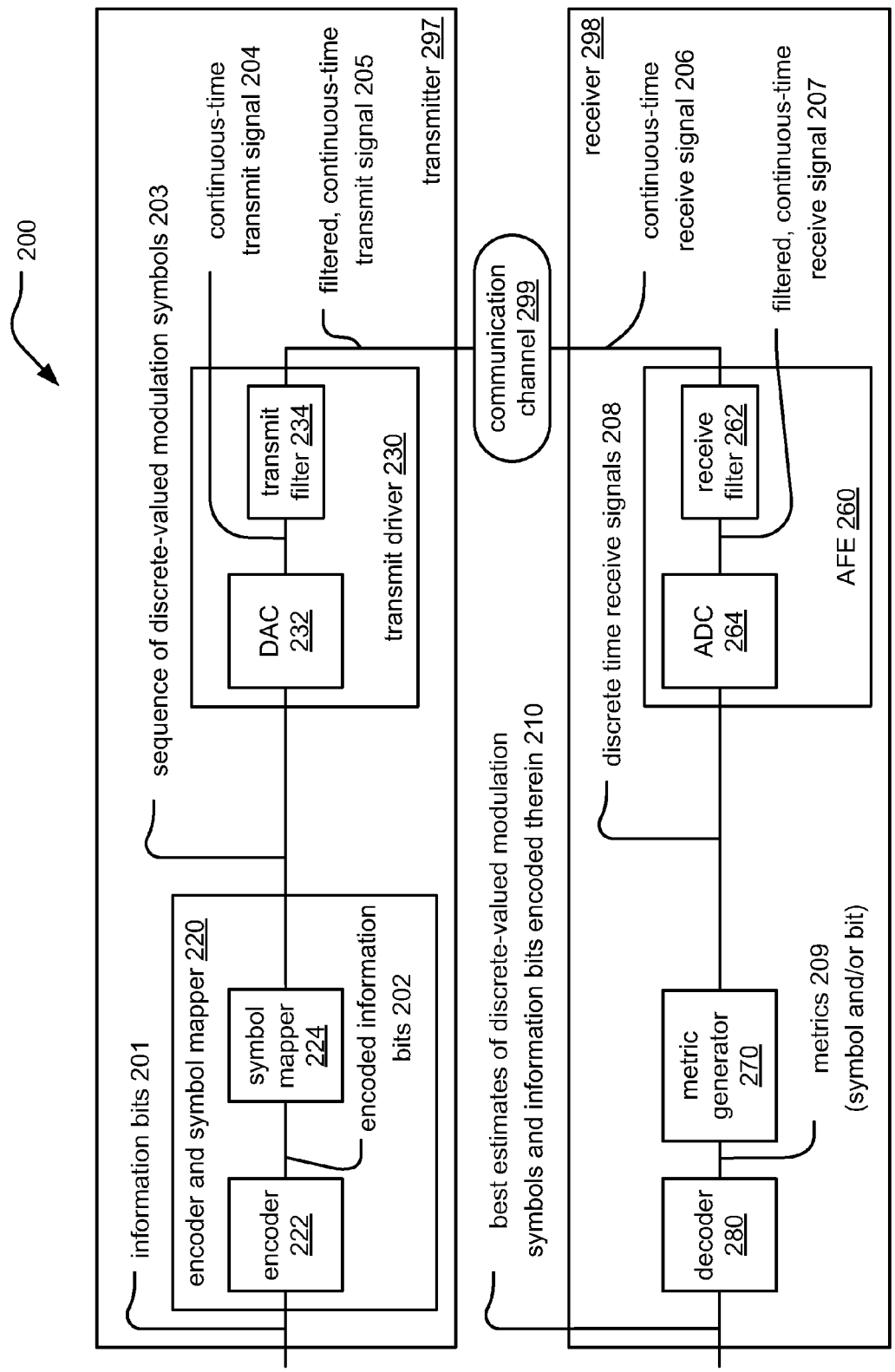

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of LDPC codes described herein can be employed within any such desired communication system (e.g., including those variations described with respect to FIG. 1), any information storage device (e.g., hard disk drives (HDDs), network information storage devices and/or servers, etc.) or any application in which information encoding and/or decoding is desired.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates metrics 209 (e.g., on either a symbol and/or bit basis) that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. A general description of LDPC codes is provided below as well.

Figure 3:
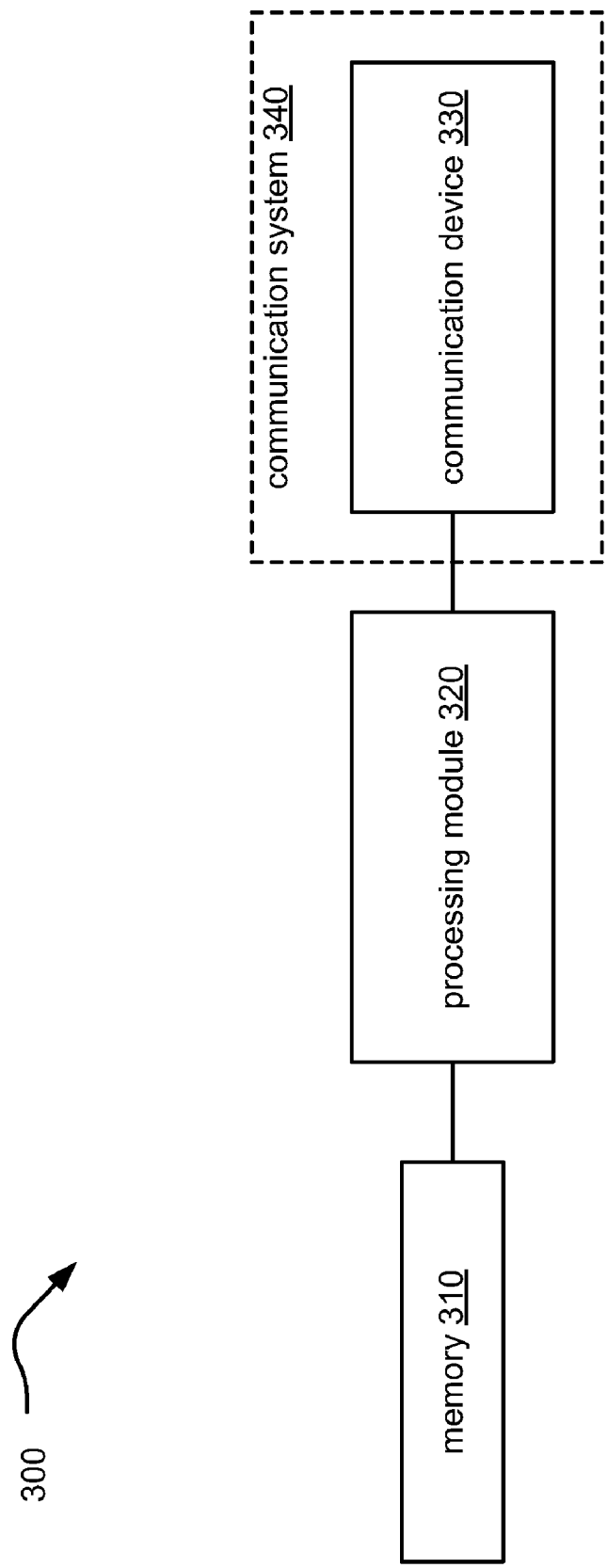
FIG. 3 illustrates an embodiment of an apparatus that is operable to perform LDPC decoding processing and/or LDPC code construction.

FIG. 3 illustrates an embodiment of an apparatus 300 that is operable to perform LDPC decoding processing and/or LDPC code construction. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which various LDPC codes may be constructed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which LDPC code construction is to be performed (e.g., the size of sub-matrices within the LDPC matrix of a corresponding LDPC code, the number of null or all-zero-valued sub-matrices (i.e., these terms of "null sub-matrix", "all-zero-valued sub-matrix", or "zero-valued sub-matrix" may be used interchangeably; a null or all-zero-valued sub-matrix is a sub-matrix having all elements therein being a value of zero "0"), the cyclic shift (if any) of any sub-matrix within an LDPC matrix, etc.) can be provided from the apparatus 300 to a communication system 340 that is operable to employ and perform LDPC coding using a desired LDPC code. For example, information corresponding to the LDPC code being used (e.g., the parity check matrix of the LDPC code) can also be provided from the processing module 320 to any of a variety of communication devices 330 implemented within any desired such communication system 340 as well.

If desired, the apparatus 320 can be designed to generate multiple means of constructing LDPC codes in accordance with multiple needs and/or desires as well. In some embodiments, the processing module 320 can selectively provide different information (e.g., corresponding to different LDPC codes and their corresponding LDPC matrices, relative performance comparison between the various LDPC codes, etc.) to different communication devices and/or communication systems. That way, different communication links between different communication devices can employ different LDPC codes and/or means by which to perform LDPC encoding and/or decoding. Clearly, the processing module 320 can also provide the same information to each of different communication devices and/or communication systems as well without departing from the scope and spirit of the invention.

Figure 4:
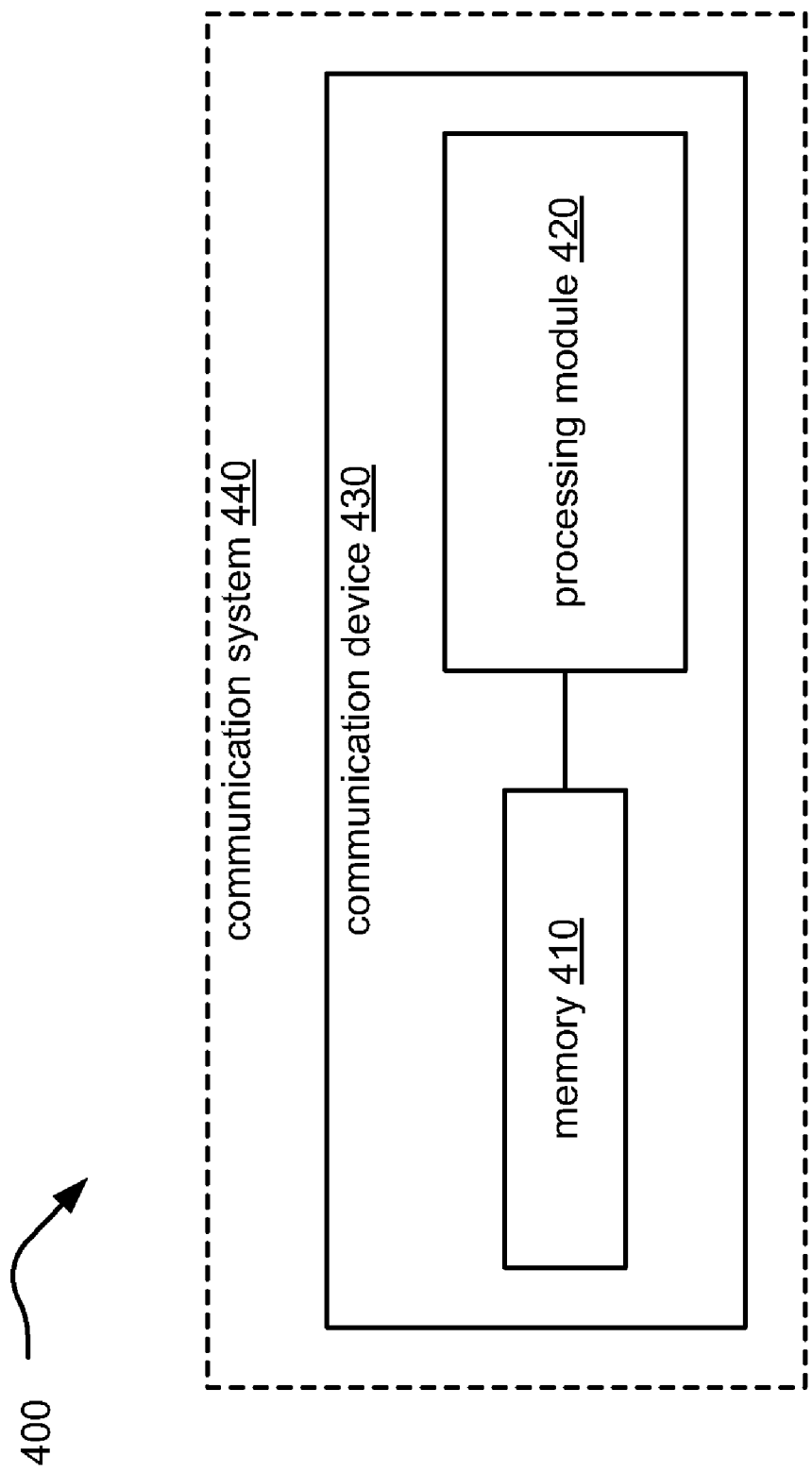
FIG. 4 illustrates an alternative embodiment of an apparatus that is operable to perform LDPC decoding processing and/or LDPC code construction.

FIG. 4 illustrates an alternative embodiment of an apparatus that is operable to perform LDPC decoding processing and/or LDPC code construction. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 410) can be implemented as an apparatus capable to perform any of the functionality of any of the various modules and/or functional blocks described herein. For example, the processing module 420 (serviced by the memory 410) can be implemented as an apparatus capable to perform and/or direct the manner in which LDPC code construction is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of LDPC decoding processing in accordance with LDPC decoding processing as presented herein, and equivalents thereof, may be applied to many types of communication systems and/or communication devices.

Figure 5:
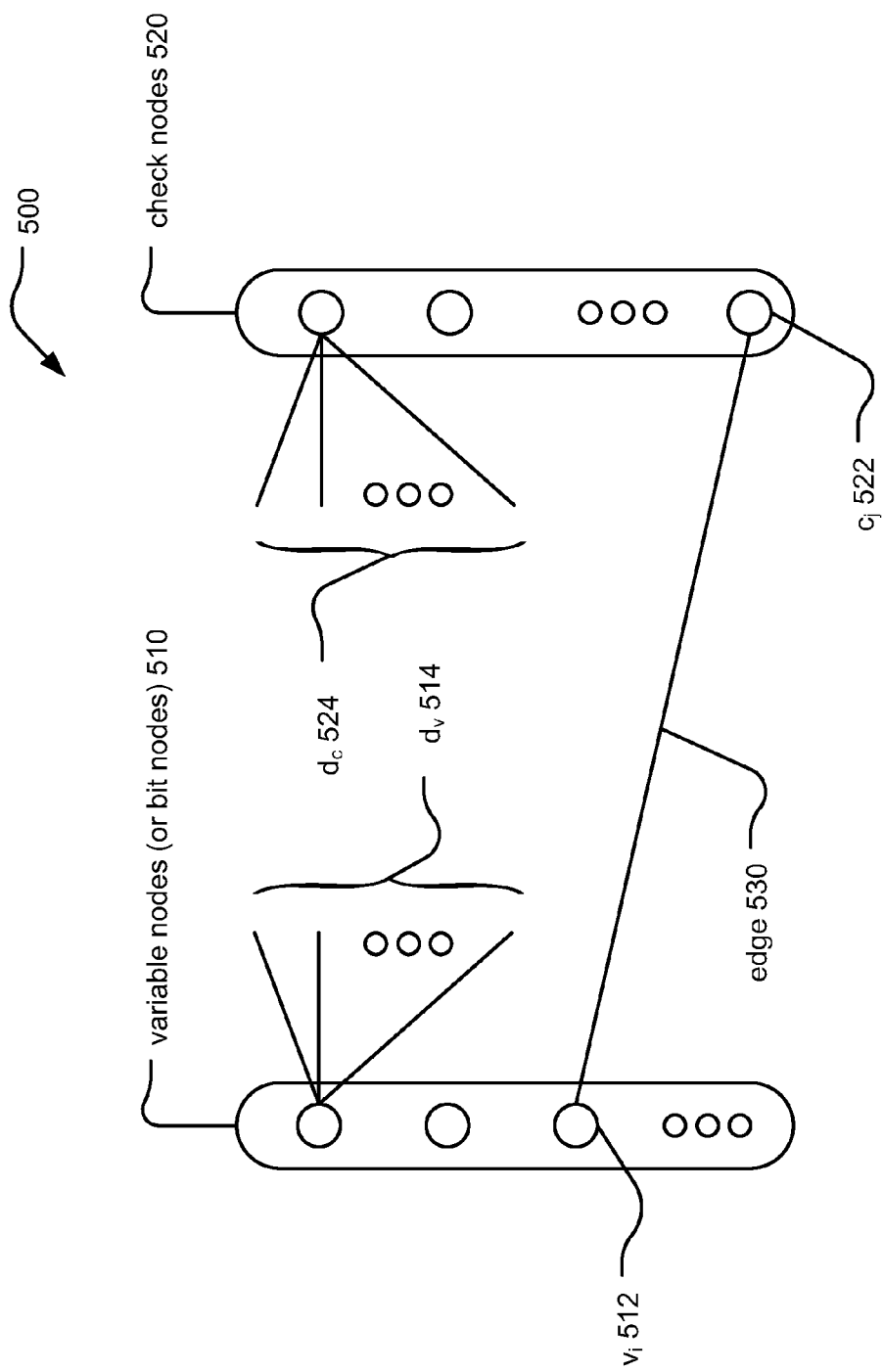
FIG. 5 illustrates an embodiment of an LDPC (Low Density Parity Check) code bipartite graph.

FIG. 5 illustrates an embodiment of an LDPC (Low Density Parity Check) code bipartite graph 500. In the art, an LDPC bipartite graph may also sometimes be referred to as a "Tanner" graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

LDPC codes are linear block codes and hence the set of all codewords $x \in C$ spans the null space of a parity check matrix, H.

$$Hx^T = 0, \forall x \in C \quad (1)$$

For LDPC codes, H, is a sparse binary matrix of dimension m×n. Each row of H corresponds to a parity check and a set element $h_{ij}$ indicates that data symbol j participates in parity check i. Each column of H corresponds to a codeword symbol.

For each codeword x there are n symbols of which m are parity symbols. Hence the code rate r is given by:

$$r = (n-m)/n \quad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i) = d_v$ for all i, and $d_c(j) = d_c$ for all j, then the LDPC code is called a $(d_v, d_c)$ regular LDPC code, otherwise the LDPC code is called an irregular LDPC code.

LDPC codes were introduced by R. Gallager in [1] referenced below (also in [2] referenced below) and by M. Luby et al. in [3] also referenced below.

[1] R. Gallager, *Low-Density Parity-Check Codes*, Cambridge, Mass.: MIT Press, 1963.

[2] R. G. Gallager, "Low density parity check codes," *IRE Trans. Info. Theory*, vol. IT-8, January 1962, pp. 21-28.

[3] M. G. Luby, M. Mitzenmacher, M. A. Shokrollahi, D. A. Spielman, and V. Stemann, "Practical Loss-Resilient Codes," *Proc. 29th Symp. on Theory of Computing*, 1997, pp. 150-159.

A regular LDPC code can be represented as a bipartite graph 500 by its parity check matrix with left side nodes representing variable of the code bits (or alternatively as the "variable nodes" (or "bit nodes") 510 in a bit decoding approach to decoding LDPC coded signals), and the right side nodes representing check equations (or alternatively as the "check nodes" 520). The bipartite graph 500 (or sometimes referred to as a Tanner graph 500) of the LDPC code defined by H may be defined by N variable nodes (e.g., N bit nodes) and M check nodes. Every variable node of the N variable nodes 510 has exactly $d_v(i)$ edges (an example edge shown using reference numeral 530) connecting the bit node, $v_i$ 512, to one or more of the check nodes (within the M check nodes). The edge 530 is specifically shown as connecting from the bit node, $v_i$ 512, to the check node, $c_j$ 522. This number of $d_v$ edges (shown as $d_v$ 514) may be referred to as the degree of a variable node i. Analogously, every check node of the M check nodes 520 has exactly $d_c(j)$ edges (shown as $d_c$ 524) connecting this node to one or more of the variable nodes (or bit nodes) 510. This number of edges, $d_c$, may be referred to as the degree of the check node j.

An edge 530 between a variable node $v_i$ (or bit node $b_i$) 512 and check node $c_j$ 522 may be defined by $e = (i,j)$. However, on the other hand, given an edge $e = (i,j)$, the nodes of the edge may alternatively be denoted as by $e = (v(e), c(e))$ (or $e = (b(e), c(e))$). Alternatively, the edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i) = \{e | v(e) = i\}$ (or by $E_b(i) = \{e | b(e) = i\}$); these edges are referred to as bit edges, and the messages corresponding to these bit edges are referred to as bit edge messages.

Given a check node $c_j$, one may define the set of edges emitting from the node $c_j$ by $E_c(j) = \{e | c(e) = j\}$; these edges are referred to as check edges, and the messages corresponding to these check edges are referred to as check edge messages. Continuing on, the derivative result will be $|E_v(i)| = d_v$ (or $|E_b(i)| = d_b$) and $|E_c(j)| = d_c$.

Generally speaking, any codes that can be represented by a bipartite graph may be characterized as a graph code. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [3] referenced above.

In general, with a graph of an LDPC code, the parameters of an LDPC code can be defined by a degree of distribution, as described within M. Luby et al. in [3] referenced above and also within the following reference [4]:

[4] T. J. Richardson and R. L. Urbanke, "The capacity of low-density parity-check code under message-passing decoding," *IEEE Trans. Inform. Theory*, Vol. 47, No. 2, February 2001, pp. 599-618.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC codes.

It is also noted that many of the embodiments described herein employ the terminology of "bit node" and "bit edge message", or equivalents thereof. Oftentimes, in the art of LDPC decoding, the "bit node" and "bit edge message" are alternatively referred to as "variable node" and "variable edge message", in that, the bit values (or variable values) are those which are attempted to be estimated. Either terminology can be employed in accordance with certain aspects of the invention.

In accordance with LDPC coding, quasi-cyclic LDPC codes (as described in reference [5]) have become increasingly popular in recent times.

[5] Marc P. C. Fossorier, "Quasi-Cyclic Low-Density Parity-Check Codes From Circulant Permutation Matrices," *IEEE Trans. Inform. Theory*, Vol. 50, No. 8, August 2004, pp. 1788-1793.

A general description of such a quasi-cyclic LDPC code is that each codeword thereof, after undergoing a cyclic shift, will result in another codeword of the LDPC in most cases; since this is not true necessarily for all codewords of the LDPC code, hence the use of the term "quasi".

Typically, the manner in which such quasi-cycle LDPC codes are constructed in the art is using a brute force approach in which a designer simply tries a large number of variations without any real design methodology. There is no efficient methodology in the prior art by which such quasi-cyclic LDPC codes may be constructed.

Herein, a methodology is presented by which a large number of quasi-cyclic LDPC codes can be constructed in a very efficient manner for comparison and selection of one or more of those LDPC codes to be used in any of a wide variety of communication systems types and communication device types. Any other application context (e.g., including information storage device, etc.) in which ECC may be employed can also use one or more of these LDPC codes.

In addition, the manner presented herein in which LDPC codes may be constructed allows for a designer to compare and employ various sub-matrix sizes of the corresponding LDPC matrices.

Figure 6:
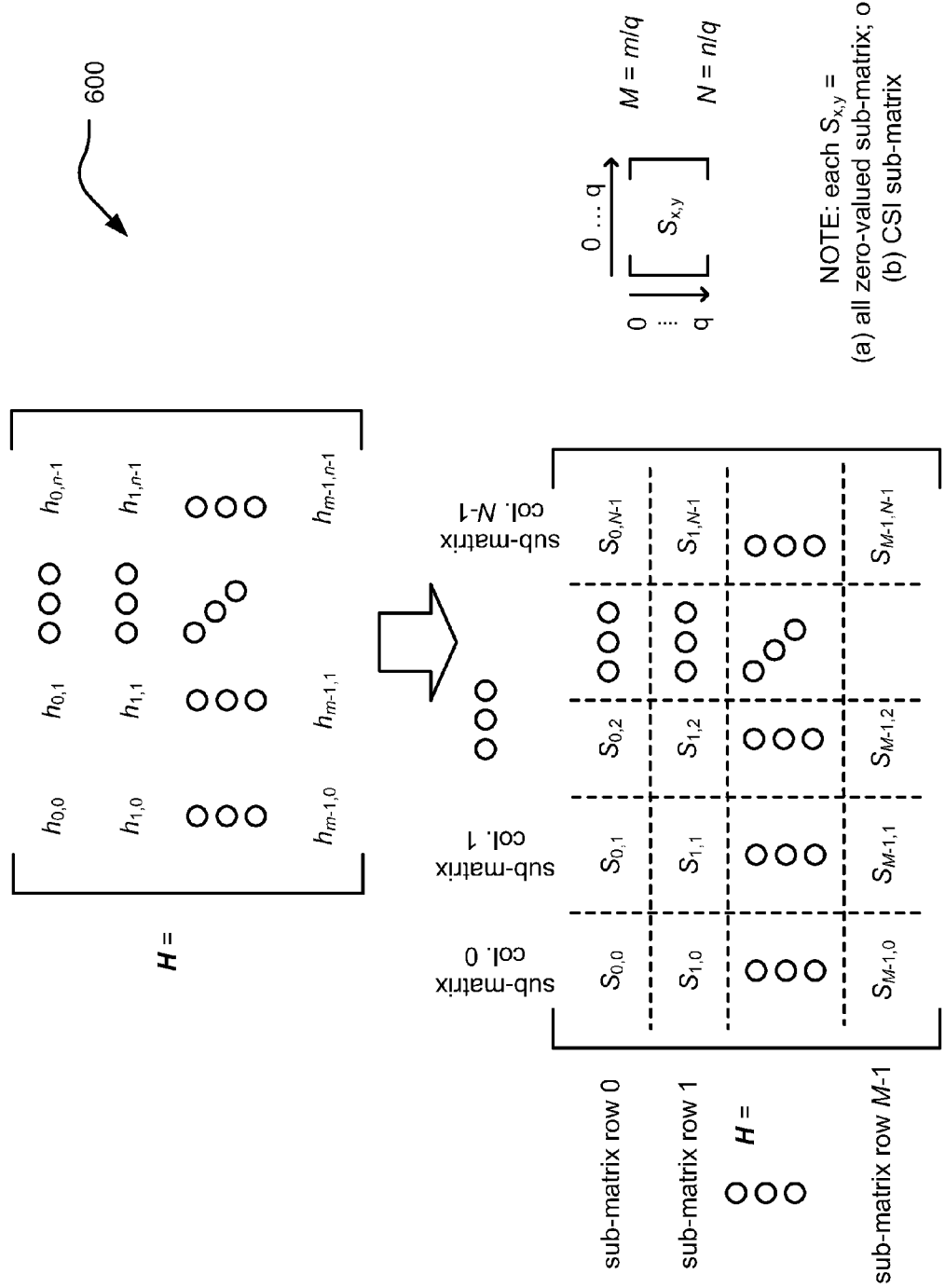
FIG. 6 illustrates an embodiment of the relationship between an overall LDPC matrix and the individual sub-matrices therein that include all null or zero-valued sub-matrices (terms which may be used interchangeably) and/or CSI (Cyclic Shifted Identity) sub-matrices (including the sub-matrix rows and sub-matrix columns of the LDPC matrix).

FIG. 6 illustrates an embodiment 600 of the relationship between an overall LDPC matrix and the individual sub-matrices therein that include all null or zero-valued sub-matrices and/or CSI (Cyclic Shifted Identity) sub-matrices (including the sub-matrix rows and sub-matrix columns of the LDPC matrix).

A binary LDPC code may be fully described by its parity check matrix (i.e., its LDPC matrix). At the top of FIG. 6, the individual elements of an LDPC matrix, H, are shown:

$$H = \begin{bmatrix} h_{0,0} & h_{0,1} & \ldots & h_{0,n-1} \\ h_{1,0} & h_{1,1} & \ldots & h_{1,n-1} \\ \vdots & \vdots & \ddots & \vdots \\ h_{m-1,0} & h_{m-1,1} & \ldots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $$Hc^T = 0.$$

For such an LDPC code, the parity matrix H is also composed of a number of q-by-q (i.e., q×q) square sub-matrices as shown in the bottom portion of FIG. 6 and also below:

$$H = \begin{bmatrix} S_{0,0} & S_{0,1} & \ldots & S_{0,N-1} \\ S_{1,0} & S_{1,1} & \ldots & S_{1,N-1} \\ \vdots & \vdots & \ddots & \vdots \\ S_{M-1,0} & S_{M-1,1} & \ldots & S_{M-1,N-1} \end{bmatrix}$$

where M=m/q, N=n/q, and each sub-matrix, $S_{I,J}$, thereof is a q-by-q sub-matrix that is either an all null or zero-valued sub-matrix (i.e., in which all elements thereof are the value or zero "0") or a CSI (Cyclic Shifted Identity) sub-matrix. A CSI sub-matrix S is characterized by a shift-value, $\lambda(S)$, such that the components of S are defined as follows:

$$s_{i,j} = \begin{cases} 1 & \text{if } i + \lambda(S) = j \pmod{q} \\ 0 & \text{otherwise} \end{cases}$$

for any i and j, with $0 \leq i < q$ and $0 \leq j < q$. For example, the q-by-q identity matrix is itself a CSI matrix with a shift-value $\lambda(S)=0$ (i.e., a CSI sub-matrix that has undergone a cyclic shift of zero "0").

As can be seen, the LDPC matrix (as depicted in the lower portion of the diagram), includes various sub-matrix rows and sub-matrix columns. These sub-matrix rows and sub-matrix columns may be viewed as being based on the sub-matrix construction of the LDPC matrix (e.g., shown as sub-matrix rows 0 through M−1 and sub-matrix columns 0 through N−1).

Figure 7:
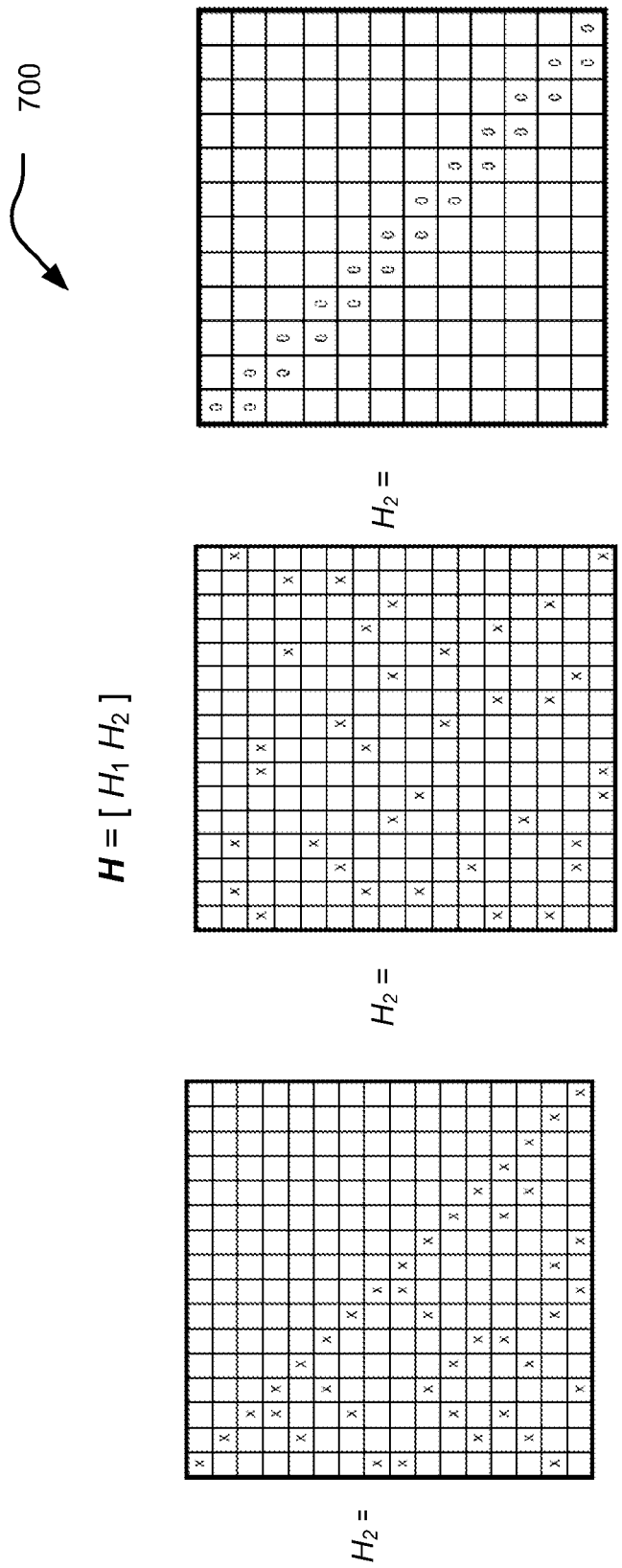
FIG. 7 illustrates an embodiment of possible forms of right hand side matrices of an LDPC matrix.

FIG. 7 illustrates an embodiment 700 of possible forms of right hand side matrices of an LDPC matrix. An LDPC matrix is composed of a plurality of sub-matrices each having a common size. The LDPC matrix is also partitioned into a left hand side matrix ($H_1$) and a right hand side matrix ($H_2$), such that the entire LDPC matrix, H, is depicted as follows:

$$H=[H_1 H_2].$$

The right hand side matrix ($H_2$) can have a number of different forms, as shown in the three options in this diagram. The Option 1 for the right hand side matrix ($H_2$) ensures that the LDPC matrix, H, is in fact invertible (after undergoing some row permutation). The corresponding LDPC code of this Option 1 is also a systematic code in which an LDPC codeword includes all of the plurality of information bits that undergo encoding as well as parity bits.

The Option 2 for the right hand side matrix ($H_2$) includes all null or zero-valued top row which means that the LDPC matrix, H, is not invertible. The corresponding LDPC code of this Option 2 is a non-systematic code (e.g., an LDPC codeword generated in accordance with this LDPC code does not explicitly include all of the information bits encoded thereby).

In the Option 1 and the Option 2, all sub-matrices depicted by X are sub-matrices having undergone a cyclic shift of some value (which may be different for different sub-matrices). All of the sub-matrices that have a corresponding blank therein are all null or zero-valued sub-matrices (i.e., all elements of those sub-matrices are a value of 0).

The Option 3 for the right hand side matrix ($H_2$) ensures that the LDPC matrix, H, is in fact invertible, and an LDPC codeword generated in accordance with this LDPC code includes all of the plurality of information bits that undergo encoding as well as parity bits (i.e., it is a systematic LDPC code). As can be seen with respect to this Option 3, each sub-matrix within the right hand matrix is a null or an all zero-valued sub-matrix except those sub-matrices identified below in (a) and (b):

(a) each sub-matrix located on a diagonal of the right hand side matrix is a CSI (Cyclic Shifted Identity) sub-matrix; and (b) in every row between a second row, which is below and adjacent to a top row, and a bottom row of the right hand side matrix, inclusive, each sub-matrix located on a left hand side of and adjacent to a sub-matrix located on the diagonal of the right hand side matrix is also a CSI sub-matrix.

In other words, all of the sub-matrices that have a corresponding blank therein are all null or zero-valued sub-matrices (i.e., all elements of those sub-matrices are a value of 0). However, all of the sub-matrices that have a corresponding 0 depicted therein are CSI sub-matrices having undergone a cyclic shift of 0 (i.e., they are identity sub-matrices).

Various embodiments are presented herein for LDPC codes of various code rates (e.g., ½, ¾, and ⅚) that may be employed in a variety of applications including piconets and/or personal area networks (PANs) that operate in accordance with the IEEE 802.15.3c emerging standard and/or the wireless local area network (WLAN) 802.11n emerging standard.

Moreover, various means of performing puncturing of bits within an LDPC codeword (e.g., information bits only, parity bits only, and/or at least one information bit and at least one parity bit) are also presented.

Figure 8:
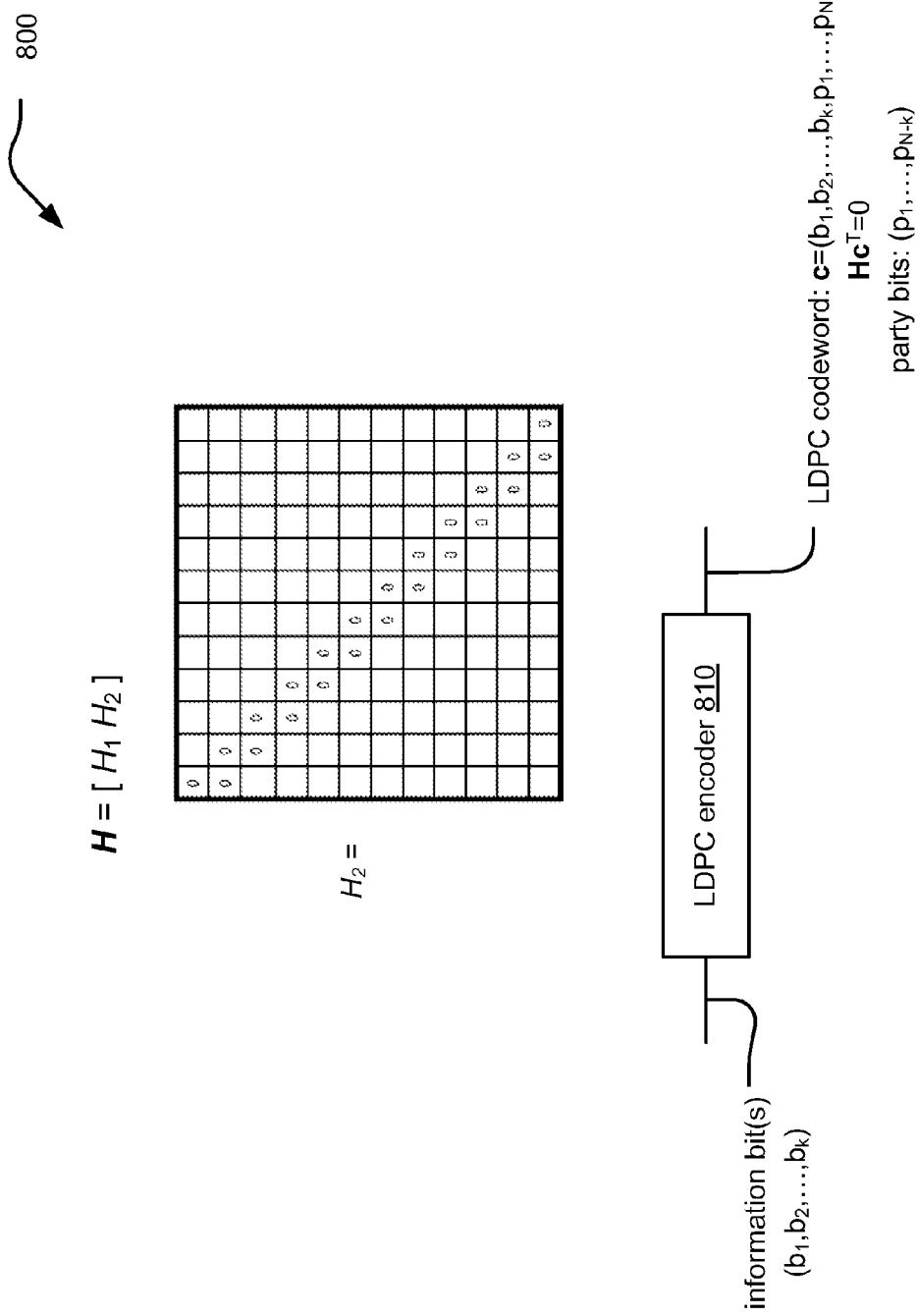
FIG. 8 illustrates an embodiment of encoding when a right hand side matrix of an LDPC matrix has a form similar to Option 3 as shown in FIG. 7.

FIG. 8 illustrates an embodiment 800 of encoding when a right hand side matrix of an LDPC matrix has a form similar to Option 3 as shown in FIG. 7. An LDPC encoder 810 receives a plurality of information bits (shown as ($b_1$, $b_2$, ..., $b_k$)) and generates an LDPC codeword there from. It is noted that once an LDPC matrix is known, a corresponding generator matrix can be determined as well. If the LDPC matrix includes a right hand side matrix having a form similar to Option 3 as shown in FIG. 7, then direct back substitution can be employed and the corresponding LDPC encoding is straight-forward.

In this embodiment, the corresponding LDPC code is a systematic code, and the LDPC codeword is shown as c=($b_1$, $b_2$, ..., $b_k$, $p_1$, $p_2$, ..., $p_{N-k}$), such that the LDPC codeword includes all of the information bits ($b_1$, $b_2$, ..., $b_k$) as well as parity bits ($p_1$, $p_2$, ..., $p_{N-k}$).

It is noted that if the parity check matrix, H, has the form H=[$H_1 H_2$], and also has rank of N-k, then the right hand side matrix ($H_2$) is an (N-k)×(N-k) matrix and the following is true:

$$Hc^T = H(b_1, b_2, \ldots, b_k, p_1, p_2, \ldots, p_{N-k})^T = 0.$$

Also, the right hand side matrix ($H_2$) is then invertible.

FIG. 9 illustrates an embodiment of an LDPC matrix (according to Option 3) corresponding to an LDPC code having a rate of ½. This LDPC matrix has a form of H=[$H_1 H_2$], and the right hand side matrix ($H_2$) includes 12 sub-matrix columns. The left hand side matrix ($H_1$) includes 12 sub-matrix columns, and each sub-matrix therein that is a CSI sub-matrix is characterized by a shift-value, λ(S). For example, the top left hand sub-matrix has a value of 22, and is therefore a CSI sub-matrix with a shift-value of 22, λ(22). All of the sub-matrices depicted as a "–" are all null or zero-valued sub-matrices.

The block size of this LDPC code is 672, the bipartite graph corresponding to this LDPC code includes 2016 edges (i.e., connecting between the bit nodes and the check nodes). The sub-matrices are all size 28 by 28 (i.e., 28 rows and 28 columns each).

This corresponding LDPC code is a systematic code, and LDPC encoding can be employed using this LDPC matrix by simply performing back substitution.

FIG. 10 illustrates an alternative embodiment of an LDPC matrix (according to Option 3) corresponding to an LDPC code having a rate of ½. This LDPC matrix has a form of H=[$H_1 H_2$], and the right hand side matrix ($H_2$) includes 11 sub-matrix columns. The left hand side matrix ($H_1$) includes 13 sub-matrix columns, and each sub-matrix therein that is a CSI sub-matrix is characterized by a shift-value, λ(S). For example, the top left hand sub-matrix has a value of 9, and is therefore a CSI sub-matrix with a shift-value of 9, λ(9). All of the sub-matrices depicted as a "–" are all null or zero-valued sub-matrices.

The block size of this LDPC code is 672, the bipartite graph corresponding to this LDPC code includes 2048 edges (i.e., connecting between the bit nodes and the check nodes). The sub-matrices are all size 28 by 28 (i.e., 28 rows and 28 columns each).

This corresponding LDPC code is a systematic code. After performing some transformation (e.g., row and/or column permutations) to generate another LDPC matrix, this LDPC matrix also allows direct determination of the parity-check symbols using back-substitution.

Oftentimes performance diagrams are described in the context of BLER (Block Error Rate) [or BER (Bit Error Rate)] versus $E_b/N_o$ (ratio of energy per bit $E_b$ to the Spectral Noise Density $N_o$) or SNR (Signal to Noise Ratio). This term $E_b/N_o$ is the measure of SNR for a digital communication system. When looking at such performance curves, the BLER [or BER] may be determined for any given $E_b/N_o$ (or SNR) thereby providing a relatively concise representation of the performance of the decoding approach.

The following simulations and performance comparisons are performed on a Rayleigh fading communication channel. The type of modulation employed is quadrature phase shift keying (QPSK), the amplitude is changed on every symbol. The LDPC decoding employed is the standard belief propagation (BP) processing. The maximum number of iterations is 50, at least 100 code block errors are included therein, and the BLER is estimated up to $1 \times 10^{-7}$. As mentioned above, any type of overall LDPC decoder architecture which may be employed, e.g., whether fully parallel, partially parallel, or serial in a particular architecture/hardware implementation.

Figure 11:
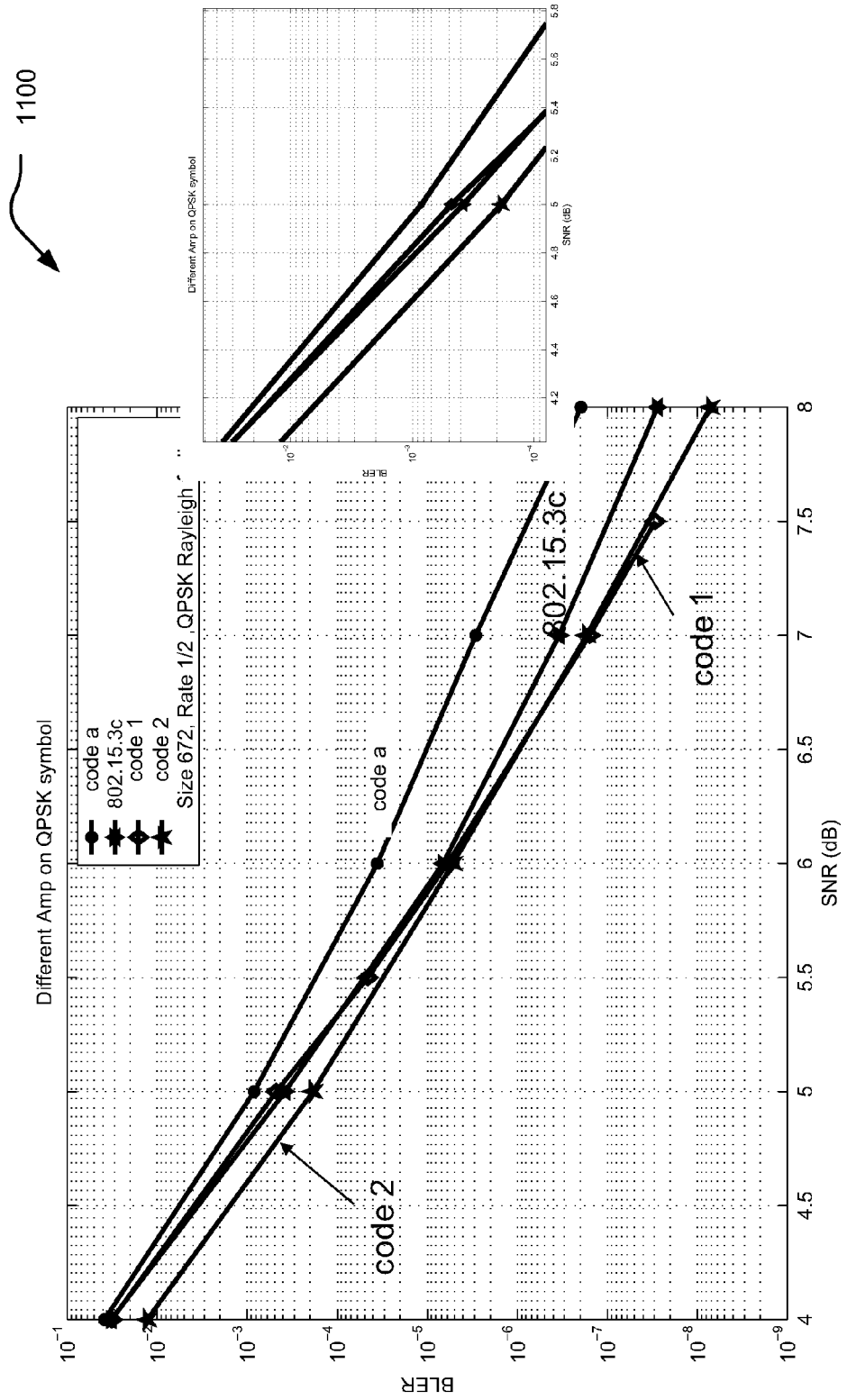
FIG. 11 illustrates an embodiment of performance comparisons of various rate ½ LDPC codes using quadrature phase shift keying (QPSK) on Rayleigh fading communication channel.

FIG. 11 illustrates an embodiment 1100 of performance comparisons of various rate ½ LDPC codes using quadrature phase shift keying (QPSK) on Rayleigh fading communication channel. In this embodiment, the LDPC code 1 (of FIG. 9) and the LDPC code 2 (of FIG. 10) is compared to a code 'a' and another LDPC code compatible with IEEE 802.15.3c. As can be seen, the LDPC code 1 (of FIG. 9) and the LDPC code 2 (of FIG. 10) outperform the other codes.

Figure 12:
FIG. 12 illustrates an embodiment of an LDPC matrix (according to Option 3) corresponding to an LDPC code having a rate of ¾.

FIG. 12 illustrates an embodiment 1200 of an LDPC matrix (according to Option 3) corresponding to an LDPC code having a rate of ¾. This LDPC matrix has a form of H=[$H_1 H_2$], and the right hand side matrix ($H_2$) includes 6 sub-matrix columns. The left hand side matrix ($H_1$) includes 18 sub-matrix columns, and each sub-matrix therein that is a CSI sub-matrix is characterized by a shift-value, λ(S). For example, the top left hand sub-matrix has a value of 11, and is therefore a CSI sub-matrix with a shift-value of 11, λ(11). All of the sub-matrices depicted as a "–" are all null or zero-valued sub-matrices.

The block size of this LDPC code is 672, the bipartite graph corresponding to this LDPC code includes 2408 edges (i.e., connecting between the bit nodes and the check nodes). The sub-matrices are all size 28 by 28 (i.e., 28 rows and 28 columns each).

This corresponding LDPC code is a systematic code, and LDPC encoding can be employed using this LDPC matrix by simply performing back substitution.

Figure 13:
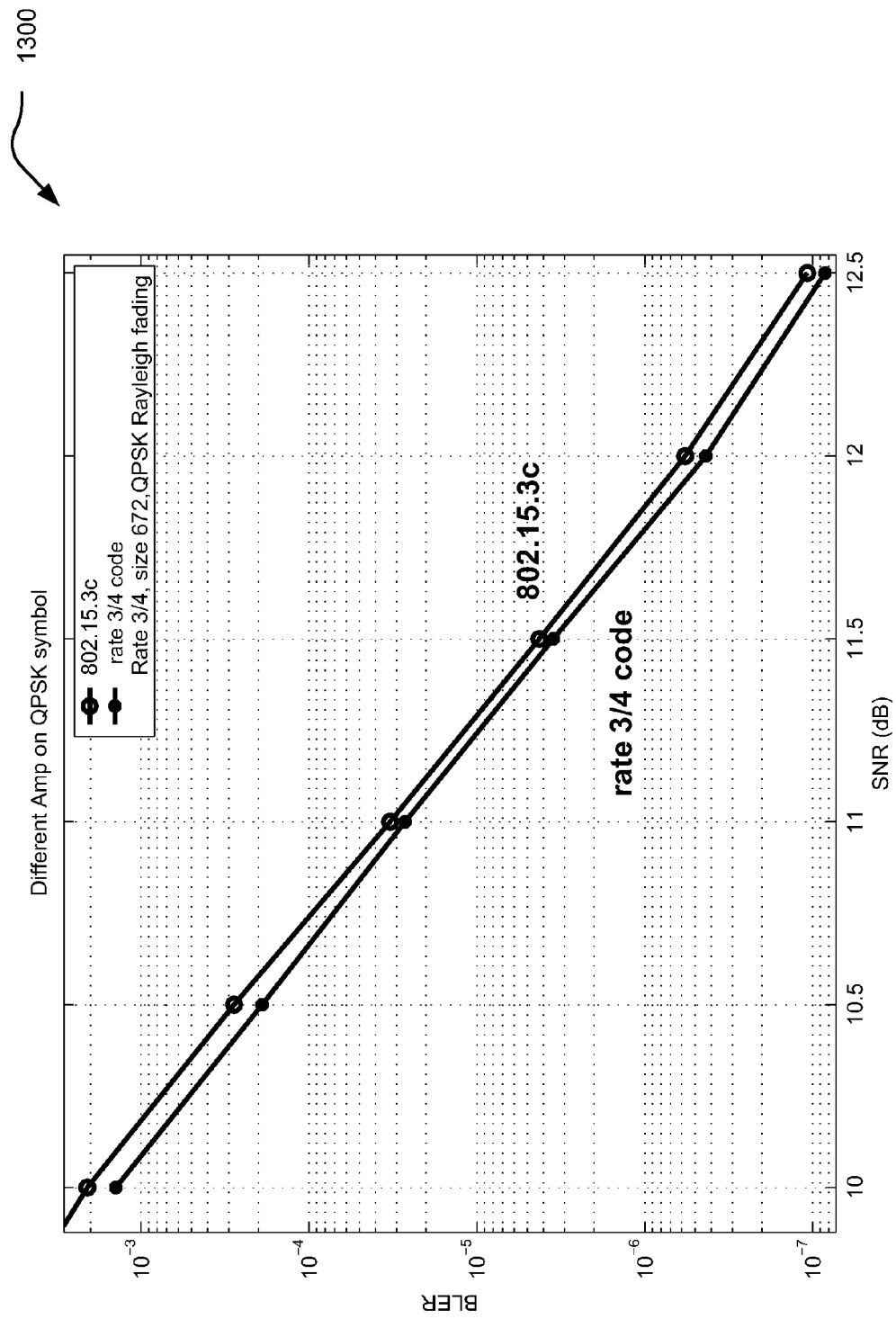
FIG. 13 illustrates an embodiment of performance comparisons of various rate ¾ LDPC codes using QPSK on Rayleigh fading communication channel.

FIG. 13 illustrates an embodiment 1300 of performance comparisons of various rate ¾ LDPC codes using QPSK on Rayleigh fading communication channel.

In this embodiment, the LDPC code (of FIG. 12) is compared to an LDPC code compatible with IEEE 802.15.3c. As can be seen, the LDPC code (of FIG. 12) outperforms the other code.

Figure 14:
FIG. 14 illustrates an embodiment of an LDPC matrix (according to Option 3) corresponding to an LDPC code having a rate of ⅚.

FIG. 14 illustrates an embodiment 1400 of an LDPC matrix (according to Option 3) corresponding to an LDPC code having a rate of ⅚. This LDPC matrix has a form of H=[$H_1 H_2$], and the right hand side matrix ($H_2$) includes 4 sub-matrix columns. The left hand side matrix ($H_1$) includes 20 sub-matrix columns, and each sub-matrix therein that is a CSI sub-matrix is characterized by a shift-value, $\lambda(S)$. For example, the top left hand sub-matrix has a value of 24, and is therefore a CSI sub-matrix with a shift-value of 24, $\lambda(24)$. All of the sub-matrices depicted as a "–" are all zero-valued sub-matrices.

The block size of this LDPC code is 672, the bipartite graph corresponding to this LDPC code includes 2436 edges (i.e., connecting between the bit nodes and the check nodes). The sub-matrices are all size 28 by 28 (i.e., 28 rows and 28 columns each).

This corresponding LDPC code is a systematic code, and LDPC encoding can be employed using this LDPC matrix by simply performing back substitution.

Figure 15:
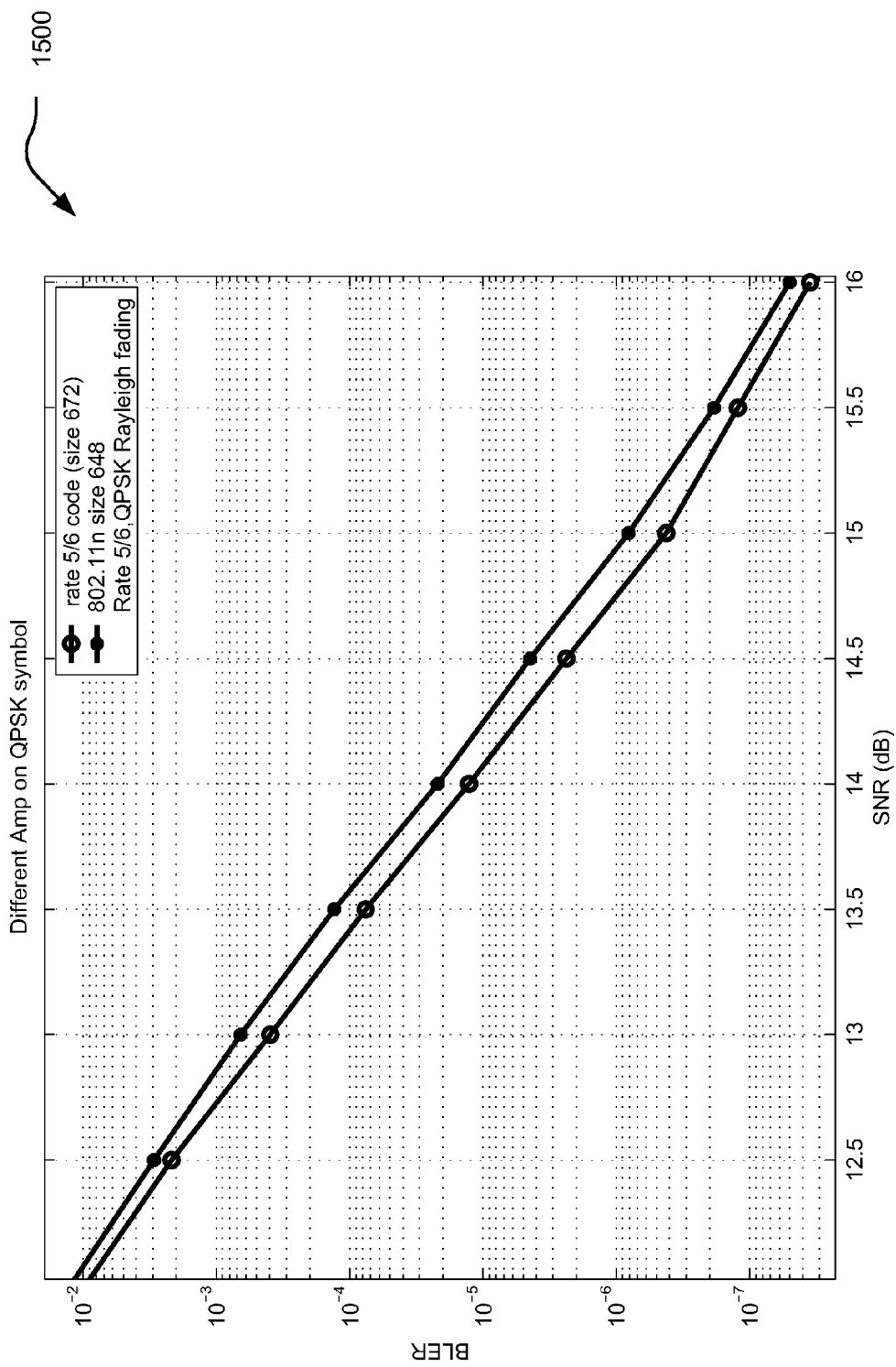
FIG. 15 illustrates an embodiment of performance comparisons of various rate ⅚ LDPC codes using QPSK on Rayleigh fading communication channel.

FIG. 15 illustrates an embodiment 1500 of performance comparisons of various rate ⅚ LDPC codes using QPSK on Rayleigh fading communication channel.

In this embodiment, the LDPC code (of FIG. 14) is compared to an LDPC code compatible with IEEE 802.11n. As can be seen, the LDPC code (of FIG. 14) outperforms the other code.

Various means are presented herein in which LDPC encoding and puncturing of an LDPC codeword may be performed.

Figure 16:
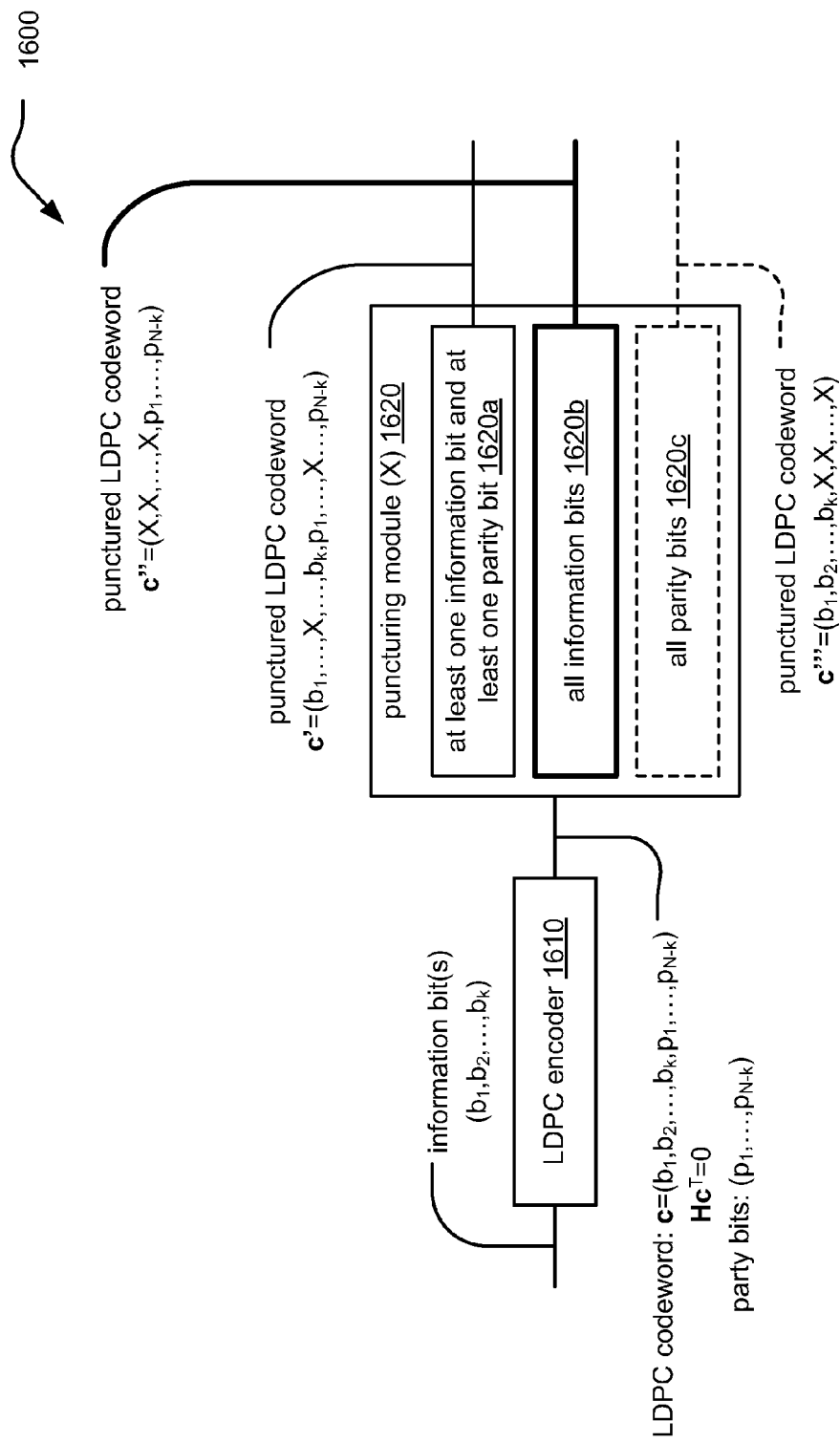
FIG. 16 illustrates an embodiment of LDPC encoding and puncturing.

FIG. 16 illustrates an embodiment 1600 of LDPC encoding and puncturing. In this embodiment, an LDPC encoder 1610 encodes a plurality of information bits (shown as ($b_1$, $b_2$, ..., $b_k$)) and generates an LDPC codeword that includes a plurality of information bits and a plurality of parity bits (shown as c=($b_1$, $b_2$, ..., $b_k$, $p_1$, $p_2$, ..., $p_{N-k}$)), such that ($p_1$, $p_2$, ..., $p_{N-k}$) are the parity bits.

In one embodiment, a puncturing module 1620 punctures at least one of an information bit and a parity bit from the LDPC codeword (as shown in the block 1620a) thereby generating a punctured LDPC codeword (e.g., shown as c'=($b_1$, $b_2$, ..., X, ..., $b_k$, $p_1$, $p_2$, ..., X, ..., $p_{N-k}$)).

In an alternative embodiment, a puncturing module 1620 punctures all of the information bits from the LDPC codeword (as shown in the block 1620b) thereby generating a punctured LDPC codeword (e.g., shown as c''=(X, X, ..., X, $p_1$, $p_2$, ..., $p_{N-k}$)).

In an even alternative embodiment, a puncturing module 1620 punctures all of the parity bits from the LDPC codeword (as shown in the block 1620c) thereby generating a punctured LDPC codeword (e.g., shown as c''=($b_1$, $b_2$, ..., $b_k$, X, X, ..., X)).

Regardless of which embodiment is employed with respect to puncturing, the LDPC codeword undergoes processing (e.g., digital filtering, digital to analog conversion, symbol mapping, and/or frequency conversion, etc.) to generate a signal (e.g., a continuous time signal) that is launched into a communication channel.

The LDPC coded signal may then be received by an input of a communication device, and then undergo LDPC decoding to make an estimate of an information bit encoded therein.

Examples of communication systems in which this LDPC encoding and puncturing may be implemented include any embodiment as described herein including those depicted in FIG. 1.

Figure 17:
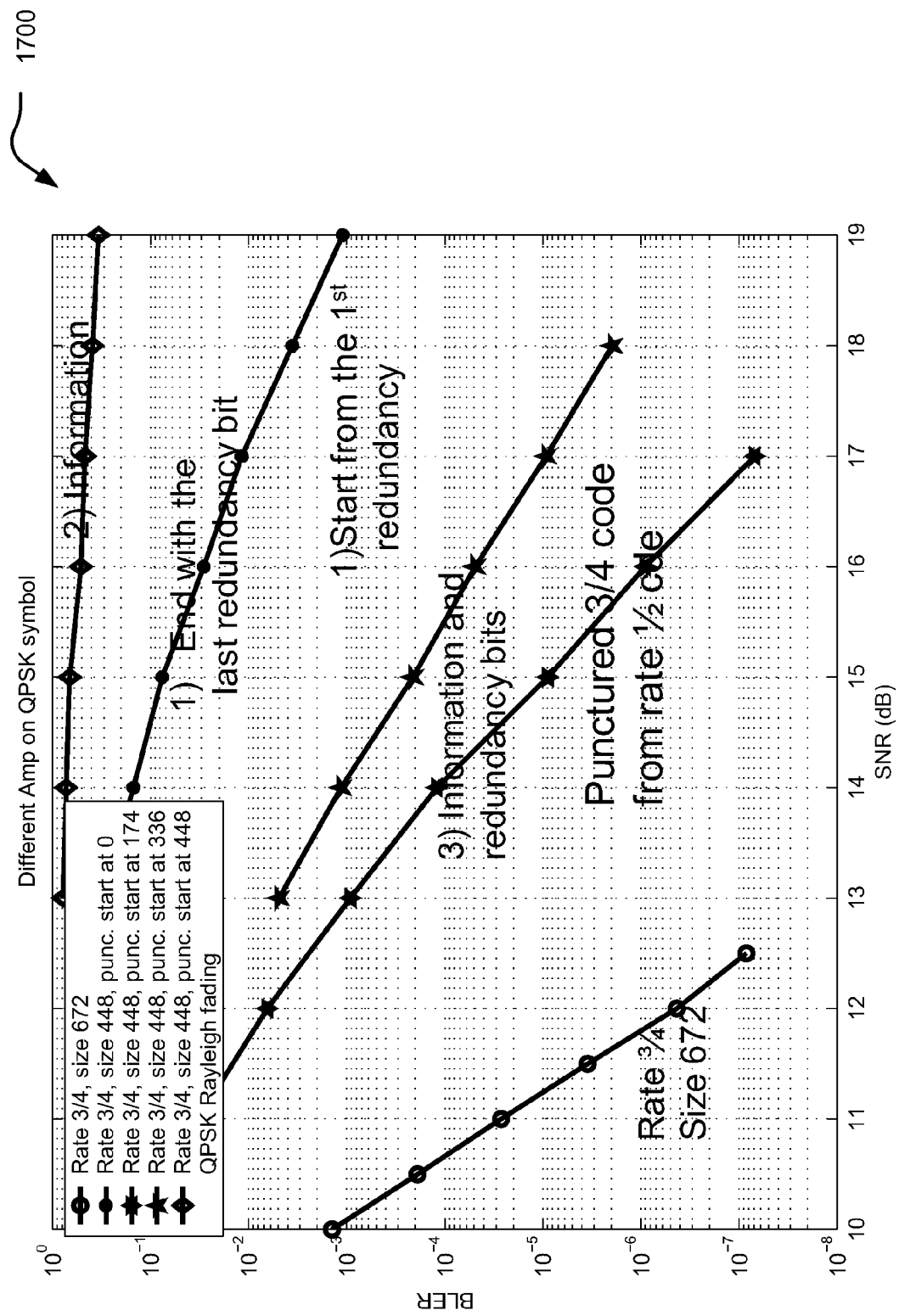
FIG. 17 illustrates an embodiment of performance comparisons of various LDPC codes, when accompanied with various types of puncturing, on a rate ¾ QPSK Rayleigh fading communication channel.

FIG. 17 illustrates an embodiment 1700 of performance comparisons of various LDPC codes, when accompanied with various types of puncturing, on a rate 3/4 QPSK Rayleigh fading communication channel.

In these embodiments, the puncturing of a rate ½ code of block size 672 to a rate ¾ code of block size 448 involves the puncturing of a significant number of bits (e.g., 224 bits punctured), and this can result in a relative significant reduction in performance.

Another embodiment involves puncturing of a rate ⅚ code of block size 672 to a rate ⅞ code of block size 640 which involves the puncturing of only 32 bits; this does not incur a significant reduction in performance.

The punctured rate ¾ code includes a loss of at least 4 dB when compared to the constructed ¾ code.

Figure 18:
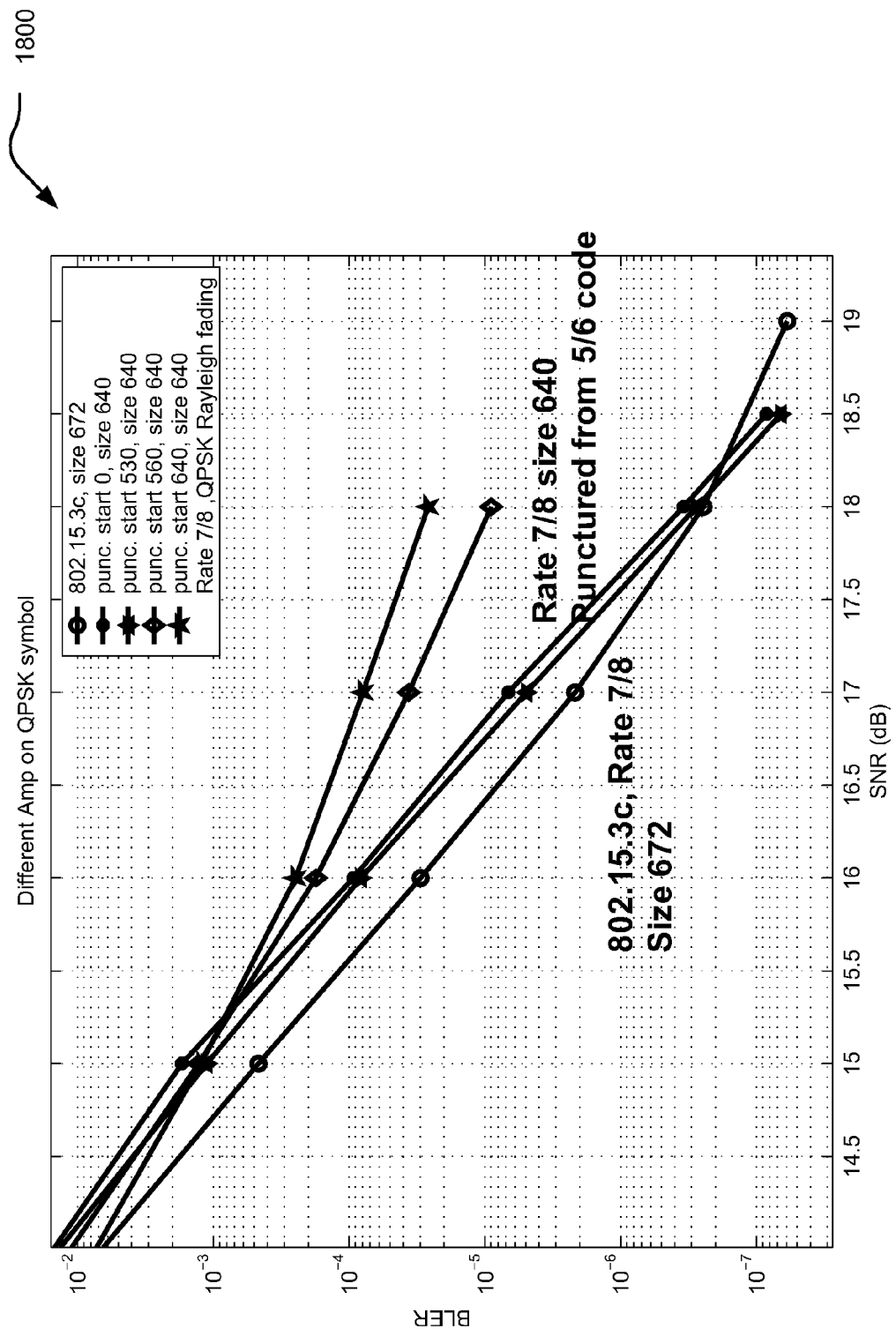
FIG. 18 illustrates an embodiment of performance comparisons of various LDPC codes, when accompanied with various types of puncturing, on a rate ⅞ QPSK Rayleigh fading communication channel.

FIG. 18 illustrates an embodiment 1800 of performance comparisons of various LDPC codes, when accompanied with various types of puncturing, on a rate ⅞ QPSK Rayleigh fading communication channel.

When comparing the punctured rate ⅞ code to the constructed rate ¾ code (e.g., which is IEEE 802.15.3c compatible), it incurs approximately a 0.4 dB loss above the BLER of $1\times10^{-5}$; approximately a 0.2 dB loss at a BLER of $1\times10^{-6}$; and approximately a 0.25 dB gain (not loss) at a BLER of $1\times10^{-7}$.

As can be seen, the loss incurred in these embodiments is not extreme, and a gain is actually realized at a BLER of $1\times10^{-7}$.

Another embodiment of an LDPC matrix having a form of H=[$H_1 H_2$] is provided below.

Figure 19:
FIG. 19 illustrates an embodiment of an LDPC matrix (according to Option 3) corresponding to an LDPC code having a rate of ⅔.

FIG. 19 illustrates an embodiment 1900 of an LDPC matrix (according to Option 3) corresponding to an LDPC code having a rate of ⅔. This LDPC matrix has a form of H=[$H_1 H_2$], and the right hand side matrix ($H_2$) includes 8 sub-matrix columns. The left hand side matrix ($H_1$) includes 16 sub-matrix columns, and each sub-matrix therein that is a CSI sub-matrix is characterized by a shift-value, $\lambda(S)$. For example, the top left hand sub-matrix has a value of 4, and is therefore a CSI sub-matrix with a shift-value of 4, $\lambda(4)$. All of the sub-matrices depicted as a "–" are all zero-valued sub-matrices.

The block size of this LDPC code is 672, the bipartite graph corresponding to this LDPC code includes 2548 edges (i.e., connecting between the bit nodes and the check nodes). The sub-matrices are all size 28 by 28 (i.e., 28 rows and 28 columns each).

This corresponding LDPC code is a systematic code, and LDPC encoding can be employed using this LDPC matrix by simply performing back substitution.

Figure 20:
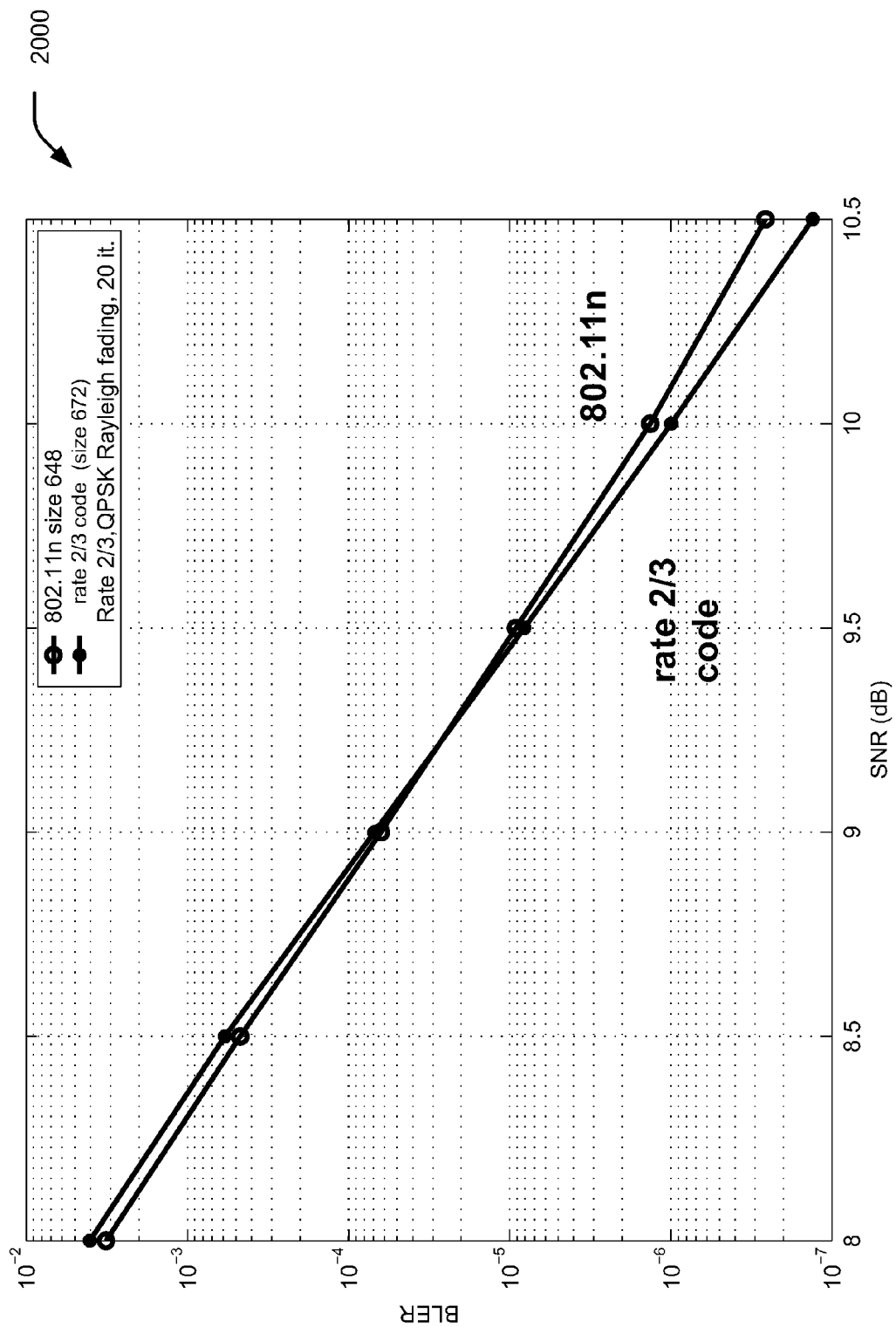
FIG. 20 illustrates an embodiment of performance comparisons of various rate ⅔ LDPC codes using QPSK on Rayleigh fading communication channel.

FIG. 20 illustrates an embodiment 2000 of performance comparisons of various rate ⅔ LDPC codes using QPSK on Rayleigh fading communication channel. In this embodiment, the LDPC code (of FIG. 19) is compared to an LDPC code compatible with IEEE 802.11n (note: there is no rate ⅔ code in IEEE 802.15.3c). As can be seen, the LDPC code (of FIG. 19) outperforms the other code.

Figure 21:
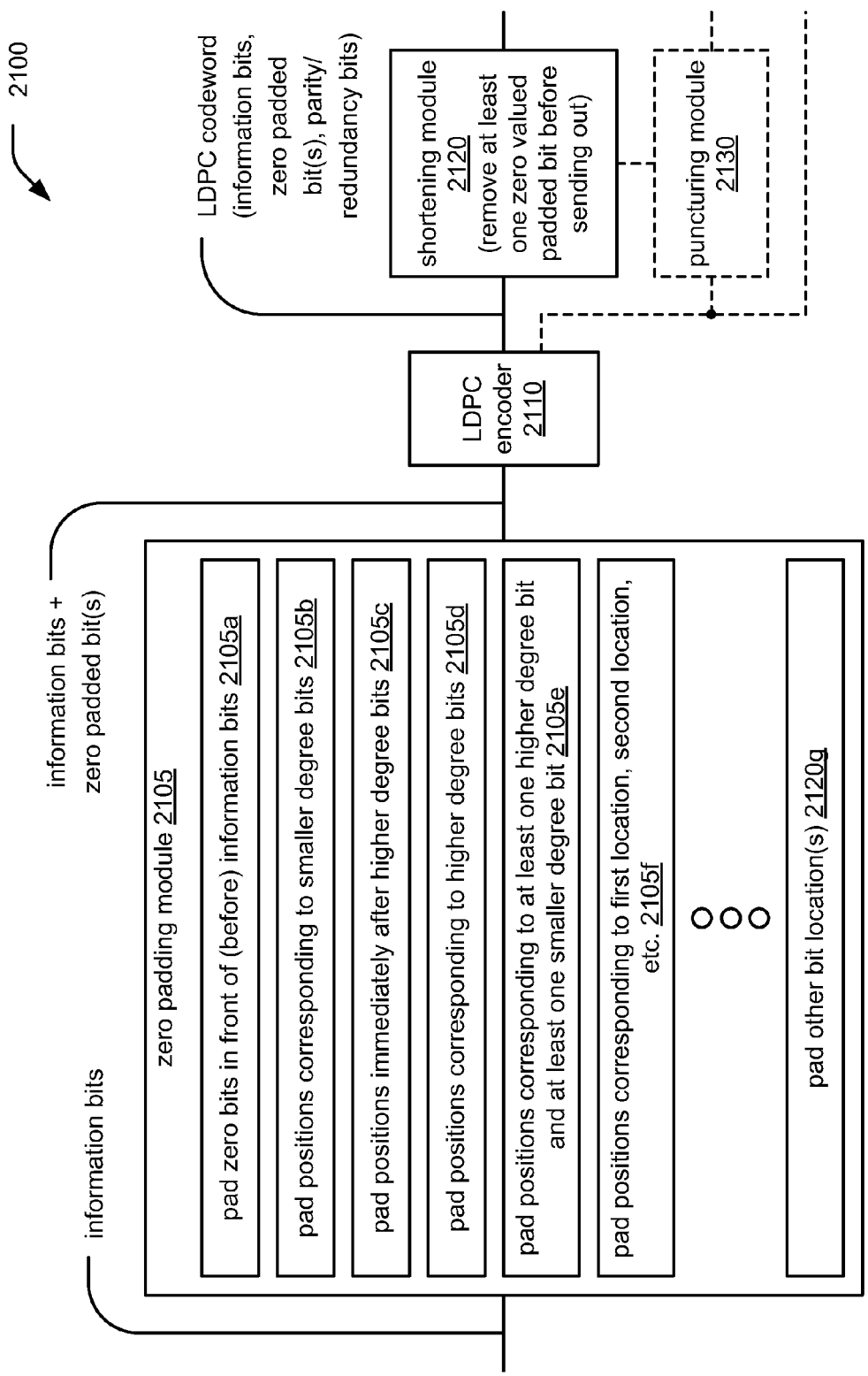
FIG. 21 illustrates an embodiment of LDPC encoding and shortening (and/or puncturing).

FIG. 21 illustrates an embodiment 2100 of LDPC encoding and shortening (and/or puncturing). Information bits are provided to a zero padding module 2105. The zero padding module 2105 pads at least one zero valued bit to or within the information bits before passing the information bits plus at least one zero padded bit to an LDPC encoder 2110 that performs LDPC encoding thereby generating an LDPC codeword that includes the information bits, at least one zero padded bit, and parity/redundancy bits in accordance with the LDPC code employed by the LDPC encoder 2110.

There are a variety of ways in which zero valued bits may be padded to the information bits. For example, zero bits may be padded in front of (or before) the information bits, as shown in block 2105a.

In another embodiment, zero bits may be padded in those bit locations corresponding to relatively smaller or lower degree bits (e.g., in accordance with the LDPC code employed by the LDPC encoder 2110), as shown in block 2105b.

In even another embodiment, zero bits may be padded in those bit locations immediately after the relatively higher degree bits (e.g., in accordance with the LDPC code employed by the LDPC encoder 2110), as shown in block 2105c.

In yet another embodiment, zero bits may be padded in those bit locations corresponding to relatively higher degree bits (e.g., in accordance with the LDPC code employed by the LDPC encoder 2110), as shown in block 2105d.

Other variations may be implemented including padding bit positions corresponding to at least one higher degree bit and at least one smaller degree bit, as shown in block 2105e.

Generally, the zero padding may alternatively perform padding of bit positions corresponding to a first location, a second location, etc., as shown in block 2105f.

The zero padding may pad as few as one bit or many bits in various embodiments. A designer has great latitude in selecting which of the bit positions are to be padded using zero values bits.

It is noted that the determination of which bits (i.e., bit positions) correspond to relatively higher degree bits and which bits (i.e., bit positions) correspond to relatively smaller or lower degree bits may be selected by a designer, adaptively determined based on the LDPC code being employed, or using some other means).

Moreover, the zero padding module 2105 may selectively perform different types of padding at different times. In some embodiments, a zero padding sequence may be employed so that the zero padding module 2105 performs first padding to a first sequence of information bits at a first time, and then performs second padding to a second sequence of information bits at a second time, and so on.

The information bits and at least one zero padded bit are then passed to the LDPC encoder 2110 that performs LDPC encoding thereby generating an LDPC codeword that includes the information bits, at least one zero padded bit, and parity/redundancy bits in accordance with the LDPC code employed by the LDPC encoder 2110. This LDPC codeword may then be passed to a shortening module 2120 that removes at least one of the zero padded bits from the LDPC codeword. This may involve removing all of the zero padded bits from the LDPC codeword in some embodiments. Alternatively, this may involve removing as few as one or any number of the zero padded bits from the LDPC codeword in other embodiments.

The shortened LDPC codeword may then be provided to a puncturing module 2130 that punctures at least one bit from the shortened LDPC codeword before it is passed out.

In even another embodiment, the LDPC codeword output from the LDPC encoder 2110 may be passed directly to the puncturing module 2130, or it may be passed out directly without being processed by the puncturing module 2130 and/or the shortening module 2120.

Figure 22:
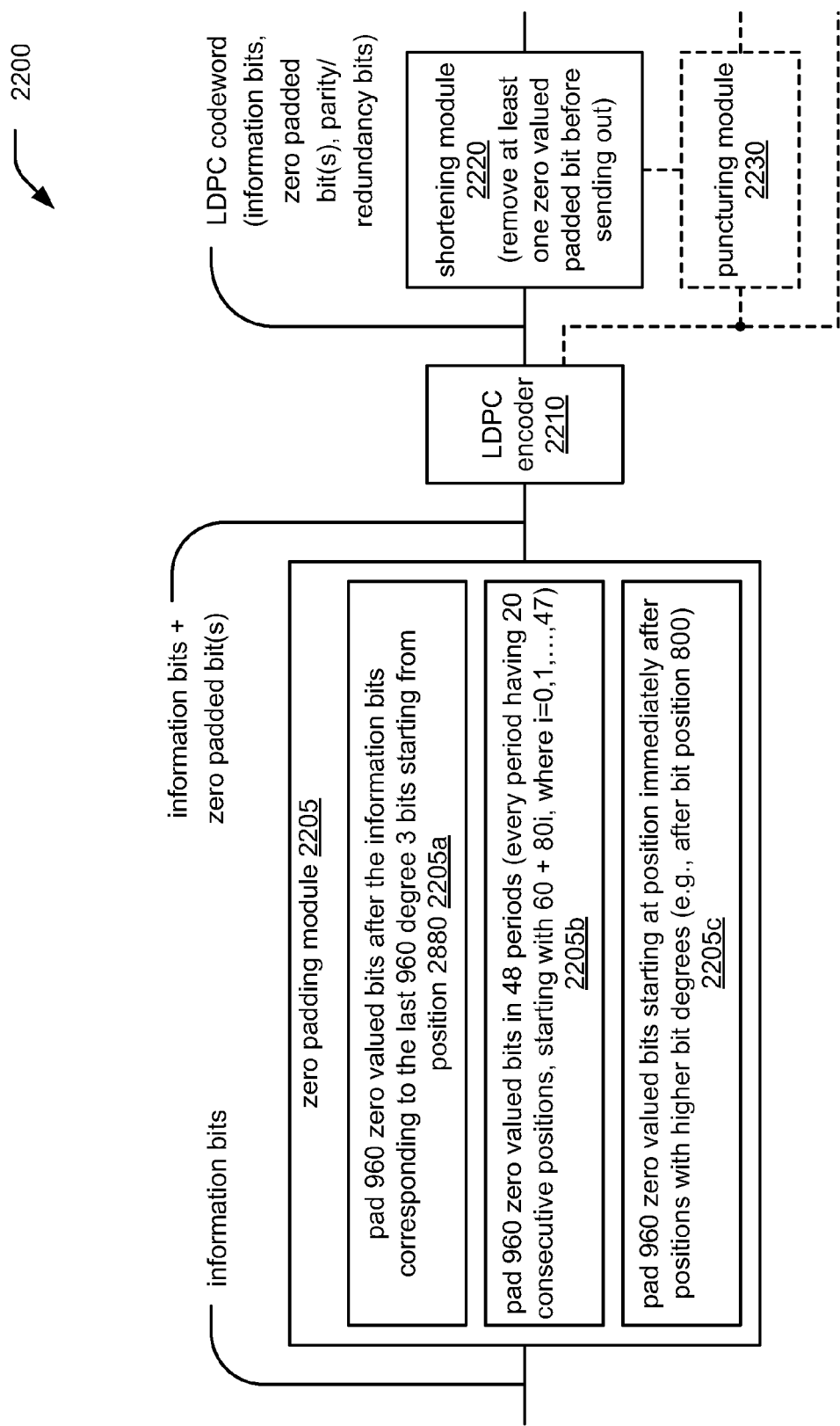
FIG. 22 illustrates another embodiment of LDPC encoding and shortening (and/or puncturing).

FIG. 22 illustrates another embodiment 2200 of LDPC encoding and shortening (and/or puncturing). This embodiment 2200 is somewhat different from the previous embodiment 2300. Information bits are provided to a zero padding module 2205. The zero padding module 2205 pads at least one zero valued bit to or within the information bits before passing the information bits plus at least one zero padded bit to an LDPC encoder 2210 that performs LDPC encoding thereby generating an LDPC codeword that includes the information bits, at least one zero padded bit, and parity/redundancy bits in accordance with the LDPC code employed by the LDPC encoder 2210.

In this embodiment 2200 as well, there are a variety of ways in which zero valued bits may be padded to the information bits. For example, 960 distinct zero valued bits may be padded after the information bits corresponding to the last 960 degree 3 bits starting from position 2880 in an information sequence that is to be encoded by the LDPC encoder, as shown in block 2205a.

Alternatively, 960 distinct zero valued bits may be padded in 48 separate periods such that each period having 20 consecutive positions starting with $60+80i$, where i varies from 0 to 47 (i.e., i=0, 1, ..., 47), as shown in block 2205b.

In even another embodiment, 960 distinct zero valued bits may be padded in those bit positions immediately after positions with relatively higher bit degrees (e.g., in those bit positions after 800 or some other value selected as corresponding to those bit positions immediately after positions with relatively higher bit degrees).

The zero padding may pad as few as one bit or many bits in various embodiments. A designer has great latitude in selecting which of the bit positions are to be padded using zero values bits.

It is noted that the determination of which bits (i.e., bit positions) correspond to relatively higher degree bits and which bits (i.e., bit positions) correspond to relatively smaller or lower degree bits may be selected by a designer, adaptively determined based on the LDPC code being employed, or using some other means).

Moreover, the zero padding module 2205 may selectively perform different types of padding at different times. In some embodiments, a zero padding sequence may be employed so that the zero padding module 2205 performs first padding to a first sequence of information bits at a first time, and then performs second padding to a second sequence of information bits at a second time, and so on.

The information bits and at least one zero padded bit are then passed to the LDPC encoder 2210 that performs LDPC encoding thereby generating an LDPC codeword that includes the information bits, at least one zero padded bit, and parity/redundancy bits in accordance with the LDPC code employed by the LDPC encoder 2210. This LDPC codeword may then be passed to a shortening module 2220 that removes at least one of the zero padded bits from the LDPC codeword. This may involve removing all of the zero padded bits from the LDPC codeword in some embodiments. Alternatively, this may involve removing as few as one or any number of the zero padded bits from the LDPC codeword in other embodiments.

The shortened LDPC codeword may then be provided to a puncturing module 2230 that punctures at least one bit from the shortened LDPC codeword before it is passed out.

In even another embodiment, the LDPC codeword output from the LDPC encoder 2210 may be passed directly to the puncturing module 2230, or it may be passed out directly without being processed by the puncturing module 2230 and/or the shortening module 2220.

Figure 23:
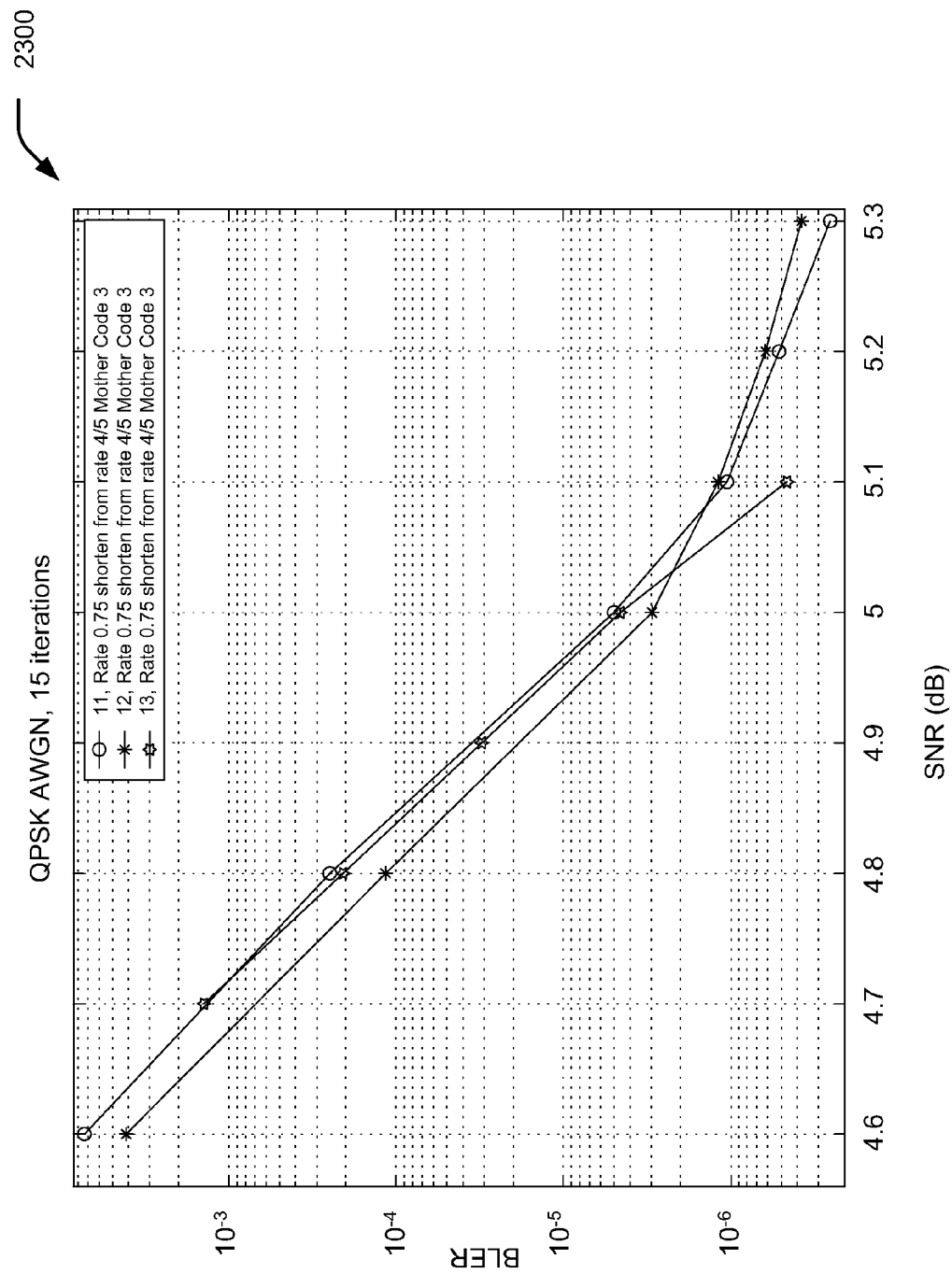
FIG. 23 illustrates an embodiment of performance comparisons of various rate ¾ LDPC codes (using the 3 shortening options of FIG. 22) using QPSK on Rayleigh fading communication channel.

FIG. 23 illustrates an embodiment 2300 of performance comparisons of various rate ¾ LDPC codes (using the 3 shortening options of FIG. 22) using QPSK on Rayleigh fading communication channel.

When comparing these three LDPC codes that employ shortening in accordance with variations of the blocks 2205a, 2205b, and 2205c of the FIG. 22 (which correspond to option 11 (block 2205a), option 12 (block 2205b), and option 13 (block 2205c) as depicted in FIG. 23).

In the performance of each of these options, 15 decoding iterations is performed.

As can be seen, each of these options provides a BLER of below approximately $1 \times 10^{-6}$ at a SNR of approximately 5.2 dB; and each provides a BLER of below approximately 6×10⁻⁶ at a SNR of approximately 5.0 dB.

Some additional embodiments of LDPC matrices having a form of H=[H₁H₂] is provided below. Because one of the LDPC matrices is so large, it is shown on 3 separate drawing sheets as H=[H₁ₐ H₁ᵦ H₂], but may still be viewed as having the form of H=[H₁H₂], since the two side by side matrices, H₁ₐ H₁ᵦ, form H₁.

FIG. 24 illustrates an embodiment 2400 of an LDPC matrix (according to Option 3) corresponding to an LDPC code having a rate of ½.

This LDPC matrix has a form of H=[H₁H₂], and the right hand side matrix (H₂) includes 21 sub-matrix columns. The left hand side matrix (H₁) includes 21 sub-matrix columns, and each sub-matrix therein that is a CSI sub-matrix is characterized by a shift-value, λ(S). For example, the top left hand sub-matrix has a value of 48, and is therefore a CSI sub-matrix with a shift-value of 48, λ(48). All of the sub-matrices depicted as a "–" are all zero-valued sub-matrices.

The block size of this LDPC code is 4032, and the LDPC code encodes 2016 information bits and is thereby a (4032, 2016) code. The sub-matrices are all size 96 by 96 (i.e., 96 rows and 96 columns each).

This corresponding LDPC code is a systematic code, and LDPC encoding can be employed using this LDPC matrix by simply performing back substitution.

FIG. 25 illustrates an embodiment 2500 of an LDPC matrix (according to Option 3) corresponding to an LDPC code having a rate of ⅚.

This LDPC matrix has a form of H=[H₁H₂], and the right hand side matrix (H₂) includes 6 sub-matrix columns. The left hand side matrix (H₁) includes 36 sub-matrix columns, and each sub-matrix therein that is a CSI sub-matrix is characterized by a shift-value, λ(S). For example, the top left hand sub-matrix has a value of 82, and is therefore a CSI sub-matrix with a shift-value of 82, λ(82). As also mentioned herein, a CSI sub-matrix with a shift-value of 0, λ(0), is an identity sub-matrix (e.g., such as those depicted in the right hand side matrix (H₂)). All of the sub-matrices depicted as a "–" are all zero-valued sub-matrices.

The block size of this LDPC code is 4032, and the LDPC code encodes 3360 information bits and is thereby a (4032, 3360) code. The sub-matrices are all size 96 by 96 (i.e., 96 rows and 96 columns each).

This corresponding LDPC code is a systematic code, and LDPC encoding can be employed using this LDPC matrix by simply performing back substitution.

FIG. 26, FIG. 27A/FIG. 27B, and FIG. 28 illustrate an embodiment of an LDPC matrix (according to Option 3) corresponding to an LDPC code having a rate of ⅘ (of an LDPC matrix having form, H=[H₁ₐ H₁ᵦ H₂], FIG. 26 shows H₁ as indicated by reference numeral 2600, FIG. 27A/FIG. 27B together show H₁ᵦ (FIG. 27A via reference numeral 2700b shows right hand side thereof H₁ᵦ,₂), and FIG. 28 shows H₂ as indicated by reference numeral 2800).

This LDPC matrix has a form of H=[H₁ₐ H₁ᵦ H₂], and the right hand side matrix (H₂) includes 12 sub-matrix columns. The left hand side matrix (H₁) includes 48 sub-matrix columns, and each sub-matrix therein that is a CSI sub-matrix is characterized by a shift-value, λ(S). For example, the top left hand sub-matrix is an all zero-valued sub-matrix, and the sub-matrix to the right of that sub-matrix has a value of 3, and is therefore a CSI sub-matrix with a shift-value of 3, λ(3). Again, all of the sub-matrices depicted as a "–" are all zero-valued sub-matrices.

The block size of this LDPC code is 4800, and the LDPC code encodes 3840 information bits and is thereby a (4800, 3840) code. The sub-matrices are all size 80 by 80 (i.e., 80 rows and 80 columns each).

This corresponding LDPC code is a systematic code, and LDPC encoding can be employed using this LDPC matrix by simply performing back substitution.

FIG. 29 illustrates an alternative embodiment 2900 of an LDPC matrix (according to Option 3) corresponding to an LDPC code having a rate of ½.

This LDPC matrix has a form of H=[H₁H₂], and it includes 12 sub-matrix rows. The right hand side matrix (H₂) includes 12 sub-matrix columns. The left hand side matrix (H₁) includes 12 sub-matrix columns, and each sub-matrix therein that is a CSI sub-matrix is characterized by a shift-value, λ(S). For example, the top left hand sub-matrix has a value of 17, and is therefore a CSI sub-matrix with a shift-value of 17, λ(17). As also mentioned herein, a CSI sub-matrix with a shift-value of 0, λ(0), is an identity sub-matrix (e.g., such as those depicted in the right hand side matrix (H₂)). All of the sub-matrices depicted as a "–" are all zero-valued sub-matrices.

The block size of this LDPC code is 672, and the LDPC code encodes 336 information bits and is thereby a (672,336) code. The sub-matrices are all size 28 by 28 (i.e., 28 rows and 28 columns each).

As with other embodiments described herein, the corresponding LDPC code of this diagram is a systematic code, and LDPC encoding can be employed using this LDPC matrix by simply performing back substitution.

FIG. 30 illustrates an alternative embodiment 3000 of an LDPC matrix (according to Option 3) corresponding to an LDPC code having a rate of ½.

This LDPC matrix has a form of H=[H₁H₂], and it includes 12 sub-matrix rows. The right hand side matrix (H₂) includes 12 sub-matrix columns. The left hand side matrix (H₁) includes 12 sub-matrix columns, and each sub-matrix therein that is a CSI sub-matrix is characterized by a shift-value, λ(S). For example, the top left hand sub-matrix has a value of 21, and is therefore a CSI sub-matrix with a shift-value of 21, λ(21). As also mentioned herein, a CSI sub-matrix with a shift-value of 0, λ(0), is an identity sub-matrix (e.g., such as those depicted in the right hand side matrix (H₂)). All of the sub-matrices depicted as a "–" are all zero-valued sub-matrices.

The block size of this LDPC code is 672, and the LDPC code encodes 336 information bits and is thereby a (672,336) code. The sub-matrices are all size 28 by 28 (i.e., 28 rows and 28 columns each).

As with other embodiments described herein, the corresponding LDPC code of this diagram is a systematic code, and LDPC encoding can be employed using this LDPC matrix by simply performing back substitution.

FIG. 31 illustrates an alternative embodiment 3100 of an LDPC matrix (according to Option 3) corresponding to an LDPC code having a rate of ¾.

This LDPC matrix has a form of H=[H₁H₂], and it includes 6 sub-matrix rows. The right hand side matrix (H₂) includes 6 sub-matrix columns. The left hand side matrix (H₁) includes 18 sub-matrix columns, and each sub-matrix therein that is a CSI sub-matrix is characterized by a shift-value, λ(S). For example, the top left hand sub-matrix has a value of 27, and is therefore a CSI sub-matrix with a shift-value of 27, λ(27). As also mentioned herein, a CSI sub-matrix with a shift-value of 0, λ(0), is an identity sub-matrix (e.g., such as those depicted in the right hand side matrix (H₂)). All of the sub-matrices depicted as a "–" are all zero-valued sub-matrices.

The block size of this LDPC code is 672, and the LDPC code encodes 504 information bits and is thereby a (672,504) code. The sub-matrices are all size 28 by 28 (i.e., 28 rows and 28 columns each).

As with other embodiments described herein, the corresponding LDPC code of this diagram is a systematic code, and LDPC encoding can be employed using this LDPC matrix by simply performing back substitution.

FIG. 32 illustrates an alternative embodiment 3200 of an LDPC matrix (according to Option 3) corresponding to an LDPC code having a rate of 5/6.

This LDPC matrix has a form of H=[H$_1$H$_2$], and it includes 4 sub-matrix rows. The right hand side matrix (H$_2$) includes 4 sub-matrix columns. The left hand side matrix (H$_1$) includes 20 sub-matrix columns, and each sub-matrix therein that is a CSI sub-matrix is characterized by a shift-value, $\lambda(S)$. For example, the top left hand sub-matrix has a value of 27, and is therefore a CSI sub-matrix with a shift-value of 27, $\lambda(27)$. As also mentioned herein, a CSI sub-matrix with a shift-value of 0, $\lambda(0)$, is an identity sub-matrix (e.g., such as those depicted in the right hand side matrix (H$_2$)). All of the sub-matrices depicted as a "–" are all zero-valued sub-matrices.

The block size of this LDPC code is 672, and the LDPC code encodes 560 information bits and is thereby a (672,560) code. The sub-matrices are all size 28 by 28 (i.e., 28 rows and 28 columns each).

As with other embodiments described herein, the corresponding LDPC code of this diagram is a systematic code, and LDPC encoding can be employed using this LDPC matrix by simply performing back substitution.

FIG. 33 illustrates an alternative embodiment 3300 of an LDPC matrix (according to Option 3) corresponding to an LDPC code having a rate of 5/6.

This LDPC matrix has a form of H=[H$_1$H$_2$], and it includes 4 sub-matrix rows. The right hand side matrix (H$_2$) includes 4 sub-matrix columns. The left hand side matrix (H$_1$) includes 20 sub-matrix columns, and each sub-matrix therein that is a CSI sub-matrix is characterized by a shift-value, $\lambda(S)$. For example, the top left hand sub-matrix has a value of 6, and is therefore a CSI sub-matrix with a shift-value of 6, $\lambda(6)$. As also mentioned herein, a CSI sub-matrix with a shift-value of 0, $\lambda(0)$, is an identity sub-matrix (e.g., such as those depicted in the right hand side matrix (H$_2$)). All of the sub-matrices depicted as a "–" are all zero-valued sub-matrices.

The block size of this LDPC code is 672, and the LDPC code encodes 560 information bits and is thereby a (672,560) code. The sub-matrices are all size 28 by 28 (i.e., 28 rows and 28 columns each).

As with other embodiments described herein, the corresponding LDPC code of this diagram is a systematic code, and LDPC encoding can be employed using this LDPC matrix by simply performing back substitution.

Figure 34:
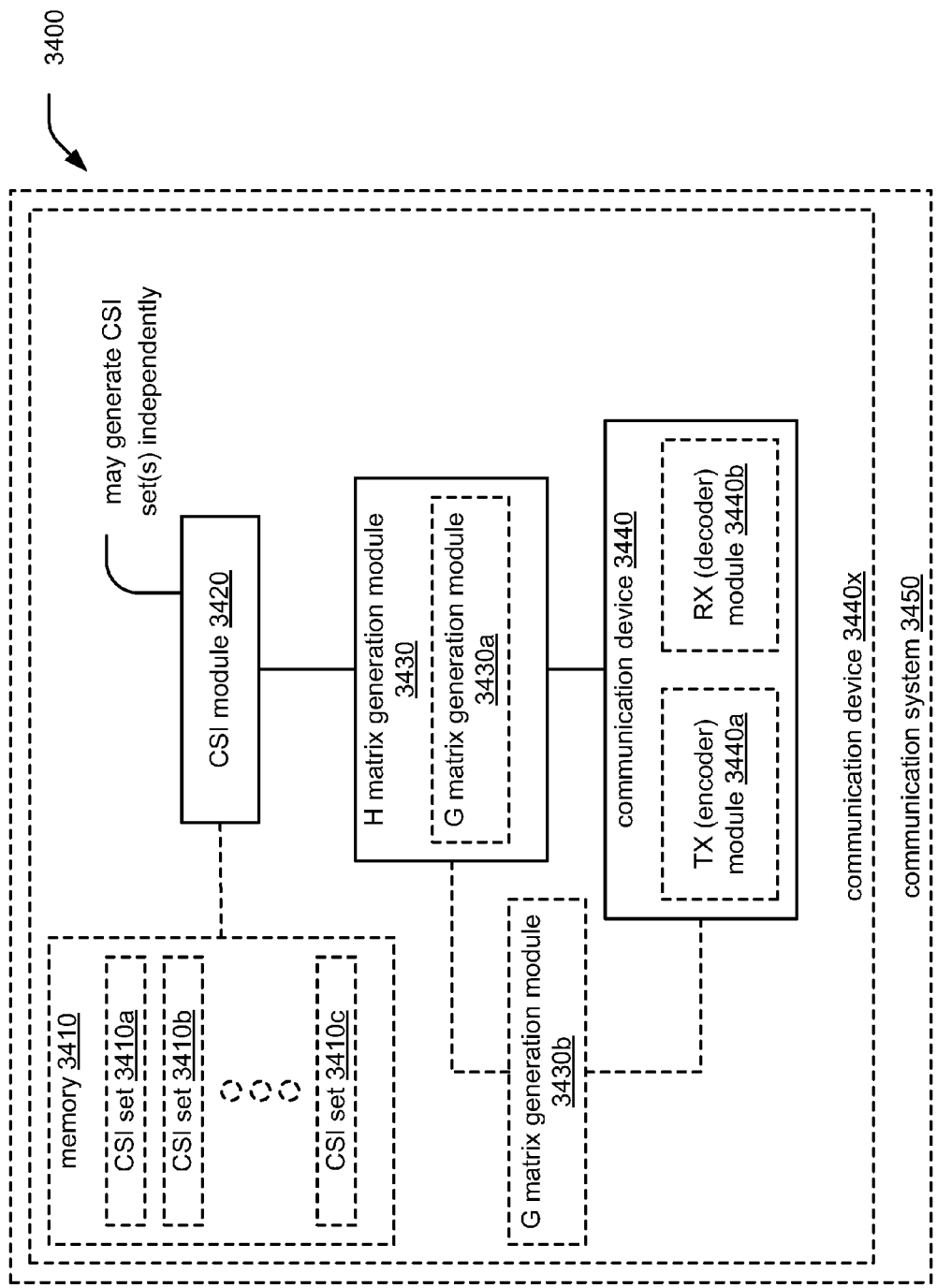
FIG. 34 illustrates an alternative embodiment of an apparatus that is operable to perform LDPC code construction and/or LDPC encoding and/or decoding processing.

FIG. 34 illustrates an alternative embodiment 3400 of an apparatus that is operable to perform LDPC code construction and/or LDPC encoding and/or decoding processing. A CSI (Cyclic Shifted Identity) module 3420 operates to generate one or more sets of CSI values for cyclic shifting identity sub-matrices of one or more sub-matrix sizes. In some embodiments, the CSI module 3420 retrieves one or more sets of CSI values from a memory 3410 that is coupled to the CSI module 3420. For example, the memory 3420 can store one or more different CSI sets (shown as CSI set 3410a, CSI set 3410b, ... and up to CSI set 3410c). The CSI module 3420 can select one or more of the CSI sets 3410a-3410c as desired. Regardless of the manner by which the CSI module 3420 determines the one or more of the CSI sets, the CSI module 3420 then passes the one or more of the CSI sets to an LDPC matrix (H) generation module 3430, and the LDPC matrix (H) generation module 3430 then generates an LDPC matrix (H) corresponding to that particular LDPC code.

As mentioned above, it is noted that once an LDPC matrix (H) is known, a corresponding LDPC generator matrix (G) can be determined as well. An LDPC generator matrix (G) is that matrix by which information bits (e.g., an input bit group, tuple, stream, etc.) is multiplied to generate an LDPC codeword corresponding to that particular LDPC code. In some embodiments, an integrated LDPC generator matrix (G) module 3430a is included within the LDPC matrix (H) generation module 3430, so that such an LDPC generator matrix (G) can also be generated. In other embodiments, a separate LDPC generator matrix (G) module 3430b is coupled to the LDPC matrix (H) generation module 3430 that constructs the LDPC generator matrix (G).

A communication device 3440 receives one or both of the constructed LDPC matrix (H) and the LDPC generator matrix (G). The communication device 3440 may include a transmitter (TX) (encoder) module 3440a and a receiver (RX) (decoder) module 3440b.

The TX (encoder) module 3440a is operable to perform all necessary encoding in accordance with the LDPC generator matrix (G), as well as any appropriate transmitter related functions (e.g., digital to analog conversion, filtering (analog or digital), scaling (e.g., gain or attenuation), etc.) to generate a continuous time signal capable of being launched into a communication channel of interest.

The RX (decoder) module 3440b is operable to perform all necessary encoding in accordance with the LDPC matrix (H), as well as any appropriate receiver related functions (e.g., analog to digital conversion (sampling), filtering (analog or digital), scaling (e.g., gain or attenuation), equalization, etc.) to process a received continuous time and to make estimates of information bits encoded therein.

It is noted that all modules, memory, etc. depicted in this diagram may alternatively be implemented in a communication device 3440x. The communication device 3440 or the communication device 3440x may be implemented within a communication system 3450 which may, in some embodiments, be any such communication system type as depicted and described with reference to FIG. 1.

Figure 35:
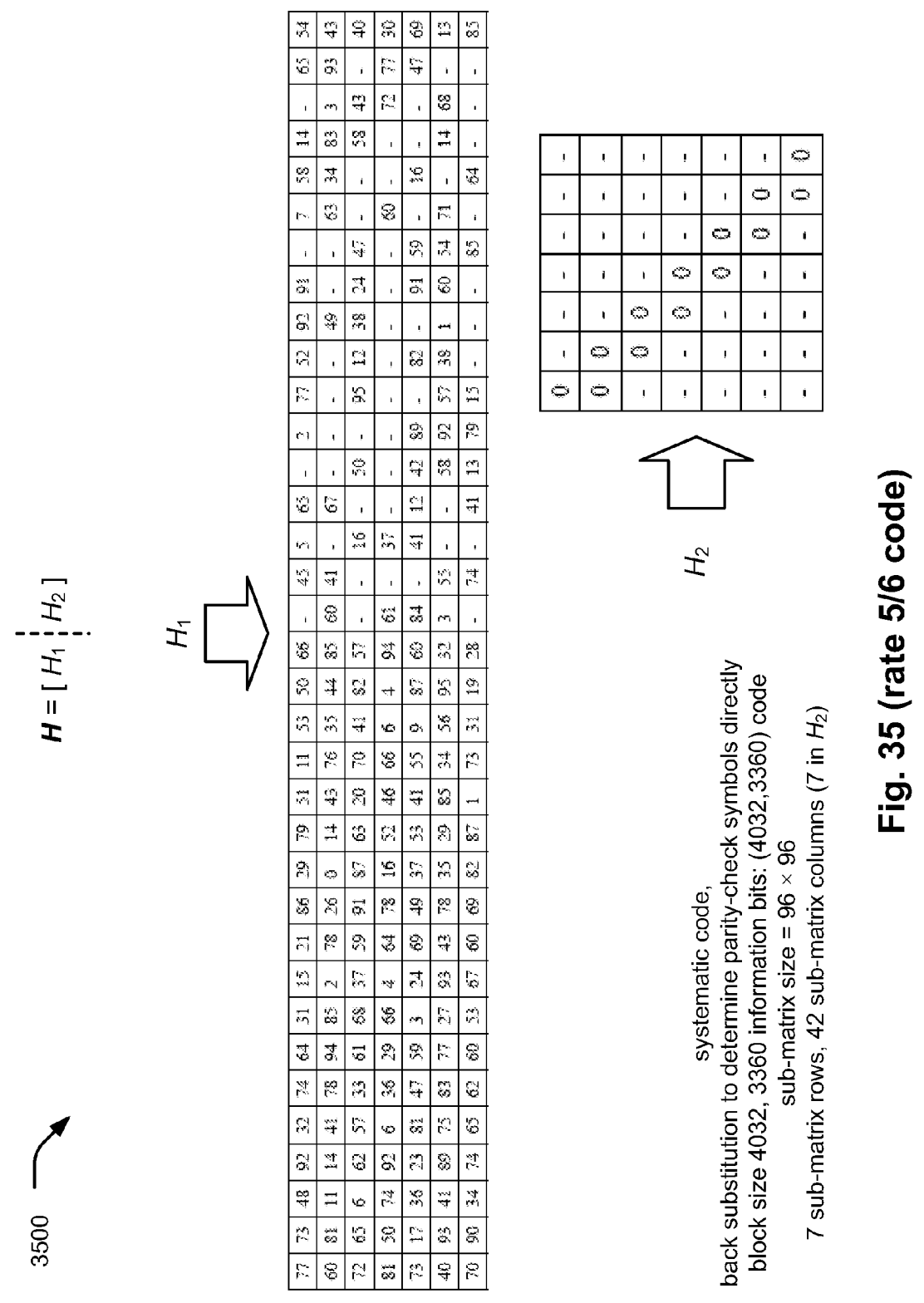

FIG. 35 illustrates an alternative embodiment 3500 of an LDPC matrix (according to Option 3) corresponding to an LDPC code having a rate of 5/6.

This LDPC matrix has a form of H=[H$_1$H$_2$], and it includes 7 sub-matrix rows. The right hand side matrix (H$_2$) includes 7 sub-matrix columns. The left hand side matrix (H$_1$) includes 35 sub-matrix columns, and each sub-matrix therein that is a CSI sub-matrix is characterized by a shift-value, $\lambda(S)$. For example, the top left hand sub-matrix has a value of 77, and is therefore a CSI sub-matrix with a shift-value of 77, $\lambda(77)$. As also mentioned herein, a CSI sub-matrix with a shift-value of 0, $\lambda(0)$, is an identity sub-matrix (e.g., such as those depicted in the right hand side matrix (H$_2$)). All of the sub-matrices depicted as a "–" are all zero-valued sub-matrices.

The block size of this LDPC code is 4032, and the LDPC code encodes 3360 information bits and is thereby a (4032, 3360) code. The sub-matrices are all size 96 by 96 (i.e., 96 rows and 96 columns each).

As with other embodiments described herein, the corresponding LDPC code of this diagram is a systematic code, and LDPC encoding can be employed using this LDPC matrix by simply performing back substitution.

FIG. 36 illustrates an alternative embodiment 3600 of an LDPC matrix (according to Option 3) corresponding to an LDPC code having a rate of 0.79 or approximately 4/5.

This LDPC matrix has a form of $H=[H_1 H_2]$, and it includes 9 sub-matrix rows. The right hand side matrix ($H_2$) includes 9 sub-matrix columns. The left hand side matrix ($H_1$) includes 33 sub-matrix columns, and each sub-matrix therein that is a CSI sub-matrix is characterized by a shift-value, $\lambda(S)$. For example, the top left hand sub-matrix has a value of 22, and is therefore a CSI sub-matrix with a shift-value of 22, $\lambda(22)$. As also mentioned herein, a CSI sub-matrix with a shift-value of 0, $\lambda(0)$, is an identity sub-matrix (e.g., such as those depicted in the right hand side matrix ($H_2$)). All of the sub-matrices depicted as a "–" are all zero-valued sub-matrices.

The block size of this LDPC code is 4032, and the LDPC code encodes 3168 information bits and is thereby a (4032, 3169) code. The sub-matrices are all size 96 by 96 (i.e., 96 rows and 96 columns each).

As with other embodiments described herein, the corresponding LDPC code of this diagram is a systematic code, and LDPC encoding can be employed using this LDPC matrix by simply performing back substitution.

FIG. 37 and FIG. 38 illustrate an embodiment of an LDPC matrix (according to Option 3) corresponding to an LDPC code having a rate of 5/6 (of an LDPC matrix having form, $H=[H_{1a} \ H_{1b} \ H_2]$, FIG. 37 shows $H_1$, and FIG. 38 shows $H_{1b}$ and $H_2$).

This LDPC matrix has a form of $H=[H_{1a} \ H_{1b} \ H_2]$, and it includes 10 sub-matrix rows. The right hand side matrix ($H_2$) includes 10 sub-matrix columns. The left hand side matrix ($H_1$) includes 50 sub-matrix columns (shown as $H_1$ having 30 sub-matrix columns as shown in FIG. 37, and $H_{1b}$ having 20 sub-matrix columns as shown in FIG. 38), and each sub-matrix therein that is a CSI sub-matrix is characterized by a shift-value, $\lambda(S)$. For example, the top left hand sub-matrix has a value of 12, and is therefore a CSI sub-matrix with a shift-value of 12, $\lambda(12)$. As also mentioned herein, a CSI sub-matrix with a shift-value of 0, $\lambda(0)$, is an identity sub-matrix (e.g., such as those depicted in the right hand side matrix ($H_2$)). All of the sub-matrices depicted as a "–" are all zero-valued sub-matrices.

The block size of this LDPC code is 4800, and the LDPC code encodes 4000 information bits and is thereby a (4800, 4000) code. The sub-matrices are all size 80 by 80 (i.e., 80 rows and 80 columns each).

FIG. 39 illustrates an embodiment 3900 of LDPC encoding and puncturing.

In this embodiment, an LDPC encoder 3910 encodes a plurality of information bits (shown as ($b_1, b_2, \ldots, b_k$)) and generates an LDPC codeword that includes a plurality of information bits and a plurality of parity bits (shown as $c=(b_1, b_2, \ldots, b_k, p_1, p_2, \ldots, p_{N-k})$), such that ($p_1, p_2, \ldots, p_{N-k}$) are the parity bits. The particular generator matrix employed by the LDPC encoder 3910 may correspond to the rate 5/6 LDPC matrix of FIG. 35, as indicated by reference numeral 3910a.

In one embodiment, a puncturing module 3920 punctures at least one of an information bit and a parity bit from the LDPC codeword (as shown in the block 1620a) thereby generating a punctured LDPC codeword (e.g., shown as $c'=(b_1, b_2, \ldots, X, \ldots, b_k, p_1, p_2, \ldots, X, \ldots, p_{N-k})$).

In an alternative embodiment, a puncturing module 3920 punctures the output of the encoded sequence (i.e., from the LDPC encoder 3910) in two separate periods. The puncturing module 3920 punctures the first 100 consecutive information bits of the LDPC codeword starting for position corresponding to the column 0 (e.g., the first column) of the LDPC matrix, as indicated by reference numeral 3920a. In addition, the puncturing module 3920 punctures the first 395 consecutive redundancy bits of the LDPC codeword starting for position corresponding to the column 3360 (e.g., the first column corresponding to the redundancy bits) of the LDPC matrix, as indicated by reference numeral 3920b.

The puncturing module 3920 then outputs a punctured LDPC codeword (e.g., shown as $c'=(b_1, b_2, \ldots, X, \ldots, b_k, p_1, p_2, \ldots, X, \ldots, p_{N-k})$). The punctured LDPC codeword will then include only those remaining 3537 bits (e.g., 4032–495=3537 bits). These are the bits that undergo any appropriate processing (e.g., digital to analog conversion, modulation, frequency adjustment, filtering etc.) to generate a continuous time signal to be transmitted via a desired communication channel.

In an LDPC decoder that decodes such an LDPC code signal as generated in this embodiment 3900 would use the log likelihood ratios (LLRs) corresponding to the 3537 bits to estimate the originally encoded 3360 information bits. Therefore, the final code rate of such a system is 3360/3537=0.95 (i.e., a rate 95% code).

As stated above with respect to other embodiments, examples of communication systems in which this LDPC encoding and puncturing may be implemented include any embodiment as described herein including those depicted in FIG. 1.

As with other embodiments described herein, the corresponding LDPC code of this diagram is a systematic code, and LDPC encoding can be employed using this LDPC matrix by simply performing back substitution.

FIG. 40 illustrates another embodiment 4000 of LDPC encoding and shortening (and/or puncturing). In this embodiment 4000, 2688 information bits are provided to a zero padding module 4005. The zero padding module 4005 pads 672 zero valued bits before the 2688 information bits (e.g., in a consecutive period of 672 zero valued bits), as shown by reference numeral 4005a, and then passes the formed 3360 bit sequence to an LDPC encoder 4010.

The particular generator matrix employed by the LDPC encoder 4010 may correspond to the rate 5/6 LDPC matrix of FIG. 35, as indicated by reference numeral 4010a.

Again, these 2688 information bits and these 672 zero valued padded bits are then passed to the LDPC encoder 4010 that performs LDPC encoding thereby generating an LDPC codeword that includes the 672 zero valued padded bits, the 2688 information bits, and parity/redundancy bits in accordance with the LDPC code employed by the LDPC encoder 4010. This LDPC codeword may then be passed to a shortening module 4020 that removes the first 672 zero valued padded bits from the LDPC codeword and outputs all of the remaining bits of the LDPC codeword.

The shortened LDPC codeword may then be provided to a puncturing module 4030 that punctures at least one bit from the shortened LDPC codeword before it is passed out.

In even another embodiment, the LDPC codeword output from the LDPC encoder 4010 may be passed directly to the puncturing module 4030, or it may be passed out directly without being processed by the puncturing module 4030 and/or the shortening module 4020.

The final code rate of the embodiment 4000 is 4/5 (or 0.8). This may be calculated as (3360–672)/(4032–672)=4/5=0.8 (i.e., a rate 80% code).

FIG. 41 illustrates another embodiment of LDPC encoding and shortening (and/or puncturing).

In this embodiment 4100, 2688 information bits are provided to a zero padding module 4105. The zero padding module 4105 firstly pads 480 zero valued bits before the 2688 information bits (e.g., in a consecutive period of 672 zero valued bits) thereby generating a 3168 bit sequence, as shown by reference numeral 4105a. The zero padding module 4105 secondly pads 192 zero valued bits after the formed 3168 bit sequence, as shown by reference numeral 4105*b*.

The particular generator matrix employed by the LDPC encoder 4110 may correspond to the rate ⅚ LDPC matrix of FIG. 35, as indicated by reference numeral 4110*a*.

Therefore, these 2688 information bits and these 672 zero valued padded bits (e.g., with 480 of them being before the 2688 information bits, and 672 of them being after the 2688 information bits) are then passed to the LDPC encoder 4110 that performs LDPC encoding thereby generating an LDPC codeword that includes the 672 zero valued padded bits, the 2688 information bits, and parity/redundancy bits in accordance with the LDPC code employed by the LDPC encoder 4110. This LDPC codeword may then be passed to a shortening module 4120 that removes the first 480 zero valued padded bits and the last 192 zero valued padded bits from the LDPC codeword and outputs all of the remaining bits of the LDPC codeword.

The shortened LDPC codeword may then be provided to a puncturing module 4130 that punctures at least one bit from the shortened LDPC codeword before it is passed out.

In even another embodiment, the LDPC codeword output from the LDPC encoder 4110 may be passed directly to the puncturing module 4130, or it may be passed out directly without being processed by the puncturing module 4130 and/or the shortening module 4120.

The final code rate of the embodiment 4100 is ⅘ (or 0.8). This may be calculated as $(3360-672)/(4032-672)=⅘=0.8$ (i.e., a rate 80% code).

FIG. 42 and FIG. 43 illustrate an alternative embodiment, shown by reference numerals 4200 and 4300, of an LDPC matrix (according to a variation of Option 3) corresponding to an LDPC code having a rate of 0.8966 (of an LDPC matrix having form, $H=[H_{1a} H_{1b} H_2]$, FIG. 42 shows $H_1$, and FIG. 43 shows $H_{1b}$ and $H_2$).

This LDPC matrix has a form of $H=[H_{1a} H_{1b} H_2]$, and it includes 6 sub-matrix rows. The right hand side matrix ($H_2$) includes 6 sub-matrix columns. The left hand side matrix ($H_1$) includes 52 sub-matrix columns (shown as $H_{1a}$ having 26 sub-matrix columns as shown in FIG. 42, and $H_{1b}$ having 26 sub-matrix columns as shown in FIG. 43), and each sub-matrix therein that is a CSI sub-matrix is characterized by a shift-value, $\lambda(S)$. For example, the top left hand sub-matrix has a value of 65, and is therefore a CSI sub-matrix with a shift-value of 65, $\lambda(65)$. As also mentioned herein, a CSI sub-matrix with a shift-value of 0, $\lambda(0)$, is an identity sub-matrix. All of the sub-matrices depicted as a "–" are all zero-valued sub-matrices.

This is a slight variation of the Option 3 as presented herein, in that those non-zero valued sub-matrices in the right hand side matrix ($H_2$) are not necessarily identity sub-matrices. For example, the lower right hand sub-matrix in the right hand side matrix ($H_2$) has a value of 77, and is therefore a CSI sub-matrix with a shift-value of 77, $\lambda(77)$. In contrast to other embodiments presented herein in which the right hand side matrix ($H_2$) includes only identity sub-matrices (i.e., CSI sub-matrices with a shift-value of 0, $\lambda(0)$) or all zero-valued sub-matrices (i.e., depicted as a "–"), the right hand side matrix ($H_2$) of this embodiment includes CSI sub-matrices that are not necessarily identity sub-matrices. As can be seen, however, the locations of the non-zero valued sub-matrices in the right hand side matrix ($H_2$) of this embodiment correspond to the locations of the non-zero valued sub-matrices in the right hand side matrix ($H_2$) in accordance with Option 3 as presented herein.

The block size of this LDPC code is 4640, and the LDPC code encodes 4160 information bits and is thereby a (4640, 4160) code. The sub-matrices are all size 80 by 80 (i.e., 80 rows and 80 columns each).

FIG. 44 and FIG. 45 illustrate an alternative embodiment, shown by reference numerals 4400 and 4500, of an LDPC matrix (according to a variation of Option 3) corresponding to an LDPC code having a rate of 0.8525 (of an LDPC matrix having form, $H=[H_{1a} H_{1b} H_2]$, FIG. 44 shows $H_1$, and FIG. 45 shows $H_{1b}$ and $H_2$).

This LDPC matrix has a form of $H=[H_{1a} H_{1b} H_2]$, and it includes 9 sub-matrix rows. The right hand side matrix ($H_2$) includes 9 sub-matrix columns. The left hand side matrix ($H_1$) includes 52 sub-matrix columns (shown as $H_{1a}$ having 26 sub-matrix columns as shown in FIG. 44, and $H_{1b}$ having 26 sub-matrix columns as shown in FIG. 45), and each sub-matrix therein that is a CSI sub-matrix is characterized by a shift-value, $\lambda(S)$. For example, the top left hand sub-matrix has a value of 78, and is therefore a CSI sub-matrix with a shift-value of 78, $\lambda(78)$. As also mentioned herein, a CSI sub-matrix with a shift-value of 0, $\lambda(0)$, is an identity sub-matrix. All of the sub-matrices depicted as a "–" are all zero-valued sub-matrices.

This embodiment is also a slight variation of the Option 3 as presented herein, in that those non-zero valued sub-matrices in the right hand side matrix ($H_2$) are not necessarily identity sub-matrices. For example, the lower right hand sub-matrix in the right hand side matrix ($H_2$) has a value of 58, and is therefore a CSI sub-matrix with a shift-value of 58, $\lambda(58)$. In contrast to other embodiments presented herein in which the right hand side matrix ($H_2$) includes only identity sub-matrices (i.e., CSI sub-matrices with a shift-value of 0, $\lambda(0)$) or all zero-valued sub-matrices (i.e., depicted as a "–"), the right hand side matrix ($H_2$) of this embodiment includes CSI sub-matrices that are not necessarily identity sub-matrices. As can be seen, however, the locations of the non-zero valued sub-matrices in the right hand side matrix ($H_2$) of this embodiment correspond to the locations of the non-zero valued sub-matrices in the right hand side matrix ($H_2$) in accordance with Option 3 as presented herein.

The block size of this LDPC code is 4880, and the LDPC code encodes 4160 information bits and is thereby a (4880, 4160) code. The sub-matrices are all size 80 by 80 (i.e., 80 rows and 80 columns each).

FIG. 46 illustrate an alternative embodiment 4600 of an LDPC matrix (according to a variation of Option 3) corresponding to an LDPC code having a rate of ⅛ or 0.125 (of an LDPC matrix having form, $H=[H_1 H_2]$).

This LDPC matrix has a form of $H=[H_1 H_2]$, and it includes 14 sub-matrix rows and 16 sub-matrix columns. The right hand side matrix ($H_2$) includes 14 sub-matrix columns. The left hand side matrix ($H_1$) includes 2 sub-matrix columns, and each sub-matrix therein that is a CSI sub-matrix is characterized by a shift-value, $\lambda(S)$. For example, the top left hand sub-matrix has a value of 15, and is therefore a CSI sub-matrix with a shift-value of 15, $\lambda(15)$. As also mentioned herein, a CSI sub-matrix with a shift-value of 0, $\lambda(0)$, is an identity sub-matrix. All of the sub-matrices depicted as a "–" are all zero-valued sub-matrices.

This embodiment is also a slight variation of the Option 3 as presented herein, in that those non-zero valued sub-matrices in the right hand side matrix ($H_2$) are not necessarily identity sub-matrices. For example, the lower right hand sub-matrix in the right hand side matrix ($H_2$) has a value of 4, and is therefore a CSI sub-matrix with a shift-value of 4, $\lambda(4)$. In contrast to other embodiments presented herein in which the right hand side matrix ($H_2$) includes only identity sub-matrices (i.e., CSI sub-matrices with a shift-value of 0, λ(0)) or all zero-valued sub-matrices (i.e., depicted as a "–"), the right hand side matrix ($H_2$) of this embodiment includes CSI sub-matrices that are not necessarily identity sub-matrices. As can be seen, however, the locations of the non-zero valued sub-matrices in the right hand side matrix ($H_2$) of this embodiment correspond to the locations of the non-zero valued sub-matrices in the right hand side matrix ($H_2$) in accordance with Option 3 as presented herein.

In addition, the right hand side matrix ($H_2$) (i.e., below the diagonal running from upper left to lower right) also includes additional non-zero valued sub-matrices. For example, the sub-matrix located in the $11^{th}$ row and $1^{st}$ column of the right hand sub-matrix ($H_2$) has a value of 27, and is therefore a CSI sub-matrix with a shift-value of 27, λ(27). Other non-zero valued sub-matrices are located in right hand side matrix ($H_2$) in locations other than those particularly employed in accordance with Option 3 as presented herein.

The block size of this LDPC code is 488, and the LDPC code encodes 56 information bits and is thereby a (488,56) code. The sub-matrices are all size 28 by 28 (i.e., 28 rows and 28 columns each).

This LDPC code can be implemented in a 4-cycle layer decoding approach in accordance with the color code assignments depicted in the LDPC matrix (e.g., white, yellow, green and orange).

Figure 47:
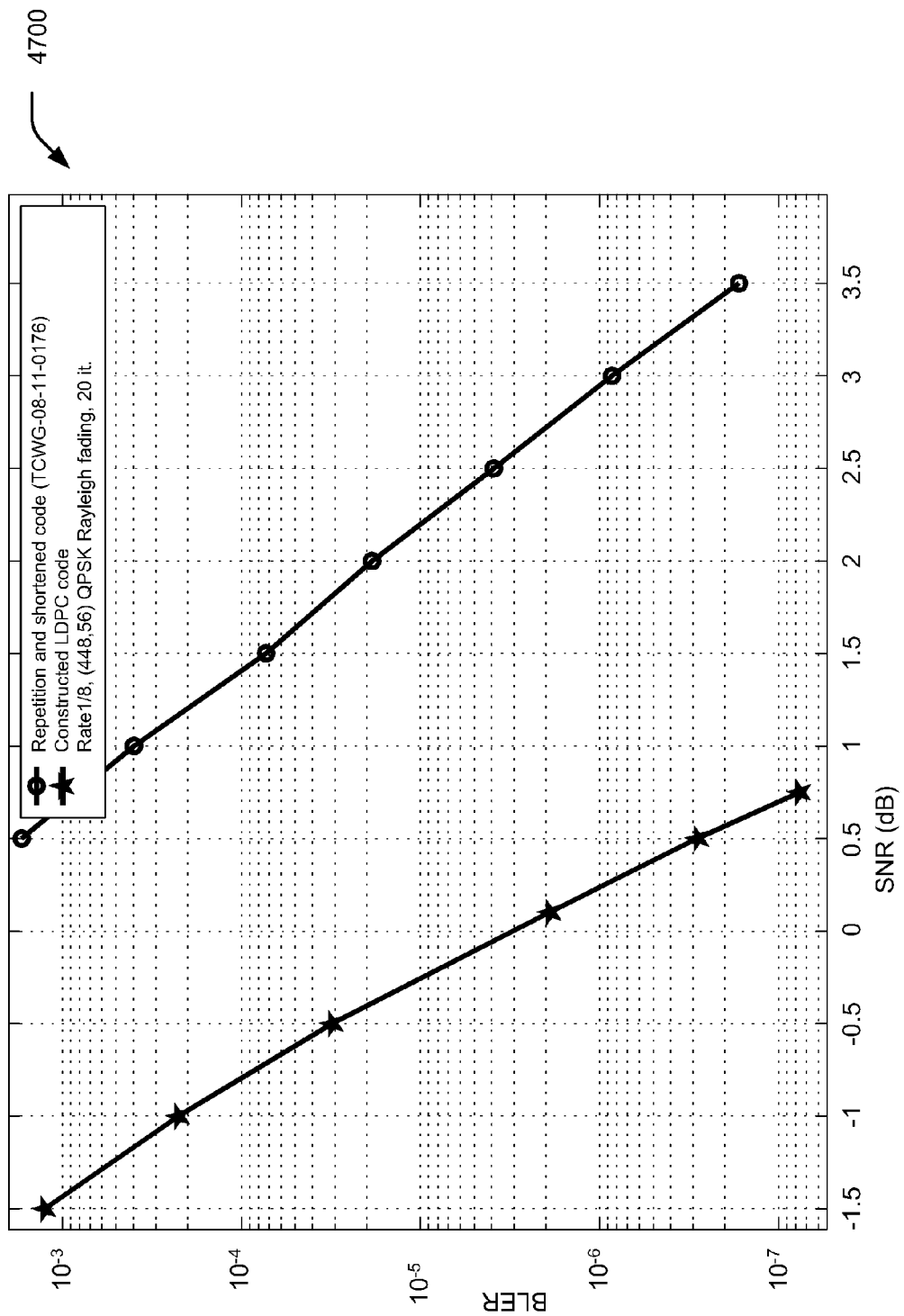
FIG. 47 illustrates an embodiment of a performance comparison of the LDPC code depicted within FIG. 46 to the repetition and shortened FEC code for header as suggested in the proposal (TCWG-2008-11-SCM-PHY-Proposal-0176-01-D) where the Chase combining method is used in decoding using QPSK on Rayleigh fading communication channel.

FIG. 47 illustrates an embodiment 4700 of a performance comparison of the LDPC code depicted within FIG. 46 to the repetition and shortened FEC code for header as suggested in the proposal (TCWG-2008-11-SCM-PHY-Proposal-0176-01-D) where the Chase combining method is used in decoding using QPSK on Rayleigh fading communication channel.

As can be seen, the LDPC code constructed in accordance with the LDPC matrix depicted within FIG. 46 clearly out performs the proposal (TCWG-2008-11-SCM-PHY-Proposal-0176-01-D) where the Chase combining method is used in decoding.

Certain communication systems operate in accordance with orthogonal frequency division multiplexing (OFDM) signaling. In some embodiments, two different types of quasi-cyclic (QC) LDPC codes are employed: Code A and Code B.

Code A: (4640, 4160) QC-LDPC code

Code B: Short size QC-LDPC code for OFDMA

During the OFDMA operational mode, the receiving node (e.g., a receiver communication device or a transceiver communication device) must decode up to 8 separate sub-carriers, each with independent codewords all being from the same LDPC code. In order to employ the same hardware to decode all of the codewords, the receiving node will deliver up to 8 codewords LLRs of Code B in the same fashion as it does for one codeword of Code A.

Since Code A is constructed by 80 by 80 sub-matrices, in order to use the same decoder hardware for both Code A and Code B, the sub-matrix size of Code B may be 80/u by 80/u, where u is an integer. In this way, the same decoder of Code A can be used to decode up to 8 different codewords of Code B in the same time period of what is used for decoding one codeword of Code A.

In accordance with iterative decoding of an LDPC coded signal, the iterative decoding process does not start until the whole LDPC block soft information of the bits of the LDPC code block is initialized (e.g., the entirety of the LDPC code block is received and the associated soft information is calculated there from). Therefore, in this embodiment, decoding 8 codewords simultaneously or sequentially will end up using the same time period. It is noted that the sequential decoding saves power when the total number of OFDMA LDPC codewords is less than 8.

For a more efficient implementation of hardware within a communication device, the LDPC code for OFDMA may be implemented with sub-matrices of size 40 ×40 or 20×20, respectively.

FIG. 48 illustrates an alternative embodiment of an LDPC matrix (according to Option 3) corresponding to an LDPC code having a rate of ⅔.

This LDPC matrix has a form of H=[$H_1 H_2$], and it includes 5 sub-matrix rows and 15 sub-matrix columns. The right hand side matrix ($H_2$) includes 5 sub-matrix columns. The left hand side matrix ($H_1$) includes 10 sub-matrix columns, and each sub-matrix therein that is a CSI sub-matrix is characterized by a shift-value, λ(S). For example, the top left hand sub-matrix has a value of 8, and is therefore a CSI sub-matrix with a shift-value of 8, λ(8). As also mentioned herein, a CSI sub-matrix with a shift-value of 0, λ(0), is an identity sub-matrix (e.g., such as those depicted in the right hand side matrix ($H_2$)). All of the sub-matrices depicted as a "–" are all zero-valued sub-matrices.

The block size of this LDPC code is 600, and the LDPC code encodes 400 information bits and is thereby a (600,400) code. The sub-matrices are all size 40 by 40 (i.e., 40 rows and 40 columns each).

FIG. 49 illustrates an alternative embodiment of an LDPC matrix (according to Option 3) corresponding to an LDPC code having a rate of 0.73.

This LDPC matrix has a form of H=[$H_1 H_2$], and it includes 4 sub-matrix rows and 15 sub-matrix columns. The right hand side matrix ($H_2$) includes 4 sub-matrix columns. The left hand side matrix ($H_1$) includes 11 sub-matrix columns, and each sub-matrix therein that is a CSI sub-matrix is characterized by a shift-value, λ(S). For example, the top left hand sub-matrix has a value of 28, and is therefore a CSI sub-matrix with a shift-value of 28, λ(28). As also mentioned herein, a CSI sub-matrix with a shift-value of 0, λ(0), is an identity sub-matrix (e.g., such as those depicted in the right hand side matrix ($H_2$)). All of the sub-matrices depicted as a "–" are all zero-valued sub-matrices.

The block size of this LDPC code is 600, and the LDPC code encodes 440 information bits and is thereby a (600,440) code. The sub-matrices are all size 40 by 40 (i.e., 40 rows and 40 columns each).

FIG. 50 illustrates an alternative embodiment of an LDPC matrix (according to a variation of Option 3) corresponding to an LDPC code having a rate of 0.76.

This LDPC matrix has a form of H=[$H_1 H_2$], and it includes 7 sub-matrix rows and 29 sub-matrix columns. The right hand side matrix ($H_2$) includes 7 sub-matrix columns. The left hand side matrix ($H_1$) includes 22 sub-matrix columns, and each sub-matrix therein that is a CSI sub-matrix is characterized by a shift-value, λ(S). For example, the top left hand sub-matrix has a value of 19, and is therefore a CSI sub-matrix with a shift-value of 19, λ(19). As also mentioned herein, a CSI sub-matrix with a shift-value of 0, λ(0), is an identity sub-matrix (e.g., such as those depicted in the right hand side matrix ($H_2$)). All of the sub-matrices depicted as a "–" are all zero-valued sub-matrices.

The block size of this LDPC code is 580, and the LDPC code encodes 440 information bits and is thereby a (580,440) code. The sub-matrices are all size 20 by 20 (i.e., 20 rows and 20 columns each).

Figure 51:
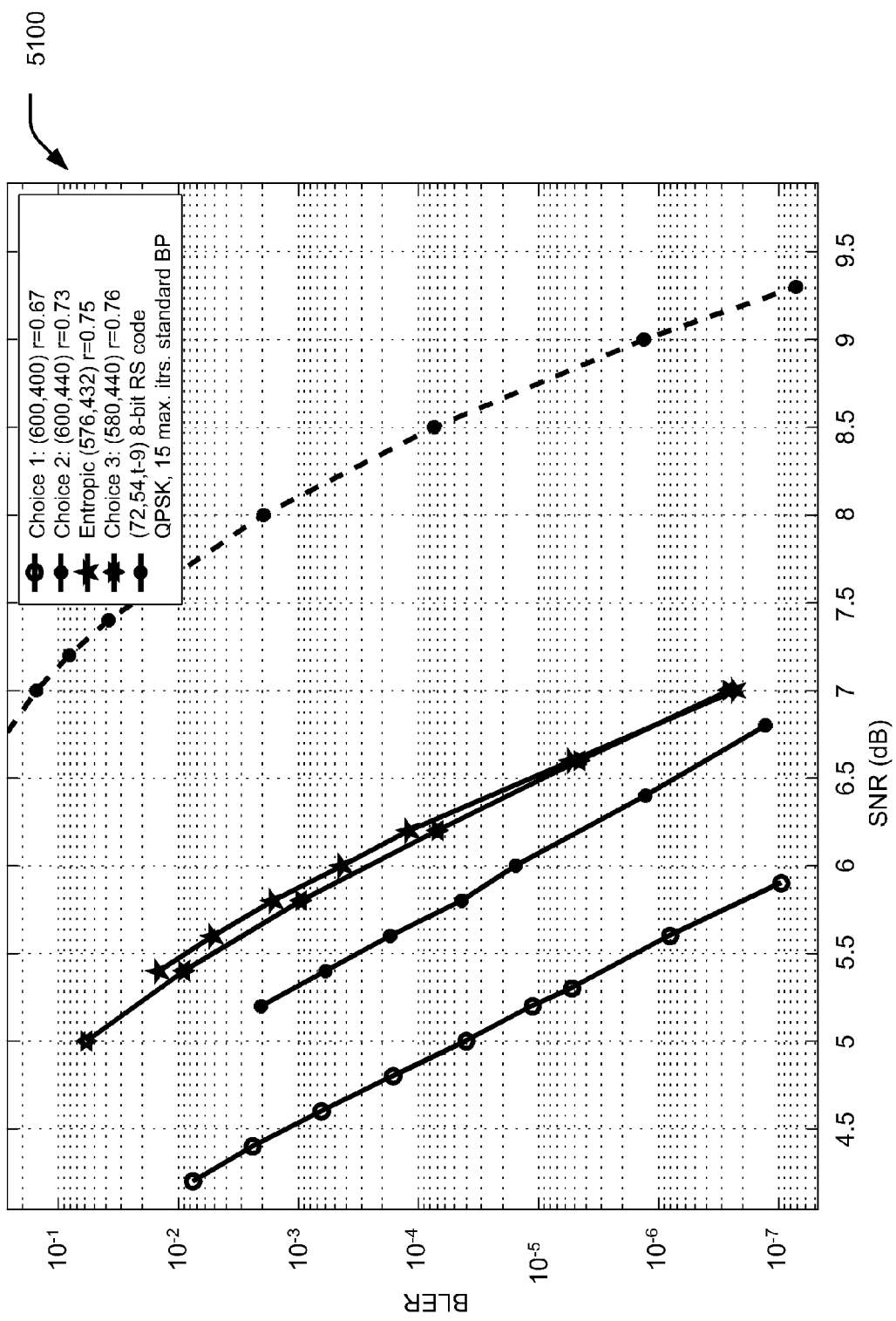
FIG. 51 illustrates an embodiment of a performance comparison of the LDPC codes depicted within FIG. 48, FIG. 49, and FIG. 50 in decoding using QPSK on Rayleigh fading communication channel.

FIG. 51 illustrates an embodiment of a performance comparison of the LDPC codes depicted within FIG. 48, FIG. 49, and FIG. 50 in decoding using QPSK on Rayleigh fading communication channel.

As can be seen, the LDPC code constructed in accordance with the LDPC matrix depicted within each of the FIG. 48, FIG. 49, and FIG. 50, depicted as Choice 1, Choice 2, and Choice 3, respectively, provide better performance.

Figure 52:
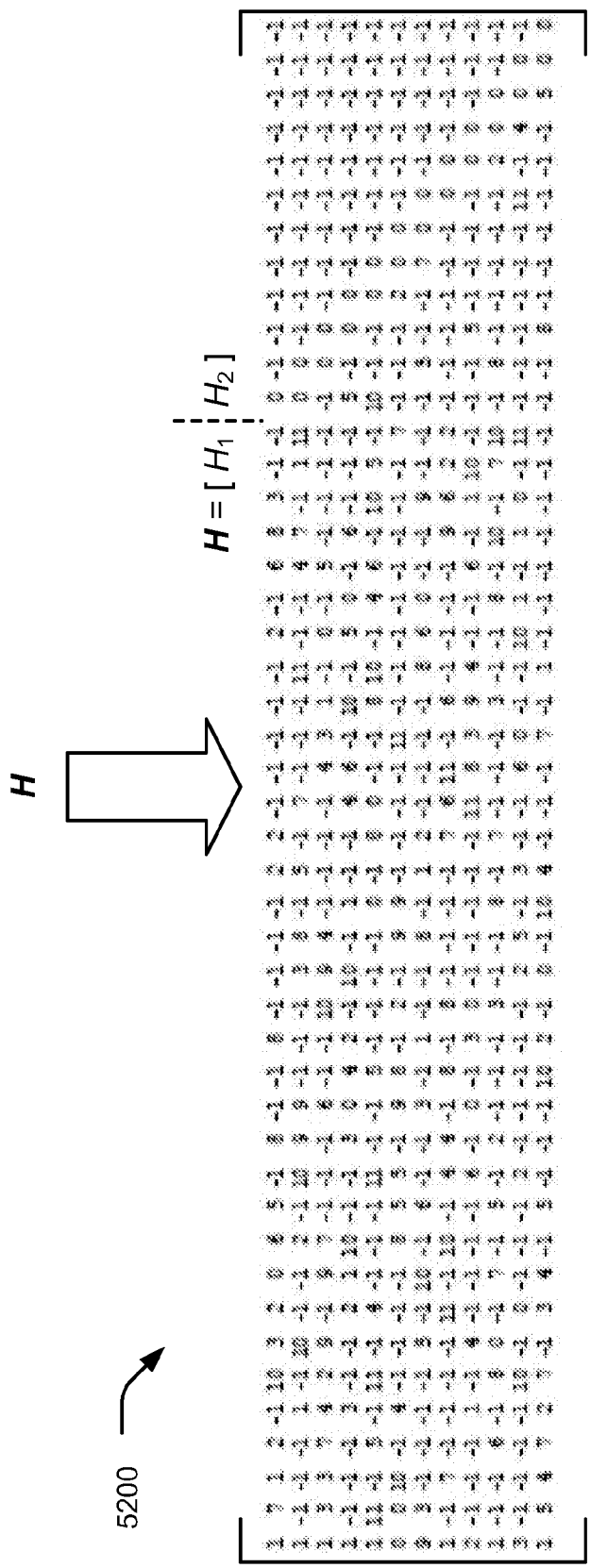
FIG. 52 illustrate an alternative embodiment of an LDPC matrix (according to a variation of Option 3) corresponding to an LDPC code having a rate of 0.75 (576,432) LDPC code (of an LDPC matrix having form, $H=[H_1 H_2]$.

FIG. 52 illustrate an alternative embodiment of an LDPC matrix (according to a variation of Option 3) corresponding to an LDPC code having a rate of 0.75 (576,432) LDPC code (of an LDPC matrix having form, $H=[H_1 H_2]$.

This LDPC matrix has a form of $H=[H_1 H_2]$, and it includes 12 sub-matrix rows and 48 sub-matrix columns. This LDPC code is a systematic, irregular LDPC code. The right hand side matrix ($H_2$) includes 12 sub-matrix columns. The left hand side matrix ($H_1$) includes 36 sub-matrix columns, and each sub-matrix therein that is a CSI sub-matrix is characterized by a shift-value, $\lambda(S)$. For example, the top left hand sub-matrix has a value of 1, and is therefore a CSI sub-matrix with a shift-value of 1, $\lambda(1)$. As also mentioned herein, a CSI sub-matrix with a shift-value of 0, $\lambda(0)$, is an identity sub-matrix (e.g., such as those depicted in the right hand side matrix ($H_2$)). All of the sub-matrices depicted as a "–" are all zero-valued sub-matrices.

The block size of this LDPC code is 576, and the LDPC code encodes 432 information bits and is thereby a (576,432) code. The sub-matrices are all size 12 by 12 (i.e., 12 rows and 12 columns each). The maximum column weight of any column of the LDPC matrix is 12.

Figure 53:
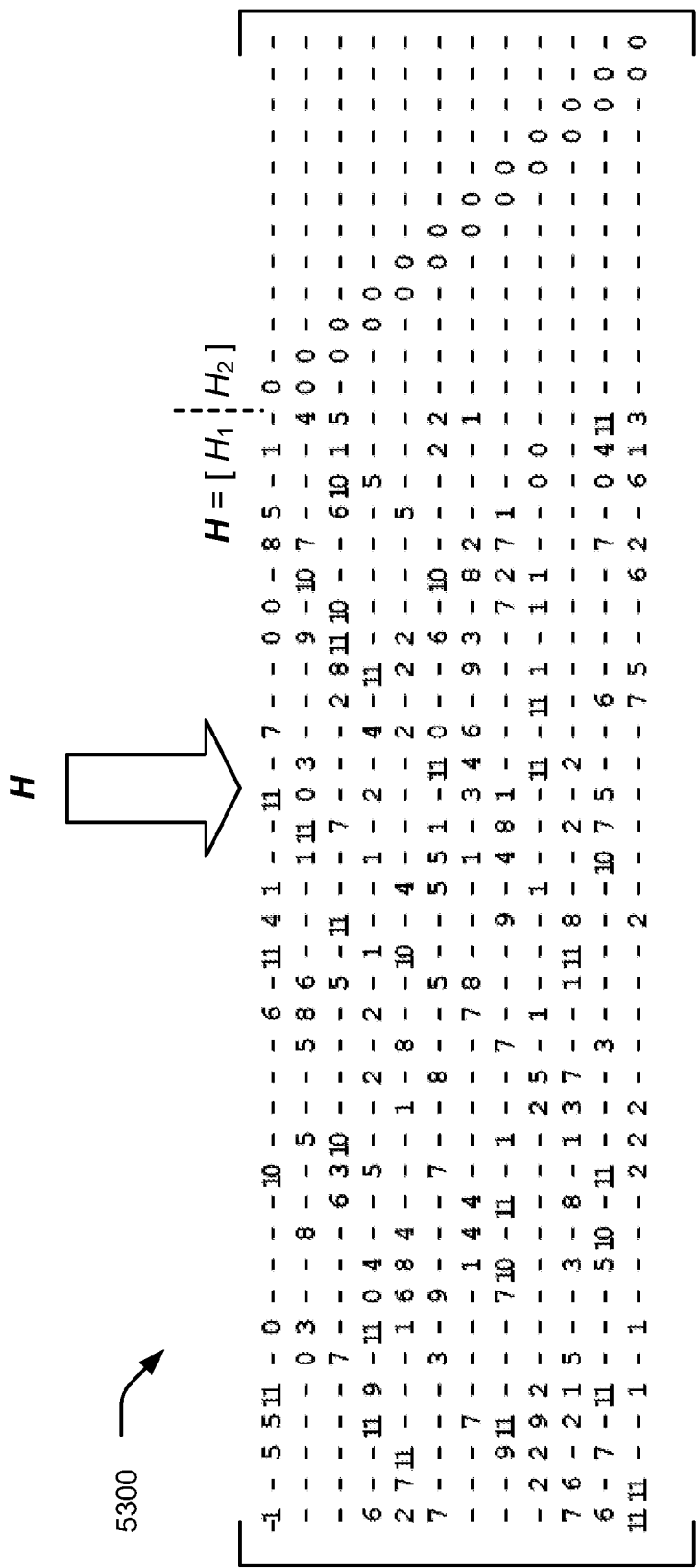
FIG. 53 illustrate an alternative embodiment of an LDPC matrix (according to Option 3) corresponding to an LDPC code having a rate of 0.75 (576,432) LDPC code (of an LDPC matrix having form, $H=[H_1 H_2]$.

FIG. 53 illustrate an alternative embodiment of an LDPC matrix (according to Option 3) corresponding to an LDPC code having a rate of 0.75 (576,432) LDPC code (of an LDPC matrix having form, $H=[H_1 H_2]$.

This LDPC matrix has a form of $H=[H_1 H_2]$, and it includes 12 sub-matrix rows and 48 sub-matrix columns. This LDPC code is a systematic, irregular LDPC code. The right hand side matrix ($H_2$) includes 12 sub-matrix columns. The left hand side matrix ($H_1$) includes 36 sub-matrix columns, and each sub-matrix therein that is a CSI sub-matrix is characterized by a shift-value, $\lambda(S)$. For example, the lower left hand sub-matrix has a value of 11, and is therefore a CSI sub-matrix with a shift-value of 11, $\lambda(11)$. As also mentioned herein, a CSI sub-matrix with a shift-value of 0, $\lambda(0)$, is an identity sub-matrix (e.g., such as those depicted in the right hand side matrix ($H_2$)). All of the sub-matrices depicted as a "–" are all zero-valued sub-matrices.

The block size of this LDPC code is 576, and the LDPC code encodes 432 information bits and is thereby a (576,432) code. The sub-matrices are all size 12 by 12 (i.e., 12 rows and 12 columns each). The maximum column weight of any column of the LDPC matrix is 6.

Figure 54:
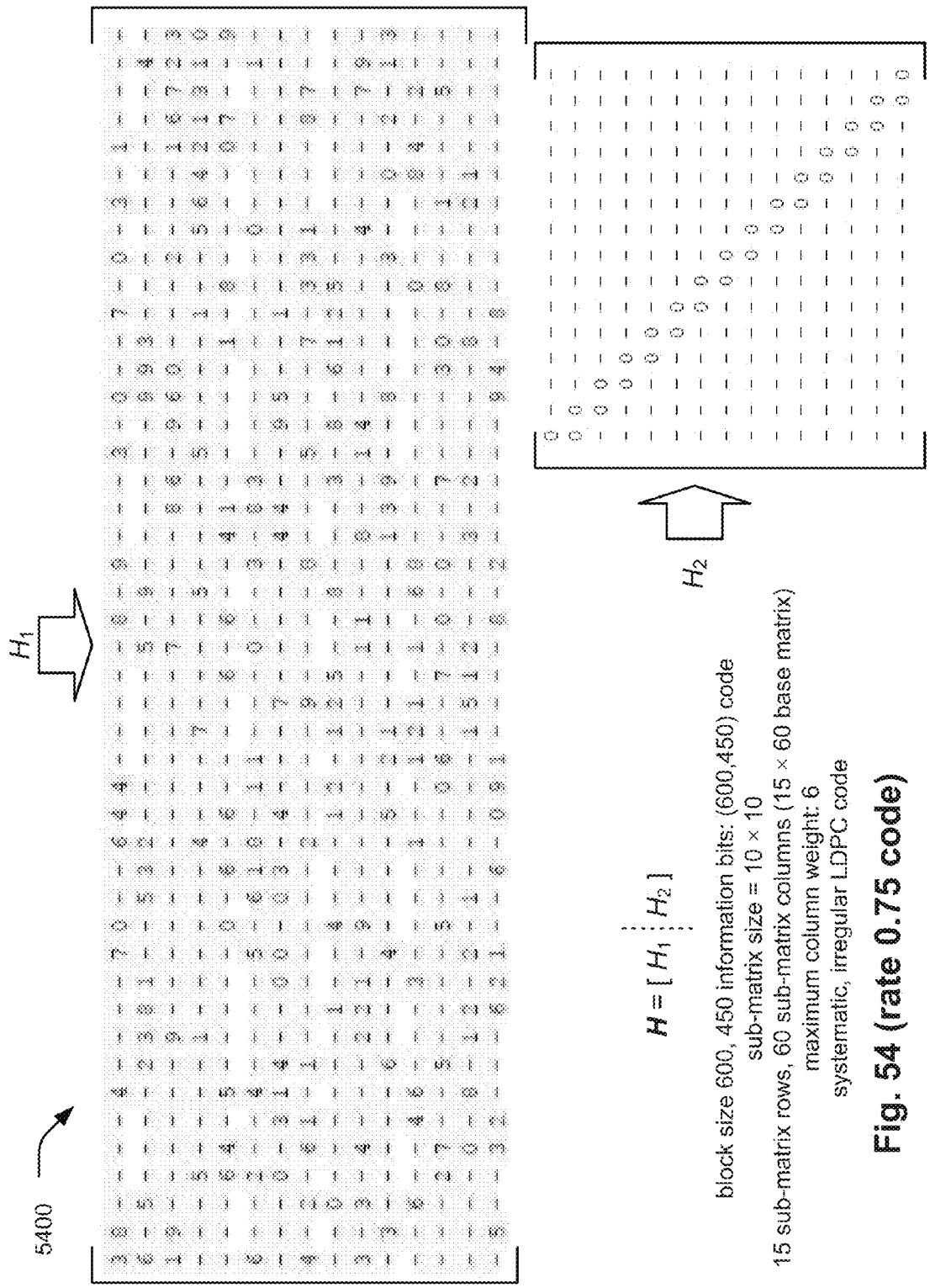
FIG. 54 illustrate an alternative embodiment of an LDPC matrix (according to Option 3) corresponding to an LDPC code having a rate of 0.75 (600,450) LDPC code (of an LDPC matrix having form, $H=[H_1 H_2]$.

FIG. 54 illustrate an alternative embodiment of an LDPC matrix (according to Option 3) corresponding to an LDPC code having a rate of 0.75 (600,450) LDPC code (of an LDPC matrix having form, $H=[H_1 H_2]$.

This LDPC matrix has a form of $H=[H_1 H_2]$, and it includes 15 sub-matrix rows and 60 sub-matrix columns. This LDPC code is a systematic, irregular LDPC code. The right hand side matrix ($H_2$) includes 15 sub-matrix columns. The left hand side matrix ($H_1$) includes 45 sub-matrix columns, and each sub-matrix therein that is a CSI sub-matrix is characterized by a shift-value, $\lambda(S)$. For example, the top left hand sub-matrix has a value of 3, and is therefore a CSI sub-matrix with a shift-value of 3, $\lambda(3)$. As also mentioned herein, a CSI sub-matrix with a shift-value of 0, $\lambda(0)$, is an identity sub-matrix (e.g., such as those depicted in the right hand side matrix ($H_2$)). All of the sub-matrices depicted as a "–" are all zero-valued sub-matrices.

The block size of this LDPC code is 600, and the LDPC code encodes 450 information bits and is thereby a (600,450) code. The sub-matrices are all size 10 by 10 (i.e., 10 rows and 10 columns each). The maximum column weight of the LDPC matrix is 5 for all information bits.

Considering each of the following embodiments of the FIG. 55, FIG. 56, FIG. 57, FIG. 58, and FIG. 59, each of the corresponding LDPC matrices thereof have the form of an LDPC matrix having form, $H=[H_1 H_2]$ (i.e., which may be viewed as being partitioned into a left hand side matrix, $H_1$, and a right hand side matrix, $H_2$). As can be seen in each of these embodiments, there are diagonal bands of null or zero-valued sub-matrices that are interleaved with diagonal bands of CSI sub-matrices (i.e., non-null or non-zero-valued sub-matrices). Also, as can be seen in the embodiments, each sub-matrix column of the left hand side matrix includes at least a first predetermined number of all zero-valued sub-matrices, and each sub-matrix column of the left hand side matrix includes at most a second predetermined number of CSI sub-matrices (one or more of these CSI sub-matrices may be identity sub-matrices which or a CSI sub-matrix having undergone a cyclic shift of 0). Each sub-matrix within the right hand side matrix is a null or an all zero-valued sub-matrix except those sub-matrices identified below in (a) and (b):

(a) each sub-matrix located on a diagonal of the right hand side matrix is a CSI (Cyclic Shifted Identity) sub-matrix; and (b) in every row between a second row, which is below and adjacent to a top row, and a bottom row of the right hand side matrix, inclusive, each sub-matrix located on a left hand side of and adjacent to a sub-matrix located on the diagonal of the right hand side matrix is also a CSI sub-matrix.

In some embodiments, each sub-matrix of the left hand side matrix is either an all zero-valued sub-matrix or a CSI sub-matrix. Also, in some embodiments, each sub-matrix located on a number of diagonals of the left hand side matrix is a null or an all zero-valued sub-matrix, and these diagonals are contiguous such that each diagonal composed of null or all zero-valued sub-matrices are contiguous with one another. Therefore, the left hand side matrix can be seen as being composed of first diagonal band composed of multiple sub-matrix diagonals of combined CSI sub-matrices/one or more null or all zero-valued sub-matrices and second diagonal band composed of multiple sub-matrix diagonals formed entirely of null or all zero-valued sub-matrices. Within each of these diagonal bands, there are a number of sub-matrices located on the diagonals of the LDPC matrix.

Also, considering the left hand side matrix, each sub-matrix row of the left hand side matrix includes a first contiguous number of all zero-valued sub-matrices, a second contiguous number of all zero-valued sub-matrices, and interposed between the first contiguous number of all zero-valued sub-matrices and the second contiguous number of all zero-valued sub-matrices is another number of sub-matrices that includes at most the second predetermined number of CSI sub-matrices. In some embodiments, this another number of sub-matrices may include at least one all zero-valued sub-matrix and fewer than the second predetermined number of CSI sub-matrices.

Also, in certain embodiments, the left hand side matrix includes a first diagonal sub-matrix band, composed of CSI sub-matrices and at least one all zero-valued sub-matrix, located on a first number of contiguous diagonals of the left hand side matrix. The left hand side matrix also includes a second diagonal sub-matrix band, composed of all zero-valued sub-matrices, located on a second number of contiguous diagonals of the left hand side matrix. This first diagonal sub-matrix band is adjacent to the first diagonal sub-matrix band.

Such an LDPC matrix may be employed in any of a variety of communication devices. Such a communication device may be implemented within any one or more types of communication systems including a satellite communication system, a wireless communication system, a wired communication system, and/or a fiber-optic communication system.

Figure 55:
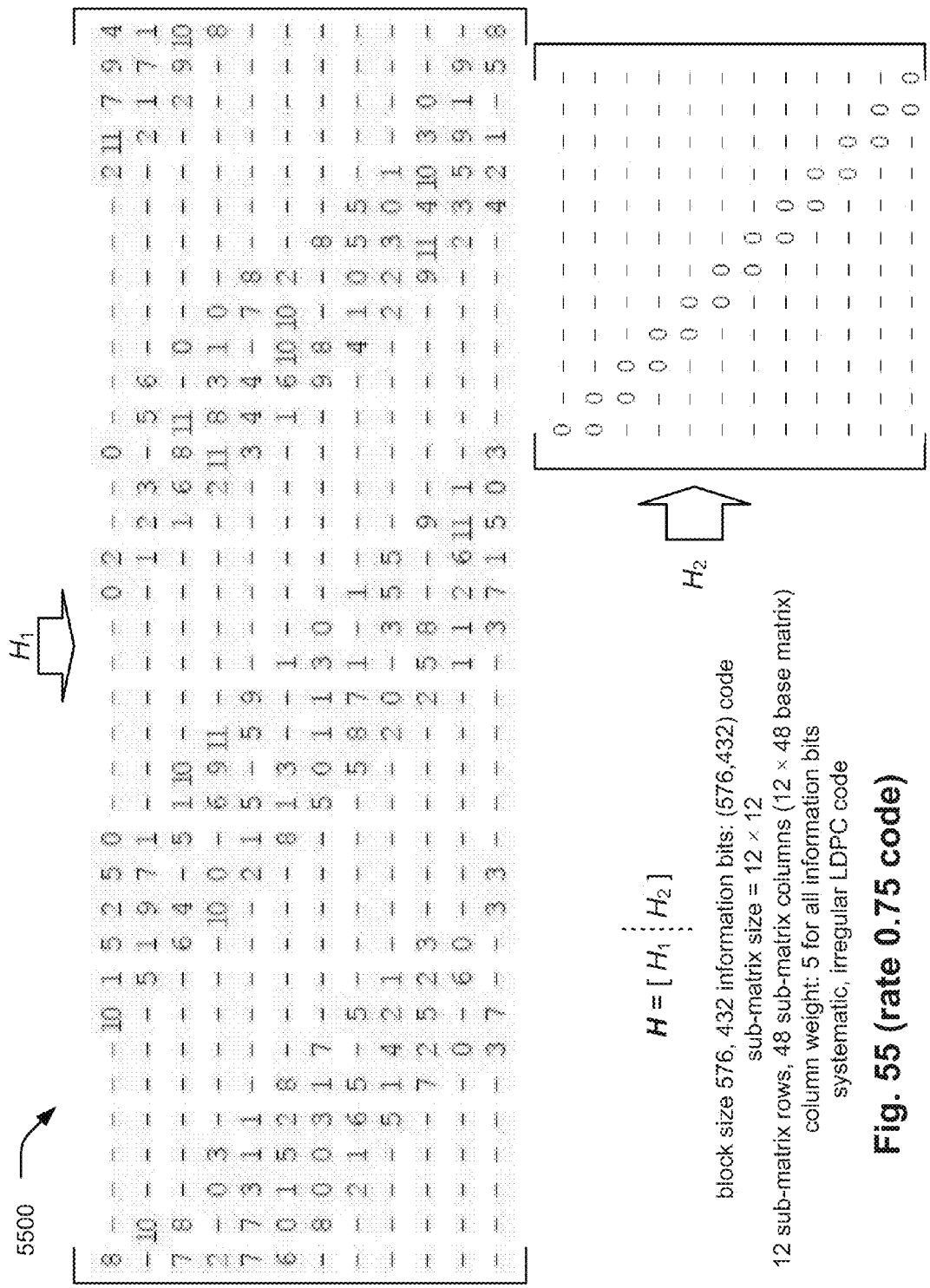
FIG. 55 illustrate an alternative embodiment of an LDPC matrix (according to Option 3) corresponding to an LDPC code having a rate of 0.75 (576,432) LDPC code (of an LDPC matrix having form, $H=[H_1 H_2]$.

FIG. 55 illustrate an alternative embodiment of an LDPC matrix (according to Option 3) corresponding to an LDPC code having a rate of 0.75 (576,432) LDPC code (of an LDPC matrix having form, H=[H$_1$H$_2$]).

This LDPC matrix has a form of H=[H$_1$H$_2$], and it includes 12 sub-matrix rows and 48 sub-matrix columns. This LDPC code is a systematic, irregular LDPC code. The right hand side matrix (H$_2$) includes 12 sub-matrix columns. The left hand side matrix (H$_1$) includes 36 sub-matrix columns, and each sub-matrix therein that is a CSI sub-matrix is characterized by a shift-value, λ(S). For example, the top left hand sub-matrix has a value of 8, and is therefore a CSI sub-matrix with a shift-value of 8, λ(8). As also mentioned herein, a CSI sub-matrix with a shift-value of 0, λ(0), is an identity sub-matrix (e.g., such as those depicted in the right hand side matrix (H$_2$)). All of the sub-matrices depicted as a "–" are all zero-valued sub-matrices.

The block size of this LDPC code is 576, and the LDPC code encodes 432 information bits and is thereby a (576,432) code. The sub-matrices are all size 12 by 12 (i.e., 12 rows and 12 columns each). The maximum column weight of any column of the LDPC matrix is 12.

Figure 56:
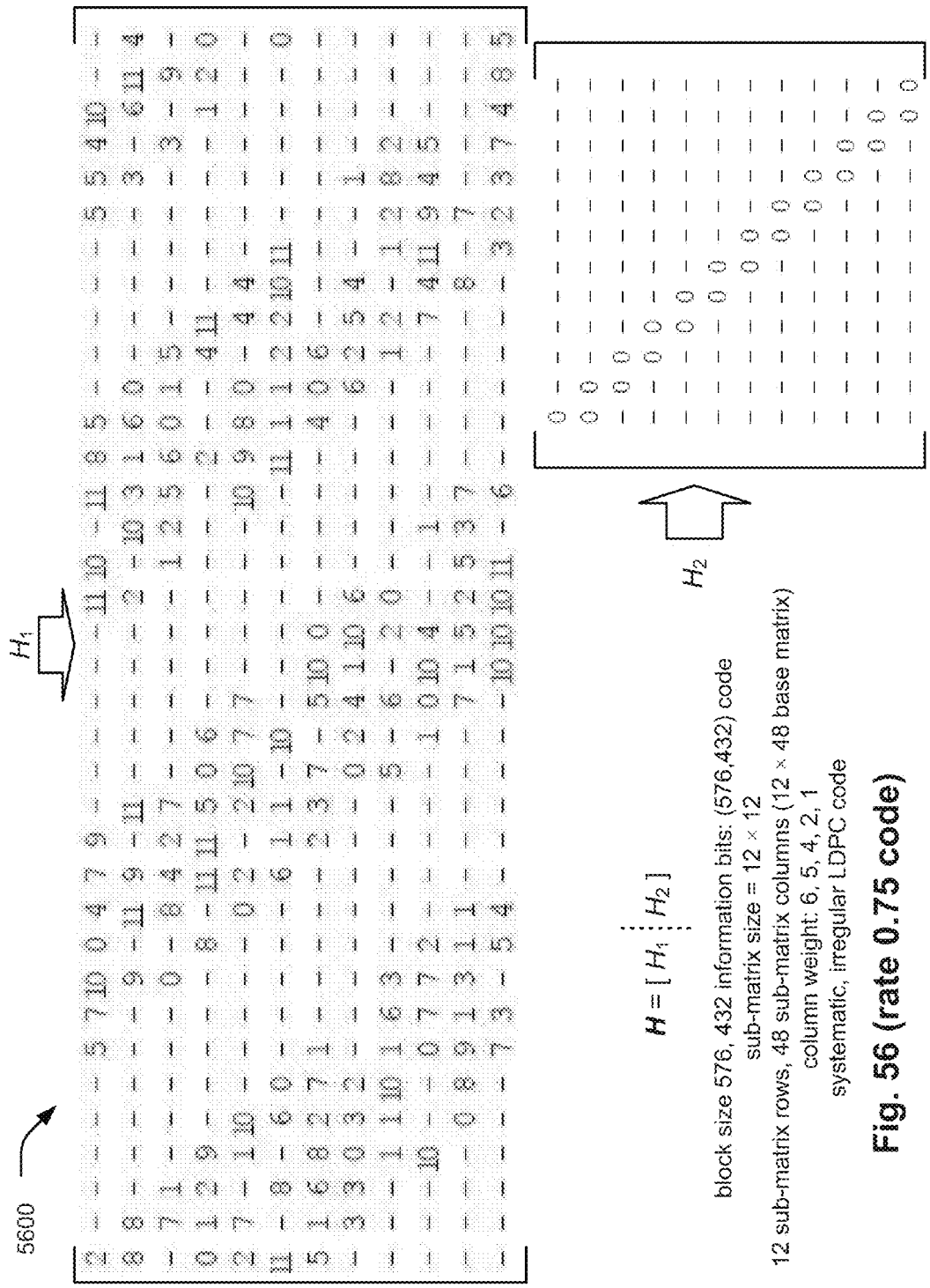
FIG. 56 illustrate an alternative embodiment of an LDPC matrix (according to Option 3) corresponding to an LDPC code having a rate of 0.75 (576,432) LDPC code (of an LDPC matrix having form, $H=[H_1 H_2]$.

FIG. 56 illustrate an alternative embodiment of an LDPC matrix (according to Option 3) corresponding to an LDPC code having a rate of 0.75 (576,432) LDPC code (of an LDPC matrix having form, H=[H$_1$H$_2$]).

This LDPC matrix has a form of H=[H$_1$H$_2$], and it includes 12 sub-matrix rows and 48 sub-matrix columns. This LDPC code is a systematic, irregular LDPC code. The right hand side matrix (H$_2$) includes 12 sub-matrix columns. The left hand side matrix (H$_1$) includes 36 sub-matrix columns, and each sub-matrix therein that is a CSI sub-matrix is characterized by a shift-value, λ(S). For example, the top left hand sub-matrix has a value of 2, and is therefore a CSI sub-matrix with a shift-value of 2, λ(2). As also mentioned herein, a CSI sub-matrix with a shift-value of 0, λ(0), is an identity sub-matrix (e.g., such as those depicted in the right hand side matrix (H$_2$)). All of the sub-matrices depicted as a "–" are all zero-valued sub-matrices.

The block size of this LDPC code is 576, and the LDPC code encodes 432 information bits and is thereby a (576,432) code. The sub-matrices are all size 12 by 12 (i.e., 12 rows and 12 columns each). The column weights of the columns of the LDPC matrix vary from 6, 5, 4, 2, and 1.

Figure 57:
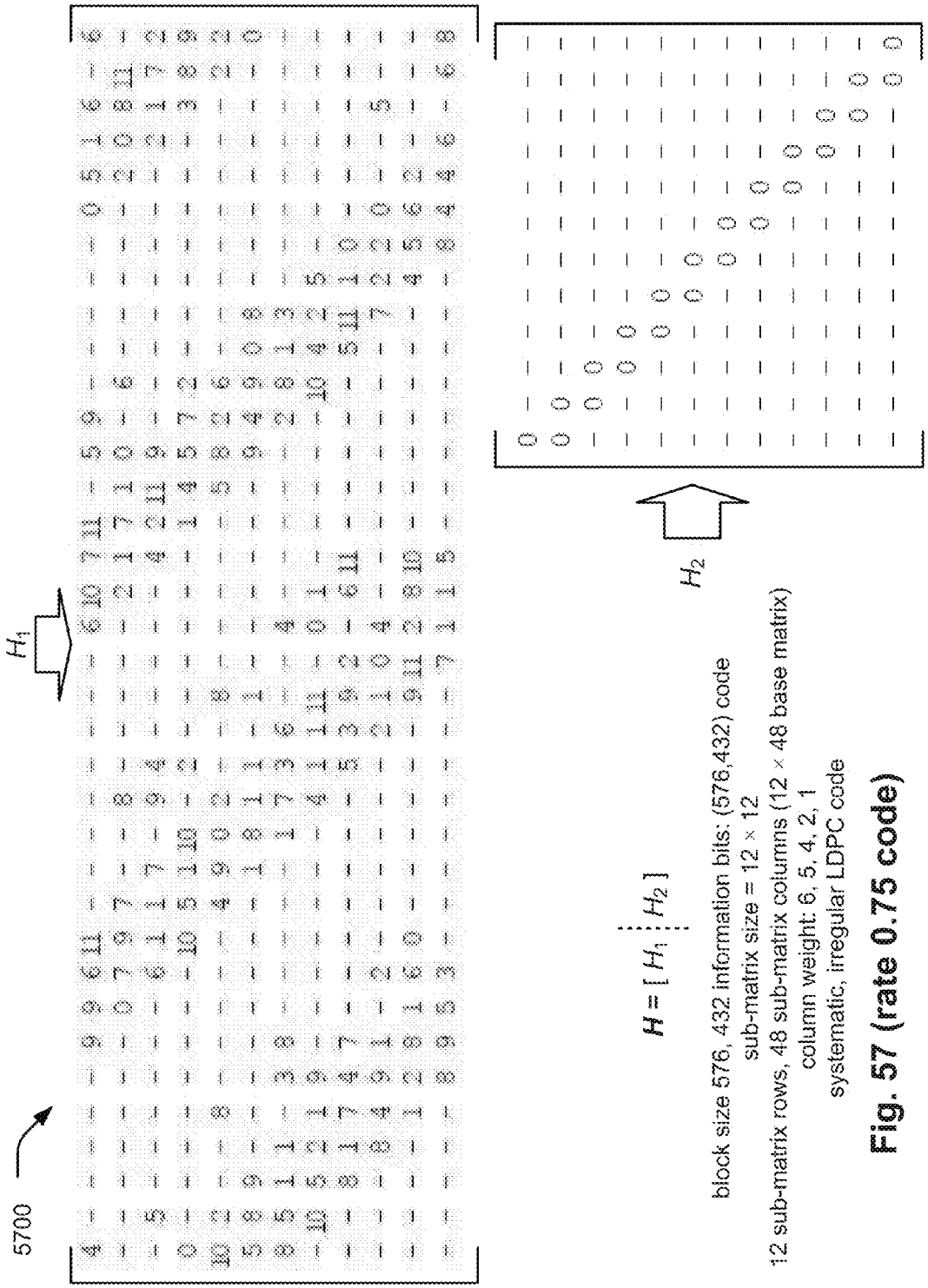
FIG. 57 illustrate an alternative embodiment of an LDPC matrix (according to Option 3) corresponding to an LDPC code having a rate of 0.75 (576,432) LDPC code (of an LDPC matrix having form, $H=[H_1 H_2]$.

FIG. 57 illustrate an alternative embodiment of an LDPC matrix (according to Option 3) corresponding to an LDPC code having a rate of 0.75 (576,432) LDPC code (of an LDPC matrix having form, H=[H$_1$H$_2$]).

This LDPC matrix has a form of H=[H$_1$H$_2$], and it includes 12 sub-matrix rows and 48 sub-matrix columns. This LDPC code is a systematic, irregular LDPC code. The right hand side matrix (H$_2$) includes 12 sub-matrix columns. The left hand side matrix (H$_1$) includes 36 sub-matrix columns, and each sub-matrix therein that is a CSI sub-matrix is characterized by a shift-value, λ(S). For example, the top left hand sub-matrix has a value of 4, and is therefore a CSI sub-matrix with a shift-value of 4, λ(4). As also mentioned herein, a CSI sub-matrix with a shift-value of 0, λ(0), is an identity sub-matrix (e.g., such as those depicted in the right hand side matrix (H$_2$)). All of the sub-matrices depicted as a "–" are all zero-valued sub-matrices.

The block size of this LDPC code is 576, and the LDPC code encodes 432 information bits and is thereby a (576,432) code. The sub-matrices are all size 12 by 12 (i.e., 12 rows and 12 columns each). The column weights of the columns of the LDPC matrix vary from 6, 5, 4, 2, and 1.

Figure 58:
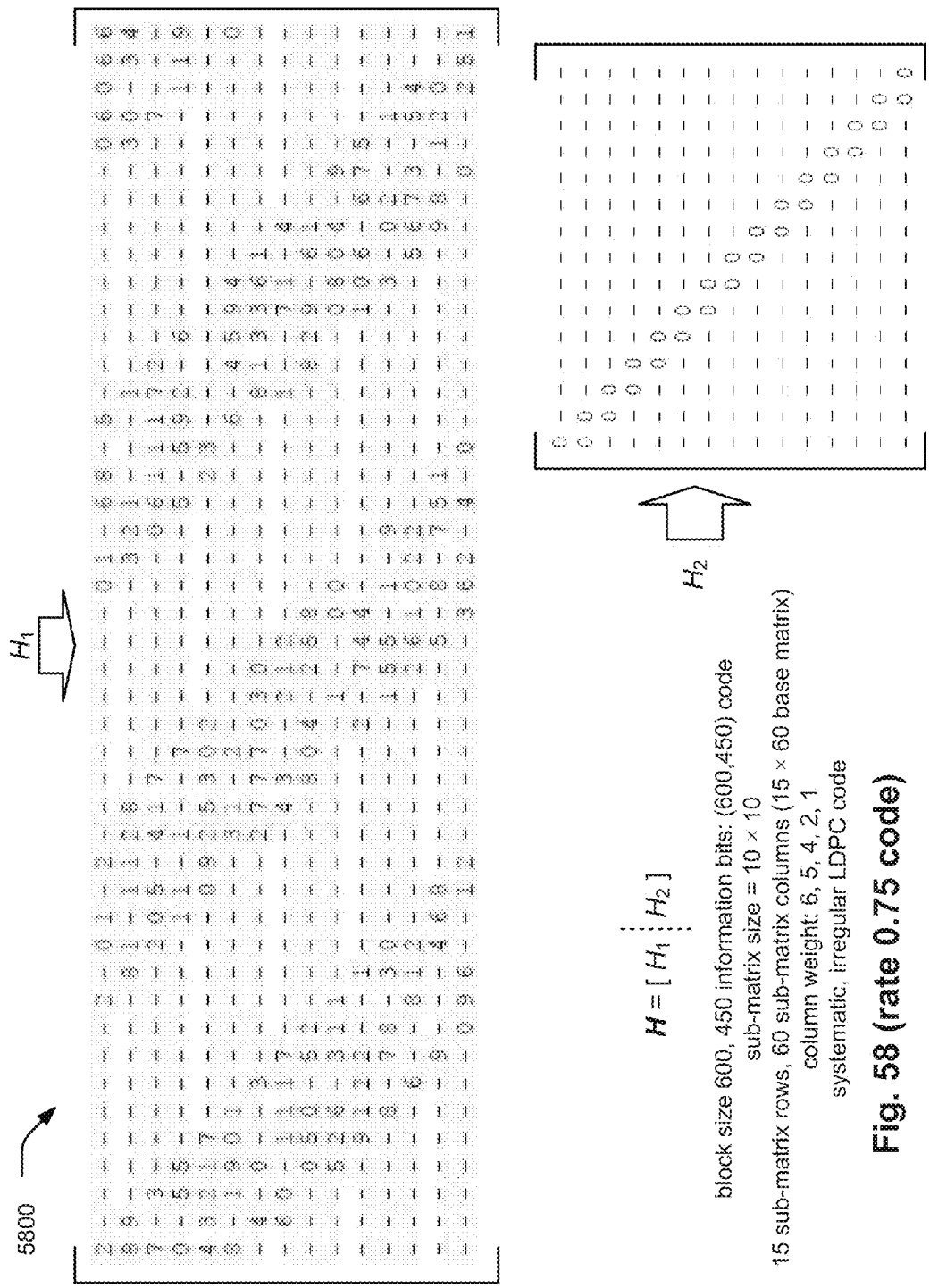
FIG. 58 illustrate an alternative embodiment of an LDPC matrix (according to Option 3) corresponding to an LDPC code having a rate of 0.75 (600,450) LDPC code (of an LDPC matrix having form, $H=[H_1 H_2]$.

FIG. 58 illustrate an alternative embodiment of an LDPC matrix (according to Option 3) corresponding to an LDPC code having a rate of 0.75 (600,450) LDPC code (of an LDPC matrix having form, H=[H$_1$H$_2$]).

This LDPC matrix has a form of H=[H$_1$H$_2$], and it includes 15 sub-matrix rows and 60 sub-matrix columns. This LDPC code is a systematic, irregular LDPC code. The right hand side matrix (H$_2$) includes 15 sub-matrix columns. The left hand side matrix (H$_1$) includes 45 sub-matrix columns, and each sub-matrix therein that is a CSI sub-matrix is characterized by a shift-value, λ(S). For example, the top left hand sub-matrix has a value of 2, and is therefore a CSI sub-matrix with a shift-value of 2, λ(2). As also mentioned herein, a CSI sub-matrix with a shift-value of 0, λ(0), is an identity sub-matrix (e.g., such as those depicted in the right hand side matrix (H$_2$)). All of the sub-matrices depicted as a "–" are all zero-valued sub-matrices.

The block size of this LDPC code is 600, and the LDPC code encodes 450 information bits and is thereby a (600,450) code. The sub-matrices are all size 10 by 10 (i.e., 10 rows and 10 columns each). The column weights of the columns of the LDPC matrix vary from 6, 5, 4, 2, and 1.

Figure 59:
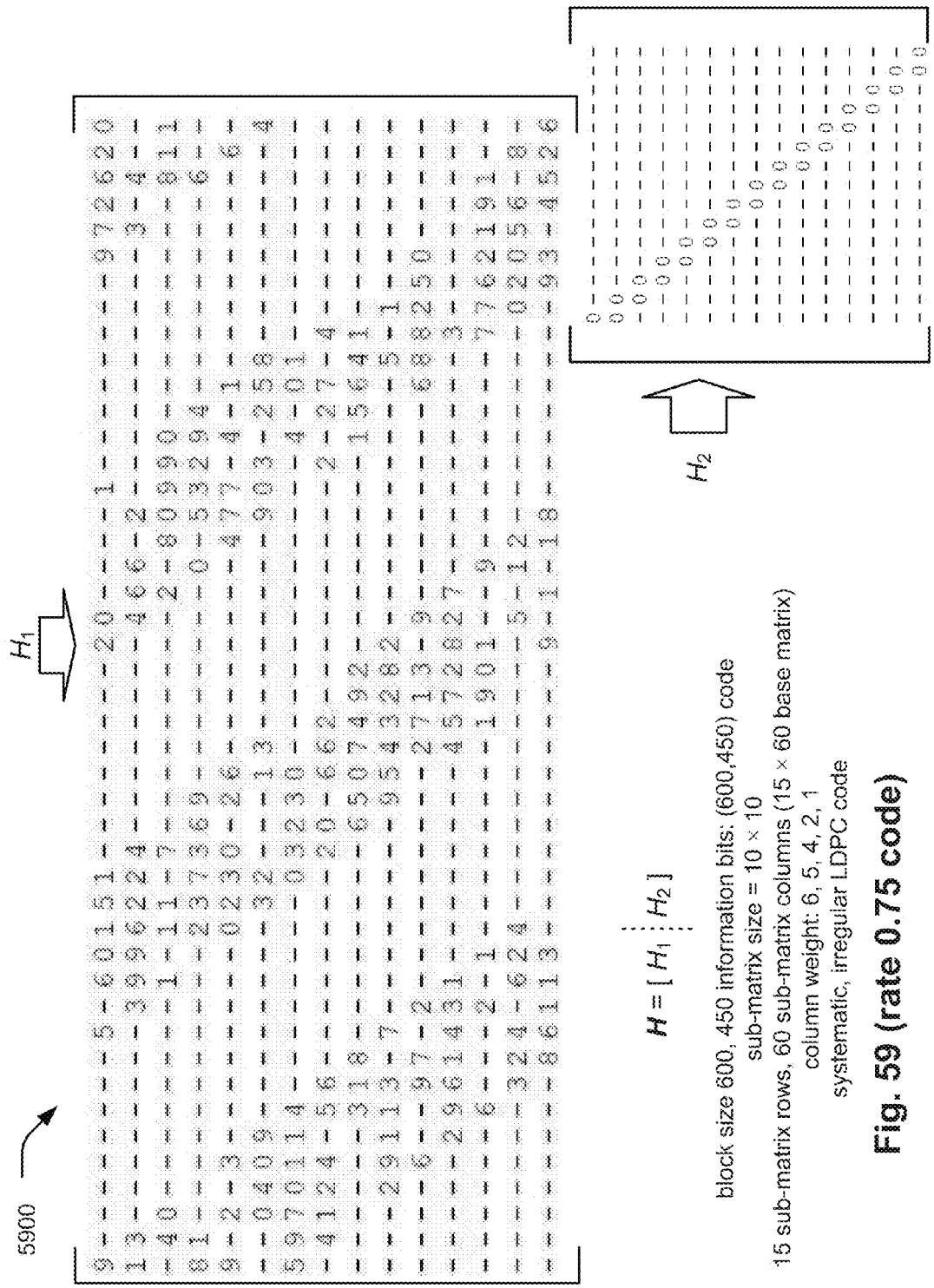
FIG. 59 illustrate an alternative embodiment of an LDPC matrix (according to Option 3) corresponding to an LDPC code having a rate of 0.75 (600,450) LDPC code (of an LDPC matrix having form, $H=[H_1 H_2]$.

FIG. 59 illustrate an alternative embodiment of an LDPC matrix (according to Option 3) corresponding to an LDPC code having a rate of 0.75 (600,450) LDPC code (of an LDPC matrix having form, H=[H$_1$H$_2$]).

This LDPC matrix has a form of H=[H$_1$H$_2$], and it includes 15 sub-matrix rows and 60 sub-matrix columns. This LDPC code is a systematic, irregular LDPC code. The right hand side matrix (H$_2$) includes 15 sub-matrix columns. The left hand side matrix (H$_1$) includes 45 sub-matrix columns, and each sub-matrix therein that is a CSI sub-matrix is characterized by a shift-value, λ(S). For example, the top left hand sub-matrix has a value of 9, and is therefore a CSI sub-matrix with a shift-value of 9, λ(9). As also mentioned herein, a CSI sub-matrix with a shift-value of 0, λ(0), is an identity sub-matrix (e.g., such as those depicted in the right hand side matrix (H$_2$)). All of the sub-matrices depicted as a "–" are all zero-valued sub-matrices.

The block size of this LDPC code is 600, and the LDPC code encodes 450 information bits and is thereby a (600,450) code. The sub-matrices are all size 10 by 10 (i.e., 10 rows and 10 columns each). The column weights of the columns of the LDPC matrix vary from 6, 5, 4, 2, and 1.

Figure 60:
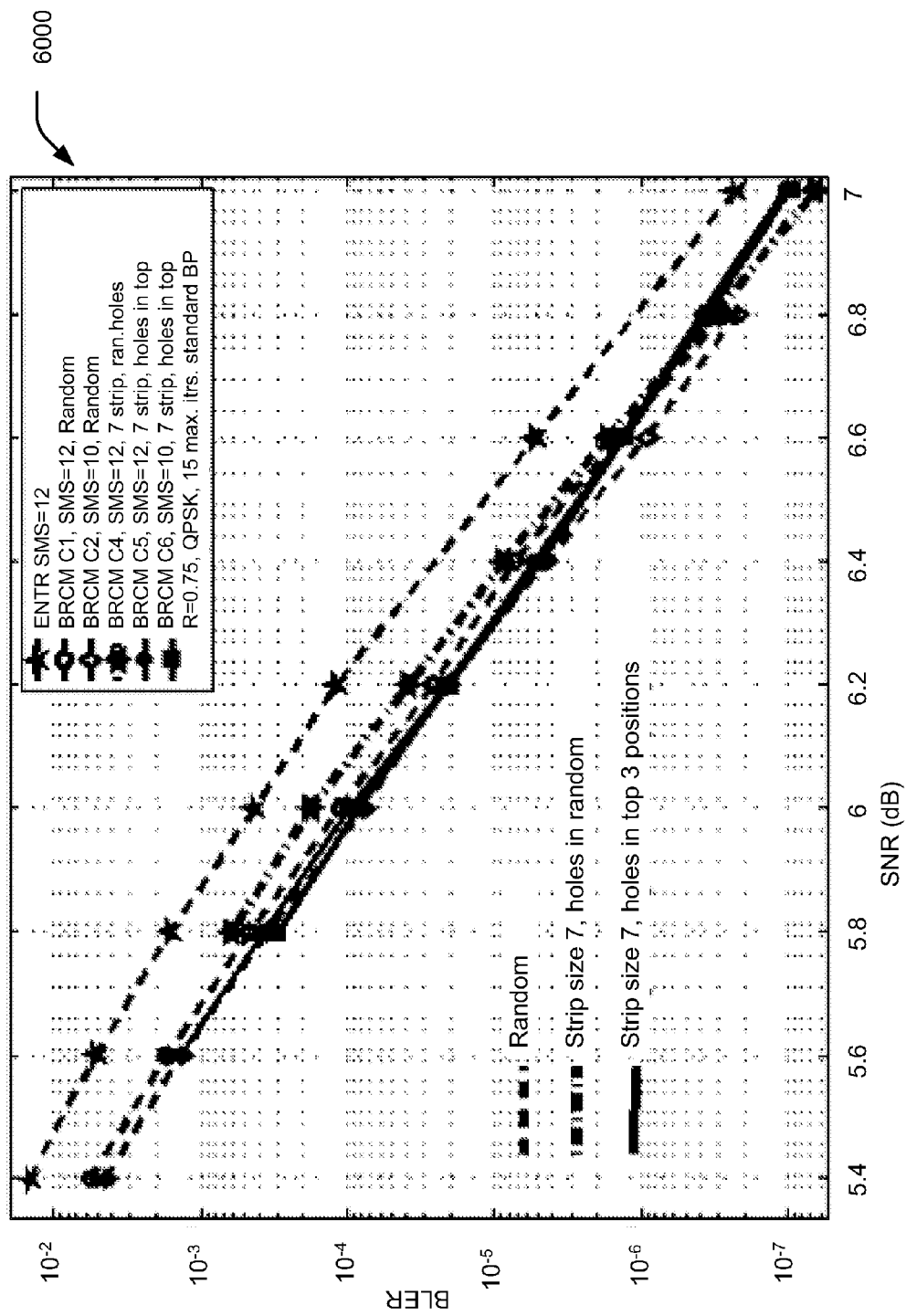
FIG. 60 illustrates an embodiment of a performance comparison of the LDPC codes depicted within FIG. 52, FIG. 53, FIG. 54, FIG. 55, FIG. 56, FIG. 57, FIG. 58 and FIG. 59 in decoding using QPSK on Rayleigh fading communication channel.

FIG. 60 illustrates an embodiment of a performance comparison of the LDPC codes depicted within FIG. 52, FIG. 53, FIG. 54, FIG. 55, FIG. 56, FIG. 57, FIG. 58 and FIG. 59 in decoding using QPSK on Rayleigh fading communication channel.

As can be seen, the LDPC code constructed in accordance with the LDPC matrix depicted within each of the FIG. 52, FIG. 53, FIG. 54, FIG. 55, FIG. 56, FIG. 57, FIG. 58 and FIG. 59, depicted as ENTR, BRCM C1, BRCM C2, BRCM C3, BRCM C4, BRCM C5, and BRCM C6, respectively. As can be seen, the LDPC codes depicted by BRCM C1, BRCM C2, BRCM C3, BRCM C4, BRCM C5, and BRCM C6 provide for better performance than the LDPC code depicted by ENTR.

It is noted that the various modules (e.g., encoding modules, decoding modules, zero padding modules, shortening modules, puncturing modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
an input that receives an LDPC (Low Density Parity Check) coded signal; and
an LDPC decoder that employs an LDPC matrix to decode the LDPC coded signal to make an estimate of an information bit encoded therein; and wherein:
the LDPC matrix, composed of a plurality of sub-matrices each having a common size, is partitioned into a left hand side matrix and a right hand side matrix;
each sub-matrix column of the left hand side matrix includes at least a first predetermined number of all zero-valued sub-matrices;
each sub-matrix column of the left hand side matrix includes at most a second predetermined number of CSI (Cyclic Shifted Identity) sub-matrices; and
each sub-matrix within the right hand side matrix is an all zero-valued sub-matrix except those sub-matrices identified below in (a) and (b):
  (a) each sub-matrix located on a diagonal of the right hand side matrix is a CSI (Cyclic Shifted Identity) sub-matrix; and
  (b) in every row between a second row, which is below and adjacent to a top row, and a bottom row of the right hand side matrix, inclusive, each sub-matrix located on a left hand side of and adjacent to a sub-matrix located on the diagonal of the right hand side matrix is also a CSI sub-matrix.

2. The apparatus of claim 1, wherein:
each sub-matrix of the left hand side matrix is either an all zero-valued sub-matrix or a CSI sub-matrix.

3. The apparatus of claim 1, wherein:
one of the plurality of sub-matrices in the left hand side matrix is an identity sub-matrix or a CSI sub-matrix having undergone a cyclic shift of 0.

4. The apparatus of claim 1, wherein:
each of the plurality of sub-matrices is a square sub-matrix.

5. The apparatus of claim 1, wherein:
the right hand side matrix is a square matrix.

6. The apparatus of claim 1, wherein:
each of the plurality of sub-matrices is a 12×12 square sub-matrix having 12 rows and 12 columns; and
the LDPC matrix includes 12 sub-matrix rows and 48 sub-matrix columns.

7. The apparatus of claim 1, wherein:
each sub-matrix located on a plurality of diagonals of the left hand side matrix is an all zero-valued sub-matrix;
a first of the plurality of diagonals of the left hand side matrix is adjacent to a second of the plurality of diagonals of the left hand side matrix; and
the second of the plurality of diagonals of the left hand side matrix is adjacent to a third of the plurality of diagonals of the left hand side matrix.

8. The apparatus of claim 1, wherein each sub-matrix row of the left hand side matrix includes:
a first contiguous plurality of all zero-valued sub-matrices;
a second contiguous plurality of all zero-valued sub-matrices; and
interposed between the first contiguous plurality of all zero-valued sub-matrices and the second contiguous plurality of all zero-valued sub-matrices, at least one additional plurality of sub-matrices that includes at most the second predetermined number of CSI sub-matrices.

9. The apparatus of claim 8, wherein:
the at least one additional plurality of sub-matrices includes at least one all zero-valued sub-matrix and fewer than the second predetermined number of CSI sub-matrices.

10. The apparatus of claim 1, wherein:
the left hand side matrix includes a first diagonal sub-matrix band, composed of a plurality of CSI sub-matrices and at least one all zero-valued sub-matrix, located on a first plurality of contiguous diagonals of the left hand side matrix;
the left hand side matrix includes a second diagonal sub-matrix band, composed of all zero-valued sub-matrices, located on a second plurality of contiguous diagonals of the left hand side matrix; and
the first diagonal sub-matrix band is adjacent to the first diagonal sub-matrix band.

11. The apparatus of claim 1, wherein:
the apparatus is a communication device; and
the communication device is implemented within at least one of a satellite communication system, a wireless communication system, a wired communication system, and a fiber-optic communication system.

12. An apparatus, comprising:
an input that receives an LDPC (Low Density Parity Check) coded signal; and
an LDPC decoder that employs an LDPC matrix to decode the LDPC coded signal to make an estimate of an information bit encoded therein; and wherein:
the LDPC matrix, composed of a plurality of sub-matrices each having a common size, is partitioned into a left hand side matrix and a right hand side matrix;
each sub-matrix column of the left hand side matrix includes at least a first predetermined number of all zero-valued sub-matrices;
each sub-matrix column of the left hand side matrix includes at most a second predetermined number of CSI (Cyclic Shifted Identity) sub-matrices; and
each sub-matrix within the right hand side matrix is an all zero-valued sub-matrix except those sub-matrices identified below in (a) and (b):
    (a) each sub-matrix located on a diagonal of the right hand side matrix is a CSI (Cyclic Shifted Identity) sub-matrix; and
    (b) in every row between a second row, which is below and adjacent to a top row, and a bottom row of the right hand side matrix, inclusive, each sub-matrix located on a left hand side of and adjacent to a sub-matrix located on the diagonal of the right hand side matrix is also a CSI sub-matrix;
each sub-matrix located on a plurality of diagonals of the left hand side matrix is an all zero-valued sub-matrix;
a first of the plurality of diagonals of the left hand side matrix is adjacent to a second of the plurality of diagonals of the left hand side matrix;
the second of the plurality of diagonals of the left hand side matrix is adjacent to a third of the plurality of diagonals of the left hand side matrix;
each of the plurality of sub-matrices is a square sub-matrix; and
the right hand side matrix is a square matrix.

13. The apparatus of claim 12, wherein:
one of the plurality of sub-matrices in the left hand side matrix is an identity sub-matrix or a CSI sub-matrix having undergone a cyclic shift of 0.

14. The apparatus of claim 12, wherein:
each of the plurality of sub-matrices is a 12×12 square sub-matrix having 12 rows and 12 columns; and
the LDPC matrix includes 12 sub-matrix rows and 48 sub-matrix columns.

15. The apparatus of claim 12, wherein:
the left hand side matrix includes a first diagonal sub-matrix band, composed of a plurality of CSI sub-matrices and at least one all zero-valued sub-matrix, located on a first plurality of contiguous diagonals of the left hand side matrix;
the left hand side matrix includes a second diagonal sub-matrix band, composed of all zero-valued sub-matrices, located on a second plurality of contiguous diagonals of the left hand side matrix; and
the first diagonal sub-matrix band is adjacent to the first diagonal sub-matrix band.

16. The apparatus of claim 12, wherein:
the apparatus is a communication device; and
the communication device is implemented within at least one of a satellite communication system, a wireless communication system, a wired communication system, and a fiber-optic communication system.

17. An apparatus, comprising:
an input that receives an LDPC (Low Density Parity Check) coded signal; and
an LDPC decoder that employs an LDPC matrix to decode the LDPC coded signal to make an estimate of an information bit encoded therein; and wherein:
the LDPC matrix, composed of a plurality of sub-matrices each having a common size, is partitioned into a left hand side matrix and a right hand side matrix;
each sub-matrix column of the left hand side matrix includes at least a first predetermined number of all zero-valued sub-matrices;
each sub-matrix column of the left hand side matrix includes at most a second predetermined number of CSI (Cyclic Shifted Identity) sub-matrices; and
each sub-matrix within the right hand side matrix is an all zero-valued sub-matrix except those sub-matrices identified below in (a) and (b):
    (a) each sub-matrix located on a diagonal of the right hand side matrix is a CSI (Cyclic Shifted Identity) sub-matrix; and
    (b) in every row between a second row, which is below and adjacent to a top row, and a bottom row of the right hand side matrix, inclusive, each sub-matrix located on a left hand side of and adjacent to a sub-matrix located on the diagonal of the right hand side matrix is also a CSI sub-matrix;
the left hand side matrix includes a first diagonal sub-matrix band, composed of a plurality of CSI sub-matrices and at least one all zero-valued sub-matrix, located on a first plurality of contiguous diagonals of the left hand side matrix;
the left hand side matrix includes a second diagonal sub-matrix band, composed of all zero-valued sub-matrices, located on a second plurality of contiguous diagonals of the left hand side matrix; and
the first diagonal sub-matrix band is adjacent to the first diagonal sub-matrix band.

18. The apparatus of claim 17, wherein:
each of the plurality of sub-matrices is a 12×12 square sub-matrix having 12 rows and 12 columns; and
the LDPC matrix includes 12 sub-matrix rows and 48 sub-matrix columns.

19. The apparatus of claim 17, wherein each sub-matrix row of the left hand side matrix includes:
- a first contiguous plurality of all zero-valued sub-matrices;
- a second contiguous plurality of all zero-valued sub-matrices; and
- interposed between the first contiguous plurality of all zero-valued sub-matrices and the second contiguous plurality of all zero-valued sub-matrices, at least one additional plurality of sub-matrices that includes at most the second predetermined number of CSI sub-matrices.

20. The apparatus of claim 17, wherein:

the apparatus is a communication device; and the communication device is implemented within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

PATENT NO. : 7,900,127 B2  
APPLICATION NO. : 12/533306  
DATED : March 1, 2011  
INVENTOR(S) : Ba-Zhong Shen et al.

It is certified that error appears in the above-identified patent and that said Letters Patent is hereby corrected as shown below:

Column 37, lines 16-17, in Claim 10: replace "the first diagonal sub-matrix band is adjacent to the first diagonal sub-matrix band" with --the first diagonal sub-matrix band is adjacent to the second diagonal sub-matrix band--

Column 38, lines 16-17, in Claim 15: replace "the first diagonal sub-matrix band is adjacent to the first diagonal sub-matrix band" with --the first diagonal sub-matrix band is adjacent to the second diagonal sub-matrix band--

Column 38, lines 61-62, in Claim 17: replace "the first diagonal sub-matrix band is adjacent to the first diagonal sub-matrix band" with --the first diagonal sub-matrix band is adjacent to the second diagonal sub-matrix band--

Signed and Sealed this
Nineteenth Day of April, 2011

David J. Kappos
*Director of the United States Patent and Trademark Office*